US012396316B2

(12) United States Patent
Togashi et al.

(10) Patent No.: US 12,396,316 B2
(45) Date of Patent: Aug. 19, 2025

(54) SOLID-STATE IMAGING DEVICE AND ELECTRONIC EQUIPMENT

(71) Applicant: Sony Semiconductor Solutions Corporation, Kanagawa (JP)

(72) Inventors: Hideaki Togashi, Kumamoto (JP); Nobuhiro Kawai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 712 days.

(21) Appl. No.: 17/432,678

(22) PCT Filed: Mar. 17, 2020

(86) PCT No.: PCT/JP2020/011652
§ 371 (c)(1),
(2) Date: Aug. 20, 2021

(87) PCT Pub. No.: WO2020/203249
PCT Pub. Date: Oct. 8, 2020

(65) Prior Publication Data
US 2022/0173166 A1    Jun. 2, 2022

(30) Foreign Application Priority Data

Mar. 29, 2019   (JP) ................................. 2019-069180

(51) Int. Cl.
*H10K 39/32*   (2023.01)
(52) U.S. Cl.
CPC ................................. *H10K 39/32* (2023.02)
(58) Field of Classification Search
CPC ............ H10K 39/32; H10K 27/14607; H10K 27/1462; H10K 27/14638;
(Continued)

(56) References Cited

U.S. PATENT DOCUMENTS

2005/0069293 A1    3/2005  Monoi
2013/0341481 A1   12/2013  Hirose
(Continued)

FOREIGN PATENT DOCUMENTS

CN         108604592 A     9/2018
JP       2015-153962 A     5/2015
(Continued)

OTHER PUBLICATIONS

International Search Report issued in International Patent Application No. PCT/JP2020/011652 on Jun. 16, 2020 and English translation of same. 5 pages.
(Continued)

*Primary Examiner* — Meiya Li
(74) *Attorney, Agent, or Firm* — K&L Gates LLP

(57) ABSTRACT

A read-out speed is increased. A solid-state imaging device (100) according to an embodiment is a solid-state imaging device including a plurality of photoelectric conversion elements (PD3) arrayed in a matrix, and each of the photoelectric conversion elements includes: a first electrode and a second electrode (112, 117) that are disposed such that principal planes thereof face each other; a photoelectric conversion film (113) that is disposed between the first electrode and the second electrode; a semiconductor layer (114) that is disposed between the photoelectric conversion film and the second electrode and is configured such that a first surface is in contact with the photoelectric conversion film and at least a portion of a second surface on a side opposite to the first surface is in contact with the second electrode; an insulating film (316) that is disposed within the semiconductor layer; and a third electrode (115) that is disposed within the insulating film.

15 Claims, 67 Drawing Sheets

(58) Field of Classification Search
CPC ....... H10K 27/14612; H10K 27/14627; H10K 27/14647; H10K 27/14665; H10K 27/14643; H10K 27/14603
USPC .......................................................... 257/40
See application file for complete search history.

(56) References Cited

U.S. PATENT DOCUMENTS

| | | |
|---|---|---|
| 2016/0301882 A1 | 10/2016 | Yamashita |
| 2016/0351606 A1 | 12/2016 | Azami |
| 2018/0219046 A1 | 8/2018 | Yamaguchi |

FOREIGN PATENT DOCUMENTS

| | | | |
|---|---|---|---|
| JP | 2016-063165 A | | 4/2016 |
| JP | 2016063156 A | * | 4/2016 |
| JP | 2016201449 A | | 12/2016 |
| JP | 2017-037952 A | | 2/2017 |
| JP | 2017055085 A | | 3/2017 |
| JP | 2017-157816 A | | 9/2017 |
| JP | 2018-152393 A | | 9/2018 |
| JP | 2018-182021 A | | 11/2018 |
| JP | 2019-036641 A | | 3/2019 |
| TW | 201440203 A | | 10/2014 |
| TW | 201618289 A | | 5/2016 |
| WO | WO-2015125611 A1 | | 8/2015 |
| WO | WO-2017026109 A1 | | 2/2017 |
| WO | WO-2018163720 A1 | | 9/2018 |
| WO | WO-2019035254 A1 | | 2/2019 |
| WO | WO-2019044103 A1 | | 3/2019 |

OTHER PUBLICATIONS

Written Opinion issued in International Patent Application No. PCT/JP2020/0011652 on Jun. 16, 2020. 5 pages.

* cited by examiner

SOLID-STATE IMAGING DEVICE AND ELECTRONIC EQUIPMENT

TECHNICAL FIELD

The present disclosure relates to a solid-state imaging device, electronic equipment, and a method of manufacturing the solid-state imaging device.

BACKGROUND ART

In recent years, a laminated image sensor in which a plurality of photoelectric conversion elements are laminated in a substrate thickness direction of a semiconductor substrate has been proposed. For example, PTL 1 proposes a laminated solid-state imaging device in which photoelectric conversion regions for performing photoelectric conversion of light having wavelengths of green, blue, and red are laminated in a vertical direction of the same pixel, and the green photoelectric conversion region is constituted by an organic photoelectric conversion film, as a method for eliminating a false color. In addition, PTL 2 proposes a structure in which charge generated by photoelectric conversion and stored on the upper side of a storage electrode is vertically transferred to a collecting electrode disposed below the storage electrode.

CITATION LIST

Patent Literature

[PTL 1]
JP 2017-157816 A
[PTL 2]
JP 2016-63156 A

SUMMARY

Technical Problem

However, since a laminated solid-state imaging device in the related art has a structure in which stored charge stored in a semiconductor layer on a storage electrode is temporarily moved along an upper surface of the storage electrode in a horizontal direction and then flows into a read-out electrode located below the storage electrode, it takes time to transfer the stored charge from the storage electrode to the read-out electrode. For this reason, there is a problem that it is difficult to increase a read-out speed at which a pixel signal is read out from each pixel.

Consequently, the present disclosure proposes a solid-state imaging device, electronic equipment, and a method of manufacturing the solid-state imaging device which are capable of increasing a read-out speed.

Solution to Problem

In order to solve the above-described problems, a solid-state imaging device according to an aspect of the present disclosure is a solid-state imaging device including a plurality of photoelectric conversion elements that are arrayed in a matrix, and each of the photoelectric conversion elements includes: a first electrode and a second electrode that are disposed such that principal planes thereof face each other; a photoelectric conversion film that is disposed between the first electrode and the second electrode; a semiconductor layer that is disposed between the photoelectric conversion film and the second electrode and is configured such that a first surface is in contact with the photoelectric conversion film and at least a portion of a second surface on a side opposite to the first surface is in contact with the second electrode; an insulating film that is disposed within the semiconductor layer; and a third electrode that is disposed within the insulating film.

DESCRIPTION OF EMBODIMENTS

Figure 1:
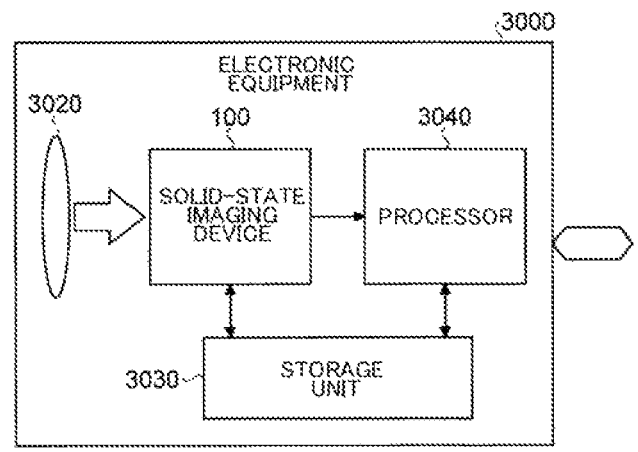
FIG. 1 is a block diagram showing a schematic configuration example of electronic equipment on which a solid-state imaging device according to a first embodiment is mounted.

Hereinafter, an embodiment of the present disclosure will be described in detail on the basis of the drawings. Meanwhile, in the following embodiment, the same portions will be denoted by the same reference numerals and signs, and repeated description thereof will be omitted.

In addition, the present disclosure will be described in accordance with the following order of items.
1. First Embodiment
1.1 Configuration example of electronic equipment
1.2 Configuration example of solid-state imaging device
1.3 Example of laminated structure of solid-state imaging device
1.4 Configuration example of pixel
1.4.1 Regarding B pixel and R pixel
1.4.2 Regarding G pixel
1.5 Example of connection of unit pixel
1.6 Example of cross-sectional structure of unit pixel
1.7 Operations of storage electrode
1.8 Example of planar layout of unit pixel
1.9 Shape of storage electrode
1.10 Photoelectric conversion film
1.11 Operations and effects
2. Second Embodiment
3. Third Embodiment
4. Fourth Embodiment
5. Fifth Embodiment
5.1 First modification example
5.2 Second modification example
5.3 Third modification example
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Thirteenth Embodiment
13.1 Details of manufacturing process for each component
14. Fourteenth Embodiment
15. Fifteenth Embodiment
16. Sixteenth Embodiment
16.1 Modification example
17. Seventeenth Embodiment
18. Eighteenth Embodiment
19. Nineteenth Embodiment
20. Twentieth Embodiment
20.1 Modification example 1
20.2 Modification example 2
21. Application example 1
22. Application example 2

1. First Embodiment

First, a first embodiment will be described in detail with reference to the accompanying drawings. Meanwhile, in the present embodiment, a laminated solid-state imaging device having a structure in which photoelectric conversion regions for performing photoelectric conversion of light having wavelengths of green (G), blue (B) and red (R) are laminated in a vertical direction of the same pixel is described as an example. Further, in the present embodiment, a case where a photoelectric conversion region for performing photoelectric conversion of light having a wavelength of green among green, blue, and red is constituted by an organic film will be described as an example.

1.1 Configuration Example of Electronic Equipment

FIG. 1 is a block diagram showing a schematic configuration example of electronic equipment on which the solid-state imaging device according to the first embodiment is mounted. As shown in FIG. 1, electronic equipment 3000 includes, for example, an imaging lens 3020, a solid-state imaging device 100, a storage unit 3030, and a processor 3040.

The imaging lens 3020 is an example of an optical system that receives incident light and forms an image thereof on a light receiving surface of the solid-state imaging device 100. The light receiving surface may be a surface on which photoelectric conversion elements in the solid-state imaging device 100 are arrayed. The solid-state imaging device 100 performs photoelectric conversion of incident light to generate image data. In addition, the solid-state imaging device 100 executes predetermined signal processing such as noise removal or white balance adjustment on the generated image data.

The storage unit 3030 is constituted by, for example, a flash memory, a dynamic random access memory (DRAM), a static random access memory (SRAM), or the like, and records image data or the like input from the solid-state imaging device 100.

The processor 3040 is constituted using, for example, a central processing unit (CPU) or the like, and may include an application processor executing an operating system, various application software, or the like, a graphics processing unit (GPU), a baseband processor, and the like. The processor 3040 executes various necessary processing on image data input from the solid-state imaging device 100, image data read out from the storage unit 3030, or the like, executes display for a user, and transmits the data to the outside through a predetermined network.

1.2 Configuration Example of Solid-State Imaging Device

Figure 2:
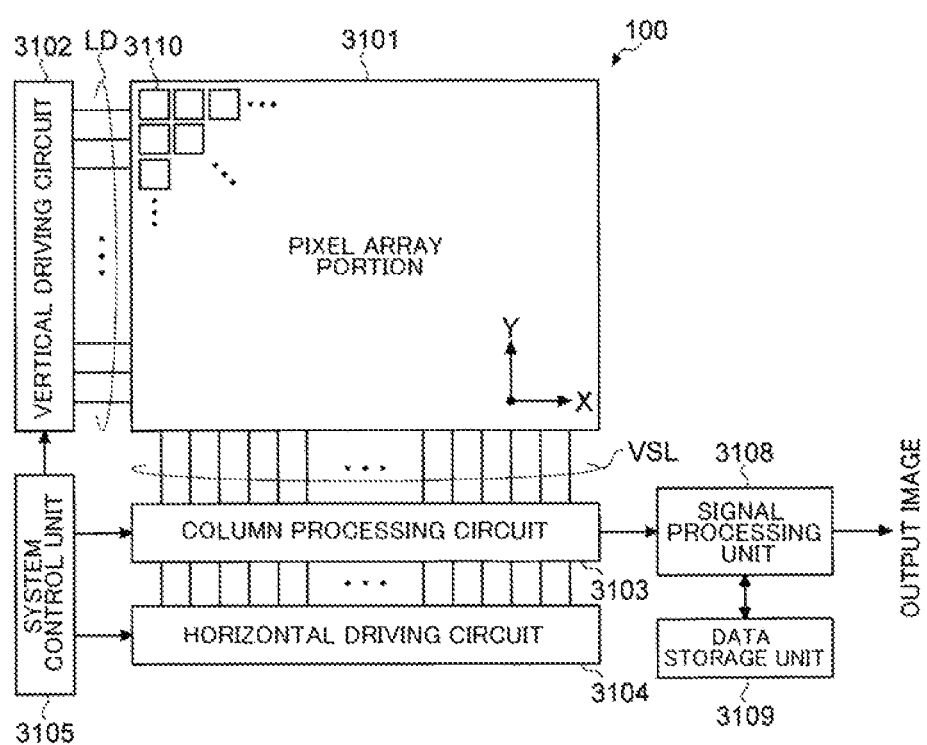
FIG. 2 is a block diagram showing a schematic configuration example of the solid-state imaging device according to the first embodiment.

FIG. 2 is a block diagram showing a schematic configuration example of a complementary metal-oxide-semiconductor (CMOS) type solid-state imaging device (hereinafter referred to simply as an image sensor) according to the first embodiment. Here, the CMOS type image sensor is an image sensor which is created by applying or partially using a CMOS process.

As shown in FIG. 2, an image sensor 100 includes, for example, a pixel array portion 3101, a vertical driving circuit 3102, a column processing circuit 3103, a horizontal driving circuit 3104, a system control unit 3105, a signal processing unit 3108, and a data storage unit 3109. In the following description, the vertical driving circuit 3102, the column processing circuit 3103, the horizontal driving circuit 3104, the system control unit 3105, the signal processing unit 3108, and the data storage unit 3109 are also referred to as a peripheral circuit.

The pixel array portion 3101 has a configuration in which unit pixels 3110 each having a photoelectric conversion element, generating and storing charge based on the amount of light received, are disposed in a row direction and a column direction, that is, in a two-dimensional lattice (hereinafter referred to as a matrix) in a matrix. Here, the row direction is a pixel arrangement direction (a horizontal direction in the drawing) of a pixel row, and the column direction is a pixel arrangement direction (a vertical direction in the drawing) of a pixel column.

The image sensor 100 according to the present embodiment is a laminated image sensor having a structure in which photoelectric conversion regions for performing photoelectric conversion of light having wavelengths of green (G), blue (B) and red (R) are laminated in a vertical direction of the same pixel, and thus one unit pixel 3110 includes a pixel 3110G that receives light having a wavelength of green (G) to generate a pixel signal, a pixel 3110B that receives light having a wavelength of blue (B) to generate a pixel signal, and a pixel 3110R that receives light having a wavelength of red (R) to generate a pixel signal. Details of a specific circuit configuration and pixel structure of the unit pixel 3110 will be described in an embodiment to be described later.

In the pixel array portion 3101, a pixel driving line LD is wired along the row direction for each pixel row, and a vertical signal line VSL is wired along the column direction for each pixel column with respect to a matrix-shaped pixel array. The pixel driving line LD transmits a driving signal for performing driving at the time of reading out a signal from a pixel. In FIG. 2, the pixel driving line LD is shown as one wire, but is not limited to one. One end of the pixel driving line LD is connected to an output end corresponding to each row of the vertical driving circuit 3102.

The vertical driving circuit 3102, which is constituted by a shift register, an address decoder, or the like, drives all pixels of the pixel array portion 3101 at the same time, in units of rows, or the like. That is, the vertical driving circuit 3102 constitutes a driving unit that controls operations of the pixels of the pixel array portion 3101, together with the system control unit 3105 that controls the vertical driving circuit 3102. Although a specific configuration of the vertical driving circuit 3102 is not shown in the drawing, the vertical driving circuit generally includes two scanning systems, that is, a read-out scanning system and a sweep-out scanning system.

The read-out scanning system selectively scans pixels of the unit pixels 3110 of the pixel array portion 3101 in order in units of rows in order to read a signal from each of the pixels of the unit pixel 3110. The signal read from each of the pixels of the unit pixel 3110 is an analog signal. The sweep-out scanning system performs sweep-out scanning on a read-out row on which read-out scanning is performed by the read-out scanning system, ahead of the read-out scanning by an exposure time.

Unnecessary charge is swept out from photoelectric conversion elements of the pixels of the unit pixel 3110 of the read-out row by the sweep-out scanning performed by the sweep-out scanning system, and thus the photoelectric conversion elements are reset. Then, the unnecessary charge is swept out (reset) by the sweep-out scanning system, and thus a so-called electronic shutter operation is performed. Here, the electronic shutter operation is an operation of discarding charge of the photoelectric conversion elements and starting new exposure (starting to store charge).

A signal read out through a read-out operation of the read-out scanning system corresponds to the amount of light received after the previous read-out operation or electronic shutter operation. Further, a period from a read-out timing of the immediately preceding read-out operation or a sweep-out timing of an electronic shutter operation to a read-out timing of the current read-out operation is a charge storage period (also referred to as an exposure period) in each of the pixels of the unit pixel 3110.

A signal output from each of the pixels of the unit pixels 3110 of a pixel row selectively scanned by the vertical driving circuit 3102 is input to the column processing circuit 3103 through each of the vertical signal lines VSL for each pixel column. The column processing circuit 3103 performs predetermined signal processing on a signal output through the vertical signal lines VSL from the pixels of the selected row for each pixel column of the pixel array portion 3101 and temporarily holds the pixel signal having been subjected to the signal processing.

Specifically, the column processing circuit 3103 performs at least noise removal processing, for example, correlated double sampling (CDS) processing or double data sampling (DDS) processing as the signal processing. For example, pixel-specific fixed pattern noise such as reset noise or a variation in a threshold value of an amplification transistor in a pixel is removed by the CDS processing. The column processing circuit 3103 also has, for example, an analog-digital (AD) conversion function for converting an analog pixel signal read out from the photoelectric conversion element into a digital signal and outputting the digital signal.

The horizontal driving circuit 3104 is constituted by a shift register, an address decoder, or the like and selects read circuits (hereinafter also referred to as pixel circuits) corresponding to the pixel column of the column processing circuit 3103 in order. Pixel signals having been subjected to signal processing for each pixel circuit in the column processing circuit 3103 are output in order by selective scanning performed by the horizontal driving circuit 3104.

The system control unit 3105 is constituted by a timing generator that generates various timing signals, or the like, and performs driving control of the vertical driving circuit 3102, the column processing circuit 3103, the horizontal driving circuit 3104, and the like on the basis of various timings generated by the timing generator.

The signal processing unit 3108 has at least a calculation processing function and performs various signal processing such as calculation processing on a pixel signal output from the column processing circuit 3103. The data storage unit 3109 temporarily stores data required for signal processing performed by the signal processing unit 3108 when performing the signal processing.

Meanwhile, image data output from the signal processing unit 3108 may be subjected to predetermined processing in, for example, the processor 3040 or the like in the electronic equipment 3000 on which the image sensor 100 is mounted, or may be transmitted to the outside through a predetermined network.

1.3 Example of Laminated Structure of Solid-State Imaging Device

Figure 3:
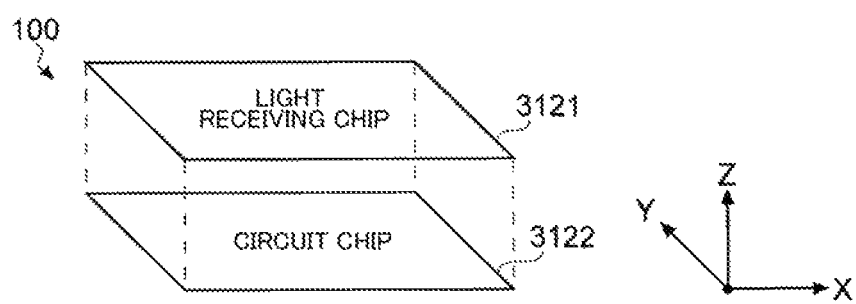
FIG. 3 is a diagram showing an example of a laminated structure of the solid-state imaging device according to the first embodiment.

FIG. 3 is a diagram showing an example of a laminated structure of an image sensor according to the first embodiment. As shown in FIG. 3, the image sensor 100 has a laminated structure in which a light receiving chip 3121 and a circuit chip 3122 are vertically laminated. The light receiving chip 3121 may be, for example, a semiconductor chip including the pixel array portion 3101 in which the plurality of unit pixels 3110 are arrayed in a matrix, and the circuit chip 3122 may be, for example, a semiconductor chip including the peripheral circuit and the like shown in FIG. 2.

For example, so-called direct joining in which their respective junction surfaces are flattened and bonded to each other by an intermolecular force can be used for joining between the light receiving chip 3121 and the circuit chip 3122. However, the present disclosure is not limited thereto, and for example, a so-called Cu—Cu junction for bonding copper (Cu) electrode pads formed on mutual joining surfaces, a bump junction, or the like can also be used.

In addition, the light receiving chip 3121 and the circuit chip 3122 are electrically connected to each other through a connection portion such as a through-silicon via (TSV) penetrating a semiconductor substrate. In connection using a TSV, for example, a so-called twin TSV method for connecting two TSVs, that is, a TSV provided in the light receiving chip 3121 and a TSV provided from the light receiving chip 3121 to the circuit chip 3122 on the outer surfaces of the chips, a so-called shared TSV method for connecting the light receiving chip 3121 and the circuit chip 3122 through a TSV penetrating both of the chips, or the like can be adopted.

However, in a case where a Cu—Cu junction or bump junction is used to join the light receiving chip 3121 and the circuit chip 3122 together, both the light receiving chip 3121 and the circuit chip 3122 are electrically connected to each other through a Cu—Cu joining portion or a bump joining portion.

1.4 Configuration Example of Pixel

Figure 4:
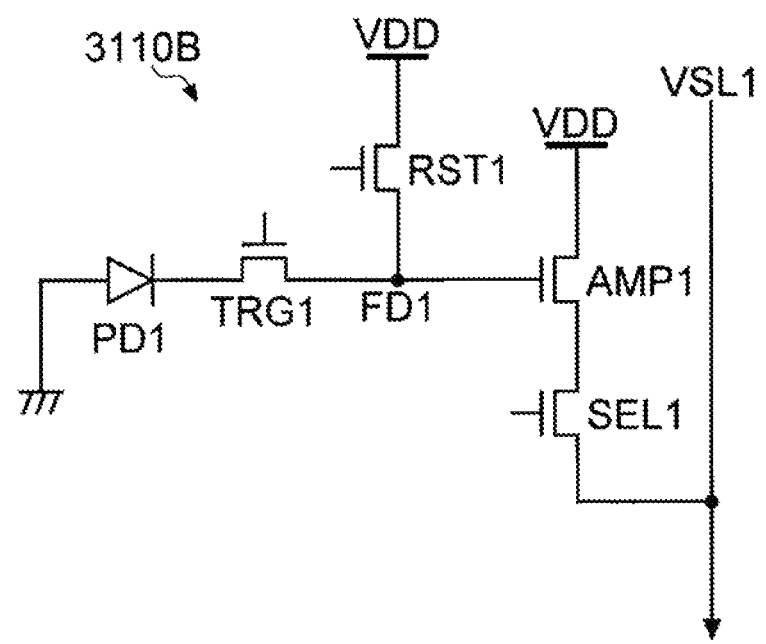
FIG. 4 is a circuit diagram showing a schematic configuration example of a B pixel according to the first embodiment.
Figure 5:
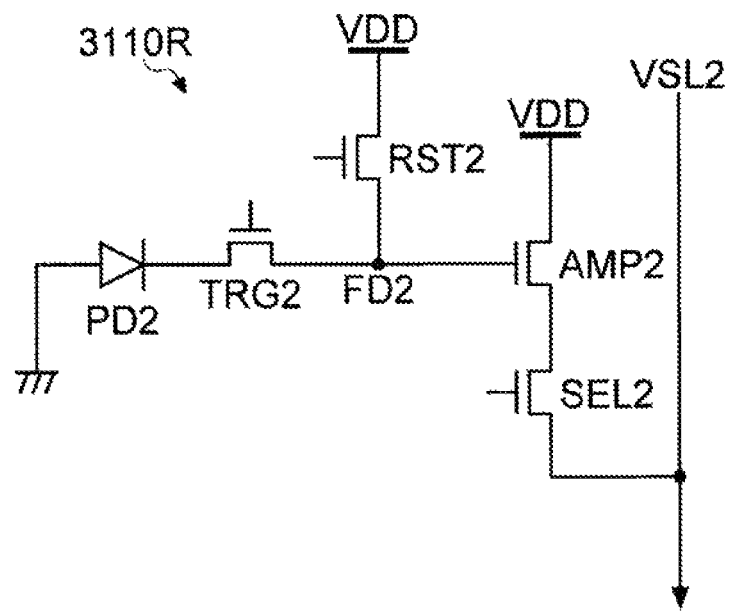
FIG. 5 is a circuit diagram showing a schematic configuration example of an R pixel according to the first embodiment.
Figure 6:
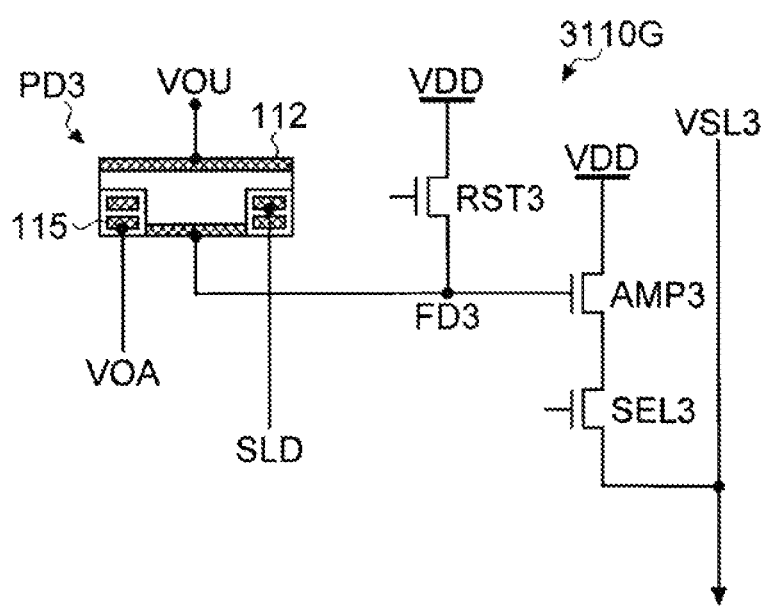
FIG. 6 is a circuit diagram showing a schematic configuration example of a G pixel according to the first embodiment.

FIGS. 4 to 6 are circuit diagrams showing a schematic configuration example of a pixel according to the first embodiment. Meanwhile, FIG. 4 shows a circuit diagram of the pixel 3110B for performing photoelectric conversion of, for example, light having a wavelength of blue (B), FIG. 5 shows a circuit diagram of the pixel 3110R for performing photoelectric conversion of, for example, light having a wavelength of red (R), and FIG. 6 shows a circuit diagram of the pixel 3110G for performing photoelectric conversion of, for example, light having a wavelength of green (G).

First, as shown in FIG. 4, the pixel 3110B includes a photo diode PD1, a transfer transistor TRG1, a reset transistor RST1, an amplification transistor AMP1, a selection transistor SEL1, and a floating diffusion layer FD1.

Similarly, as shown in FIG. 5, the pixel 3110R includes a photo diode PD2, a transfer transistor TRG2, a reset transistor RST2, an amplification transistor AMP2, a selection transistor SEL2, and a floating diffusion layer FD2.

On the other hand, the pixel 3110G in which a photoelectric conversion element is constituted by an organic film includes an organic photoelectric conversion element PD3, a reset transistor RST3, an amplification transistor AMP3, a selection transistor SEL3, and a floating diffusion layer FD3, as shown in FIG. 6.

Hereinafter, for the sake of simplicity, description will be given focusing on the pixel 3110B and the pixel 3110G. Meanwhile, a configuration and operations of the pixel 3110R may be the same as those of the pixel 3110B.

1.4.1 Regarding B Pixel and R Pixel

First, as shown in FIG. 4, in the pixel 3110B, a selection transistor driving line included in the pixel driving line LD is connected to a gate of the selection transistor SEL1, a reset transistor driving line included in the pixel driving line LD is connected to a gate of the reset transistor RST1, and a transfer transistor driving line included in the pixel driving line LD is connected to a gate of the transfer transistor TRG1. In addition, a vertical signal line VSL1 of which one end is connected to the column processing circuit 3103 is connected to a drain of the amplification transistor AMP1 through the selection transistor SEL1.

In the following description, the reset transistor RST1, the amplification transistor AMP1, and the selection transistor SEL1 are also collectively referred to as a pixel circuit. The pixel circuit may include the floating diffusion region FD1 and/or the transfer transistor TRG1.

The photo diode PD1 performs photoelectric conversion of incident light. The transfer transistor TRG1 transfers charge generated in the photo diode PD1. In the floating diffusion layer FD1, charge transferred by the transfer transistor TRG1 is stored. The amplification transistor AMP1 makes a pixel signal having a voltage value corresponding to charge stored in the floating diffusion region FD1 appear in the vertical signal line VSL1. The reset transistor RST1 discharges charge stored in the floating diffusion region FD1. The selection transistor SEL1 selects the pixel 3110B to be read out.

An anode of the photo diode PD1 is grounded, and a cathode thereof is connected to a source of the transfer transistor TRG1. A drain of the transfer transistor TRG1 is connected to a source of the reset transistor RST1 and a gate of the amplification transistor AMP1, and a node which is a connection point therebetween constitutes the floating diffusion region FD1. Meanwhile, a drain of the reset transistor RST1 is connected to a vertical reset input line not shown in the drawing.

A source of the amplification transistor AMP1 is connected to a vertical current supply line not shown in the drawing. A drain of the amplification transistor AMP1 is connected to a source of the selection transistor SEL1, and a drain of the selection transistor SEL1 is connected to the vertical signal line VSL1.

The floating diffusion region FD1 converts stored charge into a voltage having a voltage value corresponding to the amount of charge. Meanwhile, the floating diffusion region FD1 may be, for example, a capacitance to ground. However, the present disclosure is not limited thereto, and the floating diffusion region FD1 may be a capacitance added by intentionally connecting a capacitor or the like to a node to which the drain of the transfer transistor TRG1, the source of the reset transistor RST1, and the gate of the amplification transistor AMP1 are connected.

1.4.2 Regarding G Pixel

On the other hand, as shown in FIG. 6, the pixel 3110G has a configuration in which the photo diode PD1 and the transfer transistor TRG1 are replaced with the organic photoelectric conversion element PD3 in a configuration similar to the pixel 3110B mentioned above.

A common electrode 112 of the organic photoelectric conversion element PD3 is connected to a predetermined potential VOU such as a ground potential. On the other hand, a storage electrode 115 is connected to, for example, a voltage application circuit included in the vertical driving circuit 3102 through the pixel driving line LD.

The configuration thereof may otherwise be the same as that of the pixel 3110B mentioned above.

1.5 Example of Connection of Unit Pixel

Figure 7:
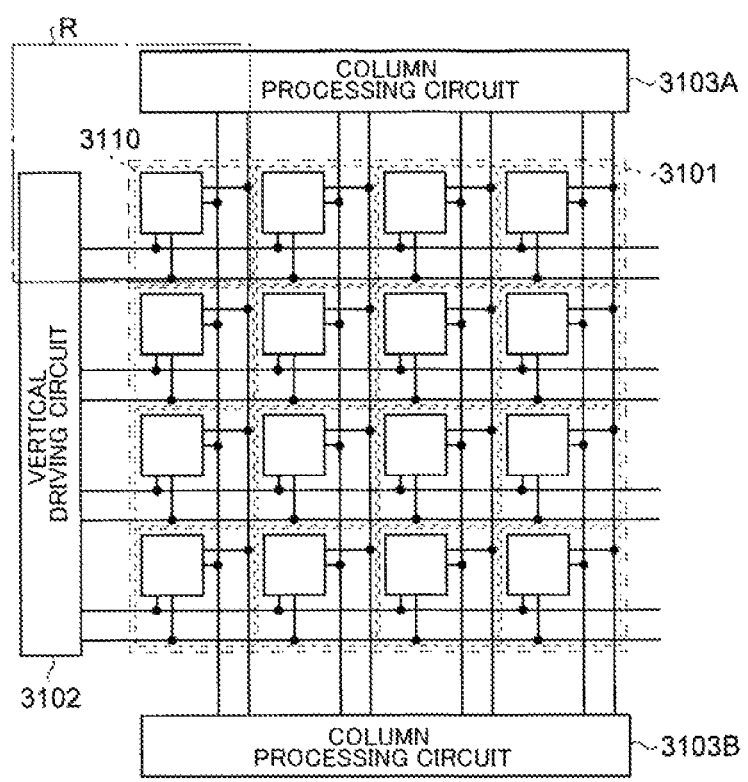
FIG. 7 is a block diagram showing a more detailed configuration example of a pixel array portion shown in FIG. 2.
Figure 8:
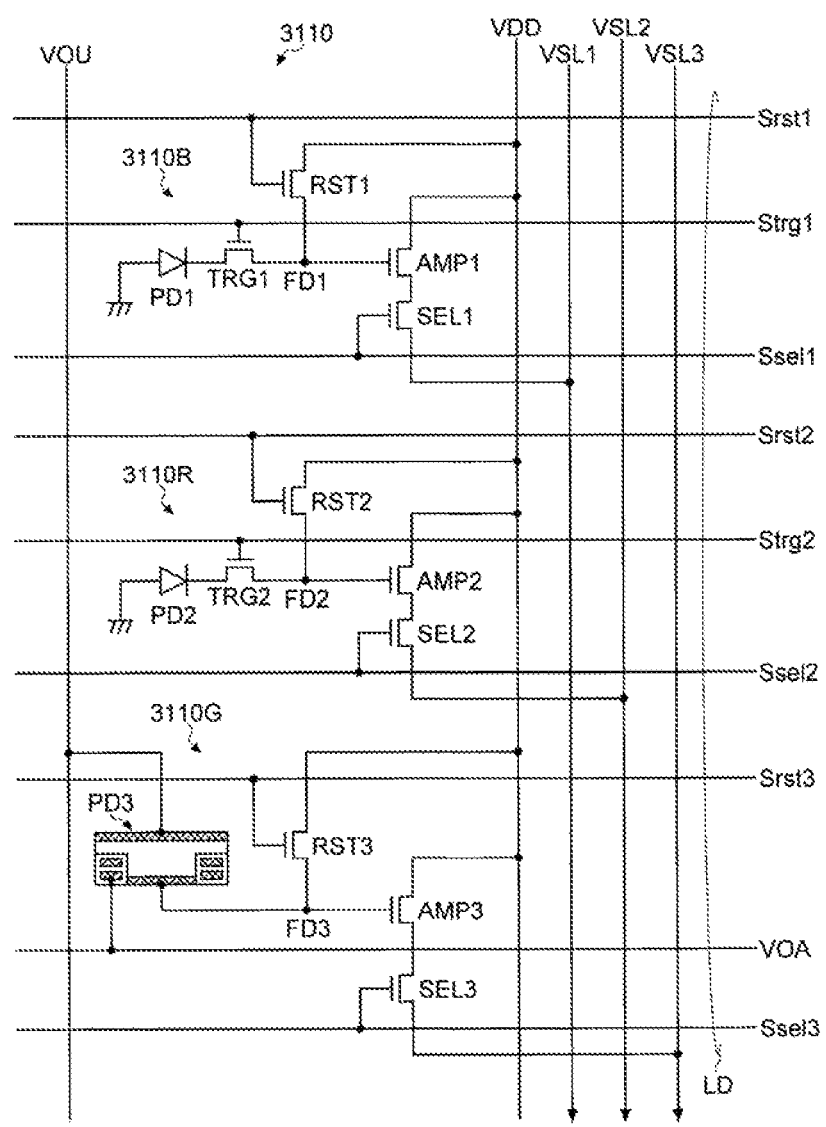
FIG. 8 is an enlarged view of a region R in FIG. 7.

FIG. 7 is a block diagram showing a more detailed configuration example of the pixel array portion shown in FIG. 2. FIG. 8 is an enlarged view of the region R in FIG. 7.

As shown in FIG. 7, the column processing circuit 3103 shown in FIG. 2 may be separated into two column processing circuits 3103A and 3103B. In this case, one column processing circuit 3103A may be disposed, for example, above the pixel array portion 3101 in a column direction (an up-down direction in the drawing), and the other column processing circuit 3103B may be disposed below the pixel array portion in the column direction. Thereby, it is possible to reduce the mounting area of the column processing circuits 3103A and 3103B.

Meanwhile, pixels connected to the column processing circuits 3103A and 3103B may be divided for each of the pixels 3110R, 3110G, and 3110B, may be divided for each column or row in the pixel array portion 3101, or may be divided for each region (for example, an upper half and a lower half in an entanglement direction) of the pixel array portion 3101.

In addition, as shown in FIG. 8, one unit pixel 3110 includes three pixels 3110B, 3110R, and 3110G having the above-described circuit configuration. For example, a pixel driving line LD wired in a row direction (a right-left direction in the drawing) is connected to the pixels 3110B, 3110R, and 3110G. In addition, the vertical signal lines VSL1 to VSL3 are wired in a direction perpendicular to a column direction (an up-down direction in the drawing), that is, an extension direction of the pixel driving line LD. The column processing circuit 3103 is disposed in a direction in which the vertical signal lines VSL1 to VSL3 extend (see FIG. 2 or FIG. 7).

1.6 Example of Cross-Sectional Structure of Unit Pixel

Figure 9:
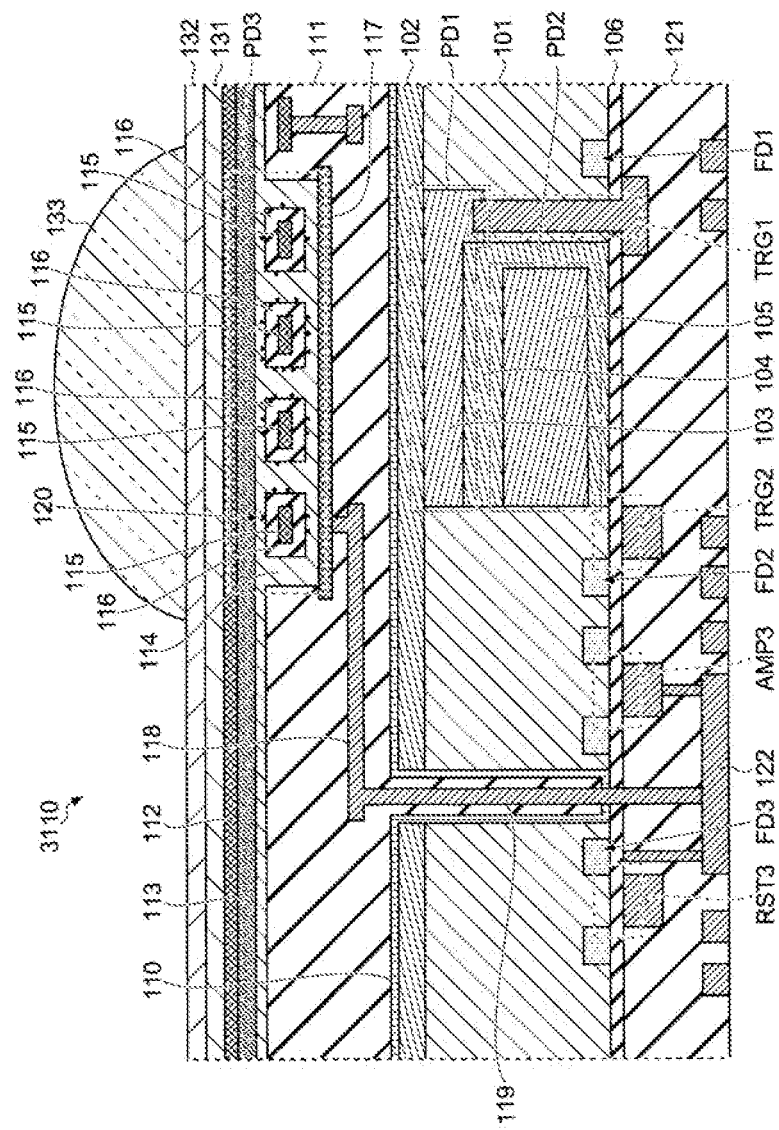
FIG. 9 is a cross-sectional view showing an example of a cross-sectional structure of a unit pixel in the solid-state imaging device according to the first embodiment.

FIG. 9 is a cross-sectional view showing an example of a cross-sectional structure of a unit pixel in the image sensor according to the first embodiment. Meanwhile, FIG. 4 shows an example of a cross-sectional structure along a substrate thickness direction of a semiconductor substrate into which the unit pixel 3110 is fabricated, that is, a semiconductor substrate 101 constituting the light receiving chip 3121.

As shown in FIG. 9, the unit pixel 3110 includes the semiconductor substrate 101, an insulating layer 111 provided on a back face (an upper surface in the drawing) on a side opposite to an element formation surface (referred to as a front face) in the semiconductor substrate 101, and a wiring layer 121 provided on the front face of the semiconductor substrate 101. Meanwhile, the back face of the semiconductor substrate 101 is equivalent to a light incident surface.

In the unit pixel 3110, the pixel 3110G includes the organic photoelectric conversion element PD3 in which a common electrode (first electrode) 112, a photoelectric conversion film 113, a semiconductor layer 114, and a read-out electrode (second electrode) 117 are laminated. The organic photoelectric conversion element PD3 is provided in, for example, the insulating layer 111. In addition, at least a portion of the photoelectric conversion film 113 and at least a portion of the semiconductor layer 114 are disposed between the common electrode 112 and the read-out electrode 117 that are disposed such that principal planes (surfaces parallel to the back face or the front face of the semiconductor substrate 101) thereof face each other. Further, at least a portion of the semiconductor layer 114 is in contact with the read-out electrode 117.

The organic photoelectric conversion element PD3 further includes the storage electrode (third electrode) 115 disposed in parallel with the back face of the semiconductor substrate 101 in the semiconductor layer 114 between the photoelectric conversion film 113 and the read-out electrode 117. The storage electrode 115 is covered with the insulating film 116 so as to be electrically separated from the semiconductor layer 114.

On the other hand, the photo diode PD1 of the pixel 3110B and the photo diode PD2 of the pixel 3110R are provided in the semiconductor substrate 101. Specifically, the semiconductor substrate 101 includes an N-type semiconductor region 103 and an N-type semiconductor region 105 that are disposed in order from the back face side of the semiconductor substrate 101. The N-type semiconductor regions 103 and 105 are disposed below the organic photoelectric conversion element PD3, for example, in the substrate thickness direction of the semiconductor substrate 101.

For example, the N-type semiconductor region 105 is surrounded by a P-type semiconductor region 104 provided in the semiconductor substrate 101. For example, the N-type semiconductor region 103 is sandwiched by a P-type semiconductor region 102 provided on the back face of the semiconductor substrate 101 and an upper portion of the P-type semiconductor region 104 surrounding the N-type semiconductor region 105.

The N-type semiconductor region 103, the P-type semiconductor region 102, and the upper portion of the P-type semiconductor region 104 constitute, for example, the photo diode PD1 of the pixel 3110B. On the other hand, the N-type semiconductor region 105 and the P-type semiconductor region 104 constitute the photo diode PD2 of the pixel 3110R.

The organic photoelectric conversion element PD3 provided in the insulating layer 111 is connected to the floating diffusion region FD3 and the like (see FIG. 6) provided on the front face side of the semiconductor substrate 101 through, for example, a wiring 118 provided in the insulating layer 111, a through electrode 119 penetrating the semiconductor substrate 101, and a wiring 122 in the wiring layer 121 provided on the front face side of the semiconductor substrate 101. Meanwhile, the reset transistor RST3, the amplification transistor AMP3, and the selection transistor SEL3 constituting the read circuit of the pixel 3110G may be formed on the front face side of the semiconductor substrate 101.

On the other hand, the photo diode PD1 provided in the semiconductor substrate 101 is connected to the floating diffusion region FD1 and the like (see FIG. 4) through the transfer transistor TRG1 which is a vertical transistor provided in the semiconductor substrate 101. In addition, the photo diode PD2 is connected to the floating diffusion region FD2 and the like (see FIG. 5) through the transfer transistor TRG2 provided on the front face of the semiconductor substrate 101. Meanwhile, the reset transistor RST1, the amplification transistor AMP1, and the selection transistor SEL1 constituting the read circuit of the pixel 3110B may be formed on the front face side of the semiconductor substrate 101. Similarly, the reset transistor RST2, the amplification transistor AMP2, and the selection transistor SEL2 constituting the read circuit of the pixel 3110R may be formed on the front face side of the semiconductor substrate 101.

The front face of the semiconductor substrate 101 may be covered with, for example, the insulating film 106 of which a portion is used as a gate insulating film of each transistor. In addition, the back face of the semiconductor substrate 101 and the inner surface of a trench for the through electrode 119 formed in the semiconductor substrate may be covered with an antireflection film 110.

The semiconductor layer 114 may cover the upper surface of the insulating layer 111, and the photoelectric conversion film 113 and the common electrode 112 may be solid films that cover the semiconductor layer 114 or the photoelectric conversion film 113.

A protection film 131 and a flattening film 132 may be provided on the common electrode 112. In addition, an on-chip lens 133 for each unit pixel 3110 may be provided on the flattening film 132 and in regions corresponding to the organic photoelectric conversion element PD3 and the photo diodes PD1 and PD2 in a substrate thickness direction.

In this manner, in the first embodiment, the organic photoelectric conversion element PD3 has a structure in which the photoelectric conversion film 113 and the storage electrode 115 covered with the semiconductor layer 114 and the insulating film 116 are provided between the common electrode 112 and the read-out electrode 117.

In such a structure, as shown in FIG. 9, not only an upper portion side of the storage electrode 115 but also a side wall side and a lower portion side thereof function as a storage region in which charge generated in the photoelectric conversion film 113 is stored. For this reason, in stored charge 120 stored in the organic photoelectric conversion element PD3, the proportion of the stored charge 120 stored in the upper portion of the storage electrode 115 having a long distance to the read-out electrode 117 decreases. As a result, in a transfer path of the stored charge 120 from the storage region to the read-out electrode 117, a vertical component forming the shortest distance from the storage region on the side wall side or the lower portion side of the storage electrode 115 to the read-out electrode 117 becomes dominant. Meanwhile, a vertical direction is equivalent to the substrate thickness direction of the semiconductor substrate 101.

1.7 Operations of Storage Electrode

Figure 10:
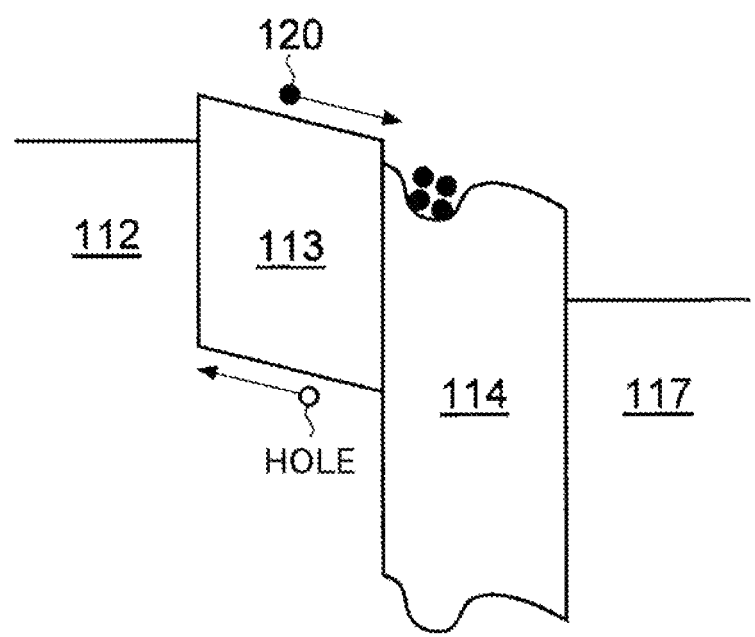
FIG. 10 is a diagram showing a band gap formed between a common electrode and a read-out electrode during charge storage according to the first embodiment.
Figure 11:
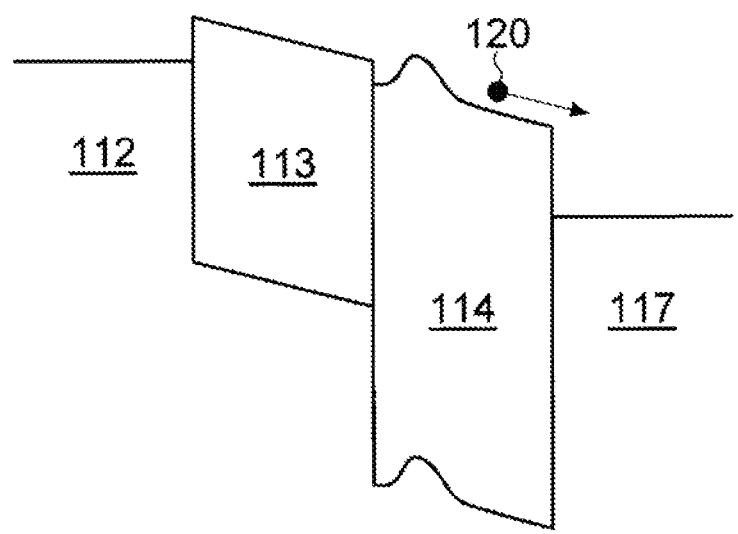
FIG. 11 is a diagram showing a band gap formed between the common electrode and the read-out electrode during charge storage during charge reading-out according to the first embodiment.

FIG. 10 is a diagram showing a band gap formed between a common electrode and a read-out electrode during charge storage according to the first embodiment, and FIG. 11 is a diagram showing a band gap formed between a common electrode and a read-out electrode during charge storage during charge reading-out according to the first embodiment.

In the first embodiment, an electric field is applied in a vertical direction from the common electrode 112 to the read-out electrode 117 during charge storage and during charge reading-out. Consequently, as shown in FIG. 10, a voltage is applied to the storage electrode 115 at the time of storing charge so that a depression is formed at a boundary between a conduction band and an inhibition band in the semiconductor layer 114. Thereby, charge generated in the photoelectric conversion film 113 can be stored in the semiconductor layer 114 around the storage electrode 115. In addition, as shown in FIG. 11, a voltage is applied to the storage electrode 115 during charge reading-out so that the depression formed at the boundary between the conduction band and the inhibition band during charge reading-out is inverted and rises in a convex shape. Thereby, the stored charge 120 trapped around the storage electrode 115 can be discharged and flow to the read-out electrode 117.

In this manner, a voltage to be applied to the storage electrode 115 is changed from a voltage during charge storage (see FIG. 10) to a voltage during charge reading-out (see FIG. 11), so that the stored charge 120 stored in a storage region around the storage electrode 115 can be smoothly transferred to the read-out electrode 117.

For example, in a case where electrons generated due to photoelectric conversion are used as a signal, a voltage to be applied to the common electrode 112, a voltage to be applied to the read-out electrode 117 (that is, a reset voltage of the floating diffusion region FD3), and a voltage to be applied to the storage electrode 115 can be set to −2 V (volts), 3 V, and 1 V, respectively, during a storage period (see FIG. 10).

In addition, a voltage to be applied to the common electrode 112, a voltage to be applied to the read-out electrode 117 (a reset voltage of the floating diffusion region FD3), and a voltage of the storage electrode 115 can be set to −2 V, 3 V, and −1 V, respectively, during a transfer period (see FIG. 11). Meanwhile, in order to prevent backflow of electrons, a voltage to be applied to the common electrode 112 may be dynamically changed to −3 V or the like.

The potentials of the photoelectric conversion film 113 and the semiconductor layer 114 are controlled through such voltage control so as that electrons generated by photoelectric conversion can be moved from the photoelectric conversion film 113 to the semiconductor layer 114 around the storage electrode 115, stored, and then read out to the read-out electrode 117.

Electrons transferred to the read-out electrode 117 change the potential of the floating diffusion region FD3, are converted into a voltage by the amplification transistor AMP3, and read out as a pixel signal by the read circuit (see FIG. 6).

As described above, in the first embodiment, not only the semiconductor layer 114 above the storage electrode 115 but also the semiconductor layer 114 on the side wall side and below the storage electrode 115 can be used as a storage region, and thus it is possible to increase the amount of charge that can be stored.

1.8 Example of Planar Layout of Unit Pixel

Figure 12:
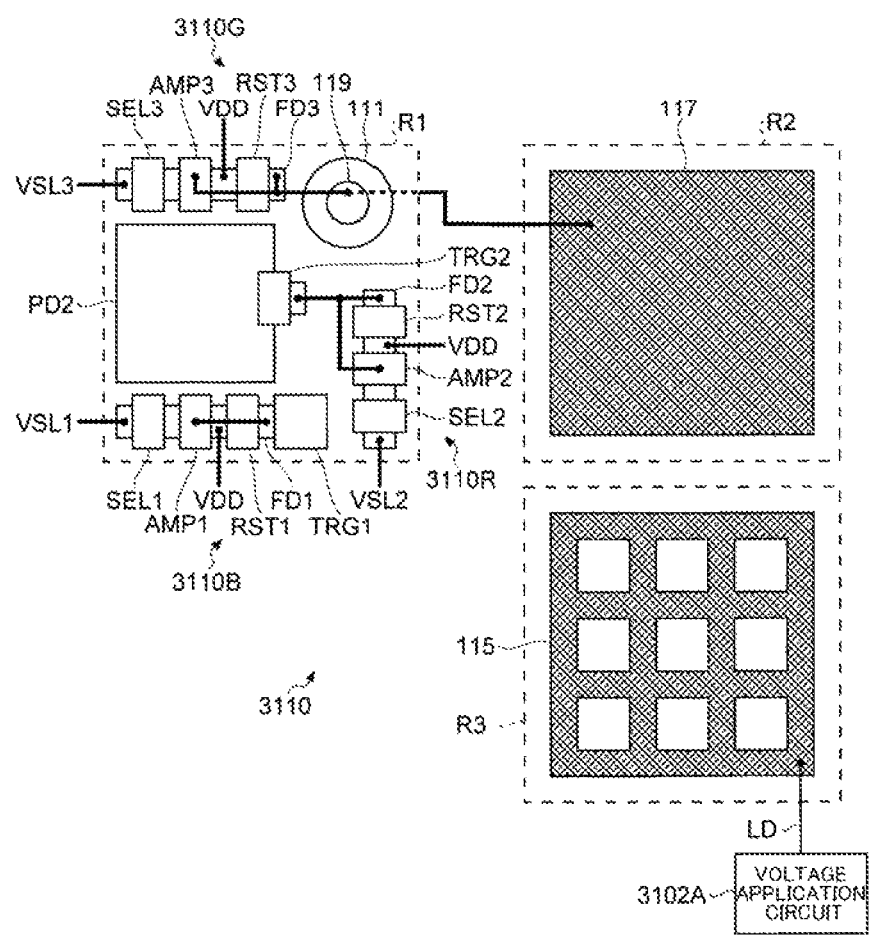
FIG. 12 is a plan view showing an example of a planar layout of a unit pixel according to the first embodiment.

FIG. 12 is a plan view showing an example of a planar layout of a unit pixel according to the first embodiment. Meanwhile, in FIG. 12, a region R1 on the upper left side in the drawing indicates an example of a layout on the front face side of the semiconductor substrate 101, a region R2 on the upper right side indicates an example of a layout of the read-out electrode 117 in a region corresponding to the region R1, and a region R3 on the lower right side indicates an example of a layout of the storage electrode 115.

As shown in FIG. 12, the unit pixel 3110 includes a layout in which a read circuit of the pixel 3110B, a read circuit of the pixel 3110R, and a read circuit of the pixel 3110G are disposed to surround the photo diode PD2 from three sides in the region R1 allocated to each unit pixel 3110 on the front face side of the semiconductor substrate 101. Transistors constituting the respective read circuits are arrayed, for example, linearly.

In addition, the read-out electrode 117 is provided in the region R2 corresponding to the region R1 on the front face of the semiconductor substrate 101 in the substrate thickness direction, and the storage electrode 115 is provided in the region R3 corresponding to the region R2 in the substrate thickness direction. The storage electrode 115 is connected to a voltage application circuit 3102A in the vertical driving circuit 3102 through, for example, the pixel driving line LD.

1.9 Shape of Storage Electrode

FIGS. 13 to 17 are plan views showing an example of a planar layout of a storage electrode according to the first embodiment.

Figure 13:
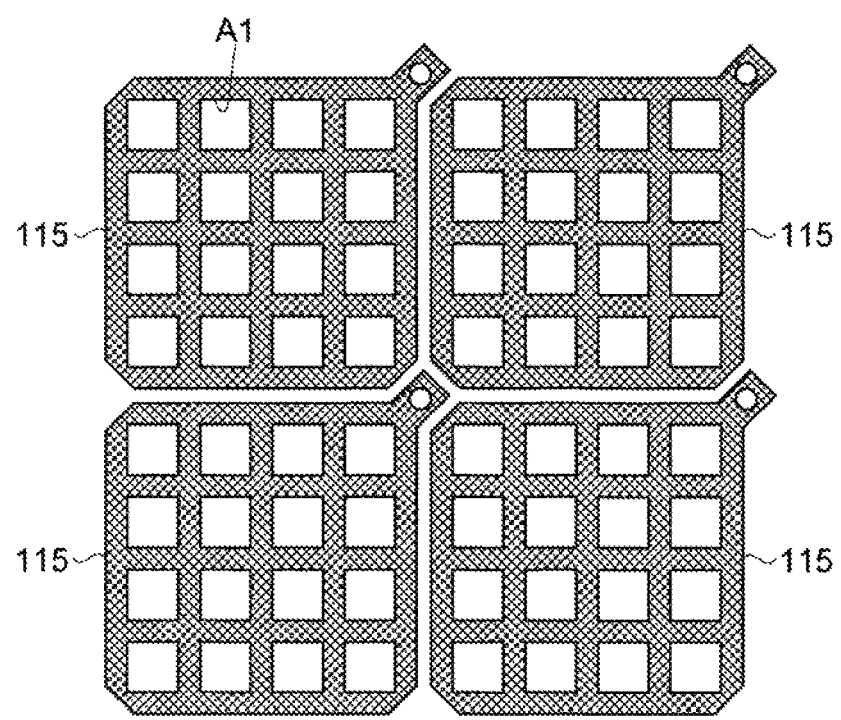
FIG. 13 is a plan view showing an example of a planar layout of a storage electrode according to the first embodiment (first example).
Figure 14:
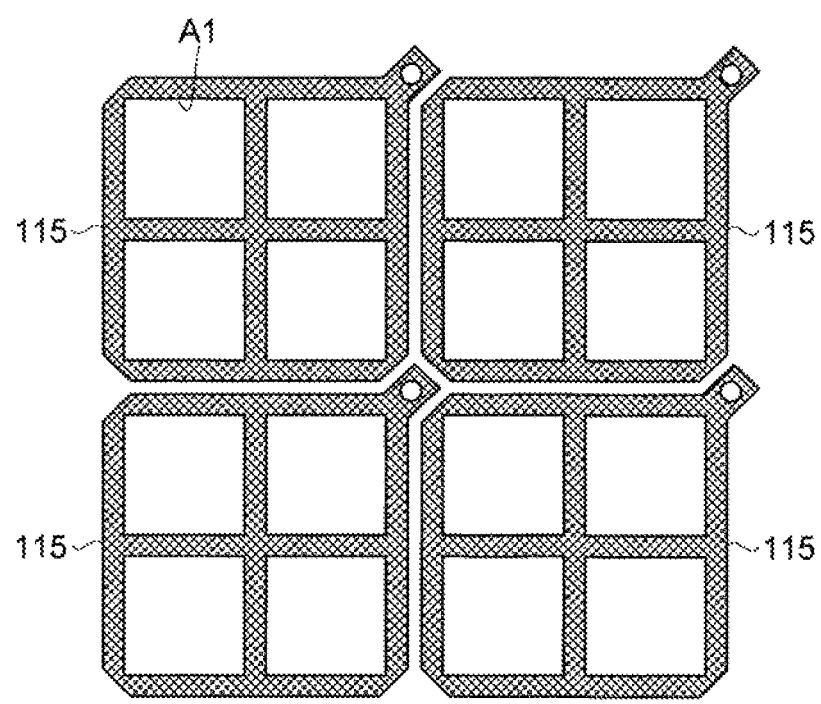
FIG. 14 is a plan view showing an example of a planar layout of the storage electrode according to the first embodiment (second example).

The storage electrode 115 according to the first embodiment may be a lattice-shaped structure including a plurality of openings A1 arrayed in a matrix as shown in FIG. 13. In addition, as shown in FIG. 14, the number of openings A1 and the size thereof may be various modified according to characteristics (for example, transfer, the amount of saturating electrons, a pixel size, and the like) required for the organic photoelectric conversion element PD3.

Figure 15:
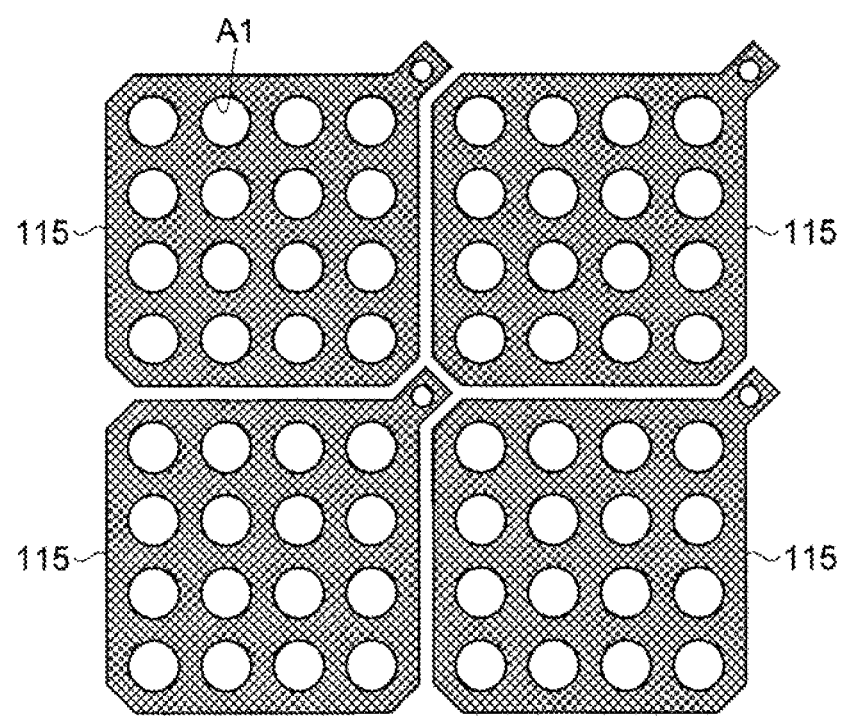
FIG. 15 is a plan view showing an example of a planar layout of the storage electrode according to the first embodiment (third example).
Figure 16:
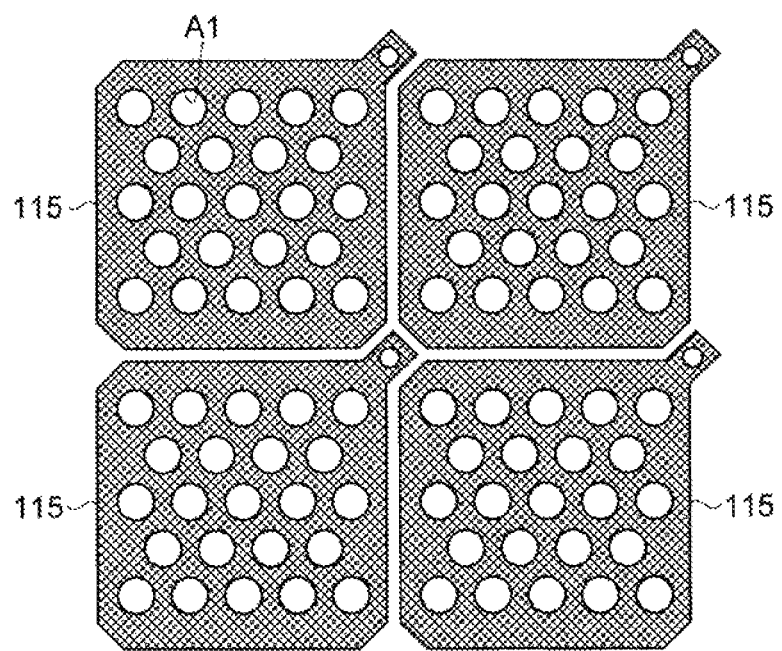
FIG. 16 is a plan view showing an example of a planar layout of the storage electrode according to the first embodiment (fourth example).

Further, as shown in FIGS. 15 and 16, the shape of the opening A1 is not limited to a rectangular shape (see FIGS. 13 and 14), and can also be, for example, a circular shape.

Figure 17:
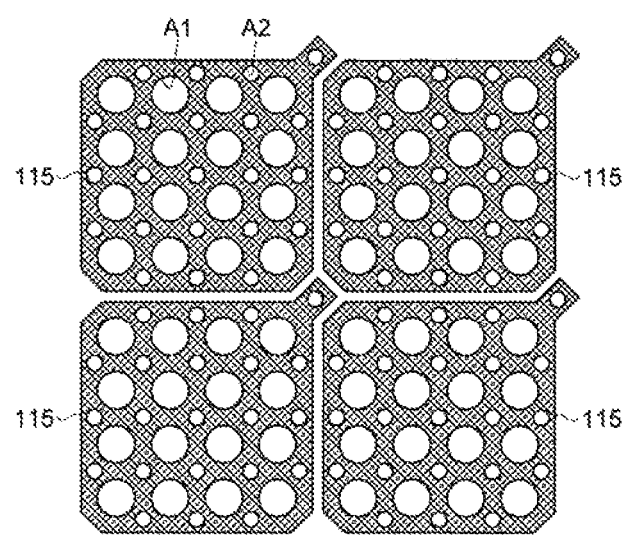
FIG. 17 is a plan view showing an example of a planar layout of the storage electrode according to the first embodiment (fifth example).

Further, as shown in FIG. 17, the openings are not limited to the same type of openings A1 having the same size, shape, and the like, and openings A2 having different sizes, shapes, and the like may be provided in the storage electrode 115.

1.10 Photoelectric Conversion Film

In the first embodiment, in a case where an organic semiconductor is used for the material of the photoelectric conversion film 113, a layer structure of the photoelectric conversion film 113 can have the following structure. However, in the case of a laminated structure, the order of lamination can be changed appropriately.

(1) Single layer structure of p-type organic semiconductor
(2) Single layer structure of n-type organic semiconductor
(3-1) Laminated structure of p-type organic semiconductor layer/n-type organic semiconductor layer
(3-2) Laminated structure of p-type organic semiconductor layer/mixed layer (bulk-hetero structure) of p-type organic semiconductor and n-type organic semiconductor/n-type organic semiconductor layer
(3-3) Laminated structure of p-type organic semiconductor layer/mixed layer (bulk-hetero structure) of p-type organic semiconductor and n-type organic semiconductor
(3-4) Laminated structure of n-type organic semiconductor layer/mixed layer (bulk-hetero structure) of p-type organic semiconductor and n-type organic semiconductor
(4) Mixed layer (bulk-hetero structure) of p-type organic semiconductor and p-type organic semiconductor Here, examples of the p-type organic semiconductor include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, sub-phthalocyanine derivatives, sub-porphyrazine derivatives, metal complexes with heterocyclic compounds as ligands, polythiophene derivatives, polybenzothiadiazole derivatives, polyfluorene derivatives, and the like.

Examples of the n-type organic semiconductor include fullerene and fullerene derivatives <for example, fullerenes such as C60, C70, and C74 (higher-order fullerenes, encapsulated fullerenes, and the like) or fullerene derivatives (for example, fullerene fluoride, PCBM fullerene compounds, fullerene multimers, and the like)>, an organic semiconductor having a larger (deeper) HOMO to LUMO than those of a p-type organic semiconductor, and a transparent inorganic metal oxide.

Specifically, examples of the n-type organic semiconductor include heterocyclic compounds containing nitrogen, oxygen and sulfur atoms, such as organic molecules including pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives, and the like as a portion of their molecular skeletons, organic metal complexes, and subphthalocyanine derivatives.

Examples of a group included in fullerene derivatives include a halogen atom; a straight chain, a branched or cyclic alkyl group or a phenyl group; a group having a straight chain or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxoamide group; a carboalkoxy group; an acyl group; a sulfonyl group; a cyano group; a nitro group; a group having a chalcogenide; a phosphine group; a phosphonate group; and derivatives thereof.

The film thickness of the photoelectric conversion film 113 formed of the above-described organic materials is not limited to the following value, but may be set to, for example, $1 \times 10^{-8}$ m (meters) to $5 \times 10^{-7}$ m, preferably, $2.5 \times 10^{-8}$ m to $3 \times 10^{-7}$ m, more preferably, $2.5 \times 10^{-8}$ m to $2 \times 10^{-7}$ m, and further preferably, $1 \times 10^{-7}$ m to $1.8 \times 10^{-7}$ m. In addition, an organic semiconductor is often classified into a p-type and an n-type. The p-type means that holes are easily transported, the n-type means that electrons are easily transported, and this is not limited to interpretation that holes or electrons are included as a large number of thermally excited carriers like an inorganic semiconductor.

Examples of a material constituting the photoelectric conversion film 113 that performs photoelectric conversion of light having a green wavelength include rhodamine-based pigments, merocyanine-based pigments, quinacridone derivatives, sub-phthalocyanine-based pigments (sub-phthalocyanine derivatives), and the like.

In addition, examples of a material constituting the photoelectric conversion film 113 that performs photoelectric conversion of blue light include coumarin acid pigments, tris-8-hydroxyquinolialuminum (Alq3), merocyanine-based pigments, and the like.

Further, examples of a material constituting the photoelectric conversion film 113 that performs photoelectric conversion of red light include phthalocyanine-based pigments and sub-phthalocyanine-based pigments (sub-phthalocyanine derivatives).

Further, as the photoelectric conversion film 113, a panchromatic photosensitive organic photoelectric conversion film that is sensitive to substantially all visible light from an ultraviolet region to a red region can also be used.

On the other hand, examples of an inorganic material constituting the photoelectric conversion film 113 include crystalline silicon, amorphous silicon, microcrystalline silicon, crystalline selenium, amorphous selenium, and compound semiconductors such as CIGS(CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$ which are chalcopyrite-based compounds, or GaAs, InP, AlGaAs, InGaP, AlGaInP, and InGaAsP which are Group III-V compounds, CdSe, CdS, In$_2$Se$_3$, In$_2$S$_3$, Bi$_2$Se$_3$, Bi$_2$S$_3$, ZnSe, ZnS, PbSe, and PbS. Additionally, quantum dots formed of these materials can also be used for the photoelectric conversion film 113.

In addition, the photoelectric conversion film 113 can also be configured to have a laminated structure of the semiconductor layer 114 which is a lower layer and the photoelectric conversion film 113 which is an upper layer. In this manner, the semiconductor layer 114 is provided below the photoelectric conversion film 113, and thus it is possible to prevent recoupling during charge storage and increase the efficiency of transfer of charge stored in the photoelectric conversion film 113 to the read-out electrode 117. In addition, it is also possible to suppress the generation of dark current. Meanwhile, a material constituting the photoelectric conversion film 113 in this case may be appropriately selected from the above-described various material constituting the photoelectric conversion film 113.

Here, it is preferable that a material having a large value of a band gap (for example, the value of a band gap which is equal to or greater than 3.0 eV (electron volt)) and having a higher mobility than that of the material constituting the photoelectric conversion film 113 be used as a material constituting the semiconductor layer 114. Specifically, examples of the material constituting the semiconductor layer 114 include oxide semiconductor materials such as IGZO, and organic semiconductor materials such as transition metal dichalcogenides, silicon carbide, diamonds, graphene, carbon nanotubes, condensed polycyclic hydrocarbon compounds, and condensed heterocyclic compounds.

Alternatively, in a case where the stored charge 120 is electrons, a material having an ionization potential larger than that of the material constituting the photoelectric conversion film 113 can be used as the material constituting the semiconductor layer 114. On the other hand, in a case where the stored charge 120 is holes, a material having electron affinity smaller than that of the material constituting the photoelectric conversion film 113 can be used as the material constituting the semiconductor layer 114.

Meanwhile, the concentration of impurities in the material constituting the semiconductor layer 114 is preferably $1 \times 10^{18}$ cm$^{-3}$ or less. In addition, the photoelectric conversion film 113 and the semiconductor layer 114 can also be formed of the same material as long as photoelectric conversion performance and mobility performance can be satisfied.

Here, it is preferable that a transparent material be used as the material of each of the common electrode 112, the read-out electrode 117, the semiconductor layer 114, and the storage electrode 115. Specifically, a material containing Al—Nd (an alloy of aluminum and neodymium) or ASC (an alloy of aluminum, samarium, and copper) can be used.

In addition, a band gap energy of a transparent conductive material is preferably 2.5 eV or more, and more preferably 3.1 eV or more.

On the other hand, in a case where the common electrode 112, the read-out electrode 117, and the storage electrode 115 are configured as transparent electrodes, examples of transparent conductive materials constituting the electrodes include a conductive metal oxide.

Specifically, examples of the transparent conductive materials include indium oxide, indium-tin oxide (including indium tin oxide (ITO), Sn-doped In$_2$O$_3$, crystalline ITO, and amorphous ITO), indium-zinc oxide (IZO) in which indium is added to zinc oxide as a dopant, indium-gallium oxide (IGO) in which indium is added to gallium oxide as a dopant, indium-gallium-zinc oxide (IGZO (In—GaZnO$_4$)) in which indium and gallium are added to zinc oxide as dopants, indium-tin-zinc oxide (ITZO) in which indium and tin are added to zinc oxide as dopants, IFO (F-doped In$_2$O$_3$), tin oxide (SnO$_2$), ATO (Sb-doped SnO$_2$), FTO (F-doped SnO$_2$), zinc oxide (containing ZnO doped with other elements), aluminum-zinc oxide (AZO) in which aluminum is added to zinc oxide as a dopant, gallium-zinc oxide (GZO) in which gallium is added to zinc oxide as a dopant, titanium oxide (TiO$_2$), niobium-titanium oxide (TNO) in which niobium is added to titanium oxide as a dopant, antimony oxide, spinel-type oxide, and oxide having a YbFe$_2$O$_4$ structure.

Alternatively, examples of the transparent electrodes include a transparent electrode having gallium oxide, titanium oxide, niobium oxide, nickel oxide, or the like as a base layer.

Further, examples of the thickness of the transparent electrode include $2 \times 10^{-8}$ m to $2 \times 10^{-7}$ m, and preferably, $3 \times 10^{-8}$ m to $1 \times 10^{-7}$ m.

1.11 Operations and Effects

As described above, according to the present embodiment, the storage electrode 115 covered with the insulating film 116 is provided in the semiconductor layer 114 on the read-out electrode 117. That is, in the present embodiment, the semiconductor layer 114 is also provided between the storage electrode 115 and the read-out electrode 117.

Thereby, not only the semiconductor layer 114 above the storage electrode 115 but also the semiconductor layer 114 on the side wall side and below the storage electrode 115 can be used as a storage region, and thus the proportion of the stored charge 120 that presents above the storage electrode 115 and needs to be transferred in a horizontal direction (a direction along the back face and the front face) in the stored charge 120 stored in the semiconductor layer 114 decreases. As a result, it is possible to increase the rate of vertical components occupying a transfer path of a large amount of stored charge 120.

As a result, a transfer time of the stored charge 120 from the storage electrode 115 to the read-out electrode 117 is reduced, and thus it is possible to increase the speed of a pixel signal read out from the unit pixel 3110.

In addition, a potential difference is given between the common electrode 112 and the read-out electrode 117 in the substrate thickness direction, and thus it is also possible to smoothly transfer the stored charge 120 to the read-out electrode 117 by changing a voltage to be applied to the storage electrode 115 from a voltage during charge storage to a voltage during charge reading-out.

Further, it is possible to increase the amount of storable charge by using not only a side above the storage electrode 115 but also the semiconductor layer 114 on a side on the side wall and below the storage electrode 115 as a storage region. That is, since a storage capacitance Q=CV and C=εS/d, the storage capacitance can be increased by increasing the area of the storage electrode 115 in a case where a film thickness d of the insulating film 116 around the storage electrode 115 and a dielectric constant ε of the insulating film 116 are the same, and the same voltage V is applied.

2. Second Embodiment

Next, a second embodiment will be described in detail with reference to the drawings. Meanwhile, in the present embodiment, the same configurations and operations as those in the above-described embodiment will be quoted, and repeated description thereof will be omitted.

Figure 18:
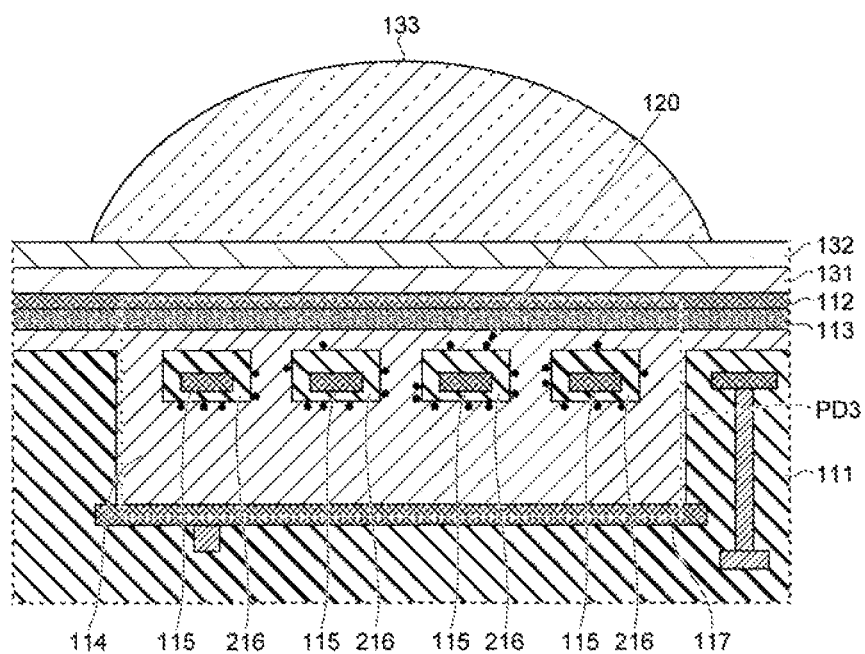
FIG. 18 is a cross-sectional view showing a schematic configuration example of an organic photoelectric conversion element and portions in the vicinity thereof according to a second embodiment.

FIG. 18 is a cross-sectional view showing a schematic configuration example of an organic photoelectric conversion element and portions in the vicinity thereof according to the second embodiment. Specifically, FIG. 18 shows a region including an on-chip lens 133, a flattening film 132, a protection film 131, a common electrode 112, a photoelectric conversion film 113, a semiconductor layer 114, a storage electrode 115, an insulating film 116, a read-out electrode 117, various wirings, and the like which are installed on a light irradiation surface side of a semiconductor substrate 101.

As shown in FIG. 18, in an organic photoelectric conversion element PD3 according to the present embodiment, the insulating film 116 around the storage electrode 115 is replaced with an insulating film 216 in the same configuration as that of the organic photoelectric conversion element PD3 according to the first embodiment.

The insulating film 216 has a structure in which, for example, the film thickness of a storage electrode 115 on a read-out electrode 117 side is smaller than the film thicknesses on the side wall side and the photoelectric conversion film 113 side of the storage electrode 115.

With such a structure, for example, even when the same voltage as in the voltage setting exemplified in the first embodiment is applied, it is possible to further lower a potential (for example, a recessed portion in FIG. 10) of a semiconductor layer 114 in a region of the storage electrode 115 on the read-out electrode 117 side. Thereby, it is possible to store a larger amount of stored charge 120 during a storage period.

In addition, the stored charge 120 of the semiconductor layer 114 on the photoelectric conversion film 113 side of the storage electrode 115 is easily moved to the read-out electrode 117 side of the storage electrode 115 during a storage period. Thereby, it is possible to further lower the concentration of the stored charge 120 of the semiconductor layer 114 on the photoelectric conversion film 113 side of the storage electrode 115, for example, as compared to that in the first embodiment. Thereby, the proportion of the stored charge 120 of the semiconductor layer 114 on the photoelectric conversion film 113 side of the storage electrode 115 having a relatively long distance to the read-out electrode 117 is decreased, and thus it is possible to more improve transfer characteristics.

Meanwhile, the film thickness of the insulating film 216 can be appropriately set in accordance with optimization of transfer characteristics and setting values of voltages to be applied to electrodes (112, 115, and 117).

Figure 19:
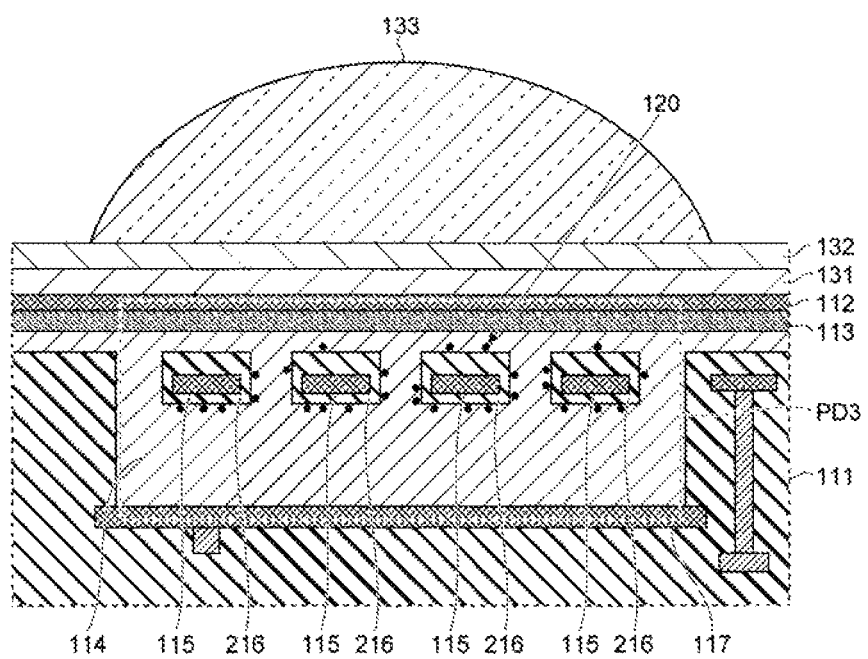
FIG. 19 is a cross-sectional view showing a schematic configuration example of an organic photoelectric conversion element and portions in the vicinity thereof according to a modification example of the second embodiment.

For example, as shown in FIG. 19, in addition to the film thickness of the insulating film 216 on the read-out electrode 117 side of the storage electrode 115, the film thickness of the insulating film 216 on the side wall side of the storage electrode 115 may be set to be smaller than the film thickness of the insulating film 216 on the photoelectric conversion film 113 side.

Thereby, the proportion of the stored charge 120 of the semiconductor layer 114 on the photoelectric conversion film 113 side of the storage electrode 115 having a relatively long distance to the read-out electrode 117 further decreases, and thus it is possible to further improve transfer characteristics.

Figure 20:
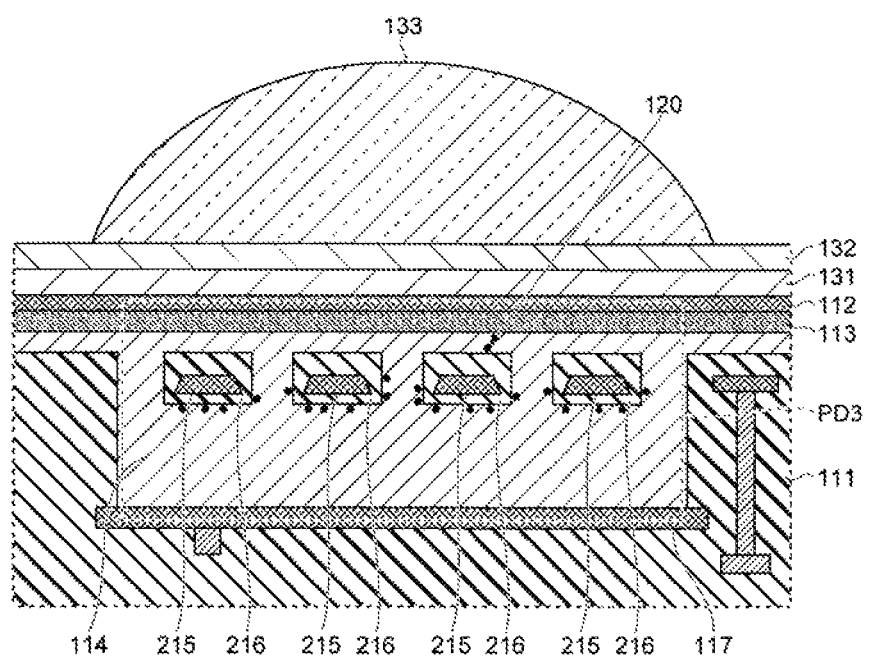
FIG. 20 is a cross-sectional view showing a schematic configuration example of an organic photoelectric conversion element and portions in the vicinity thereof according to another modification example of the second embodiment.

In addition, as shown in FIG. 20, the film thickness of the insulating film 216 on the side wall side of the storage electrode 115 may be gradually reduced from the upper side to the lower side of the side wall. Such a structure can be formed, for example, by replacing the storage electrode 115 with a storage electrode 215 having a trapezoidal cross-sectional shape. However, the present disclosure is not limited thereto, and an external shape in the cross-sectional shape of the insulating film 216 can be deformed in various ways, such as an inverted trapezoidal shape.

In this manner, it is possible to further facilitate the movement of charge on the photoelectric conversion film 113 side of the storage electrode 115 to the read-out electrode 117 side of the storage electrode 115 by gradually reducing the film thickness of the insulating film 216 on the side wall side of the storage electrode 115 from the upper side to the lower side of the side wall.

The other configurations, operations, and effects may be the same as those in the above-described embodiment, and thus detailed description thereof will be omitted here.

3. Third Embodiment

Next, a third embodiment will be described in detail with reference to the drawings. Meanwhile, in the present embodiment, the same configurations and operations as those in the above-described embodiment will be quoted, and repeated description thereof will be omitted.

Figure 21:
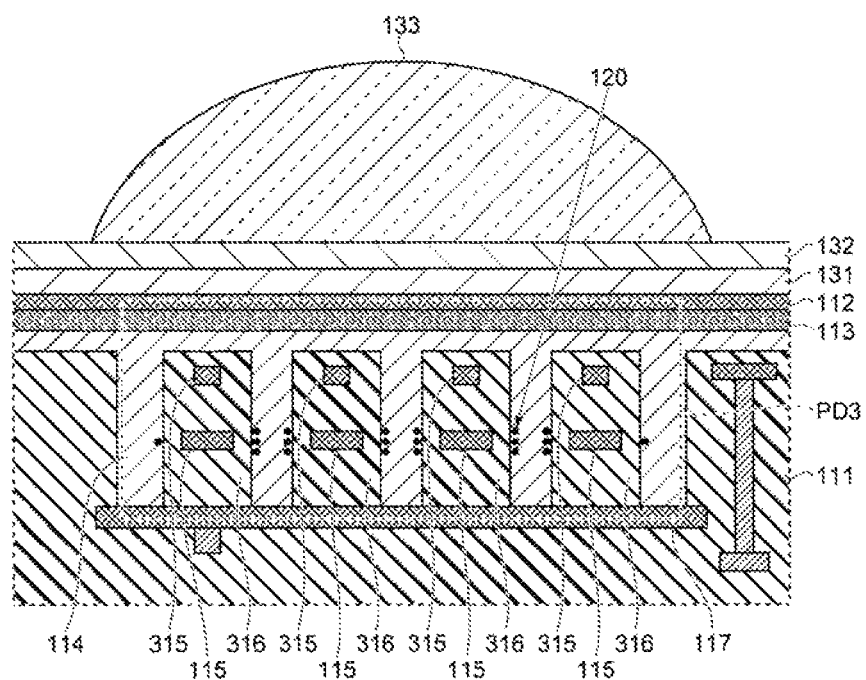
FIG. 21 is a cross-sectional view showing a schematic configuration example of an organic photoelectric conversion element and portions in the vicinity thereof according to a third embodiment.

FIG. 21 is a cross-sectional view showing a schematic configuration example of an organic photoelectric conversion element and portions in the vicinity thereof according to the third embodiment. As shown in FIG. 21, an organic photoelectric conversion element PD3 according to the third embodiment is configured such that the insulating film 116 is replaced with an insulating film 316, and a shield electrode (fourth electrode) 315 is further included, for example, in the same configuration as that of the organic photoelectric conversion element PD3 described using FIG. 9 and the like in the first embodiment.

For example, the insulating film 316 is configured such that the bottom face thereof is in contact with a read-out electrode 117. For example, a storage electrode 115 is disposed in the vicinity of the center between a top face and a bottom face in the insulating film 316. The shield electrode 315 is disposed in the vicinity of the top face of the insulating film 316 so as to be closer to the photoelectric conversion film 113 side than the storage electrode 115 in the insulating film 316.

The shield electrode 315 is an electrode for individually controlling, for example, the potential of the semiconductor layer 114 on the side wall side of the storage electrode 115 and the potential of the semiconductor layer 114 on the photoelectric conversion film 113 side of the storage electrode 115.

Figure 22:
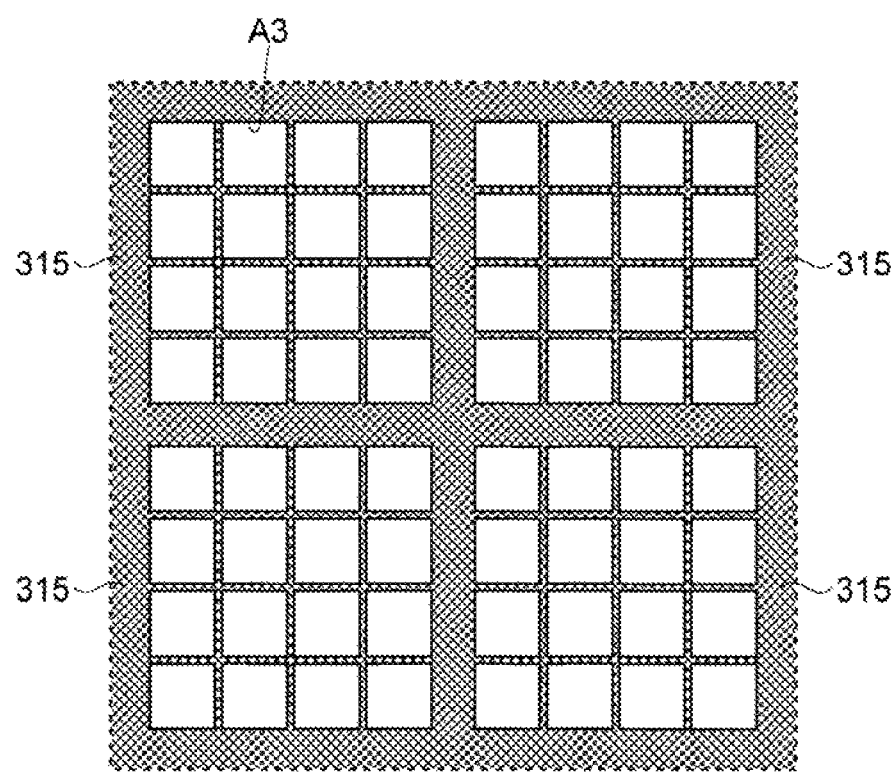
FIG. 22 is a plan view showing an example of a planar layout of a shield electrode according to the third embodiment.
Figure 23:
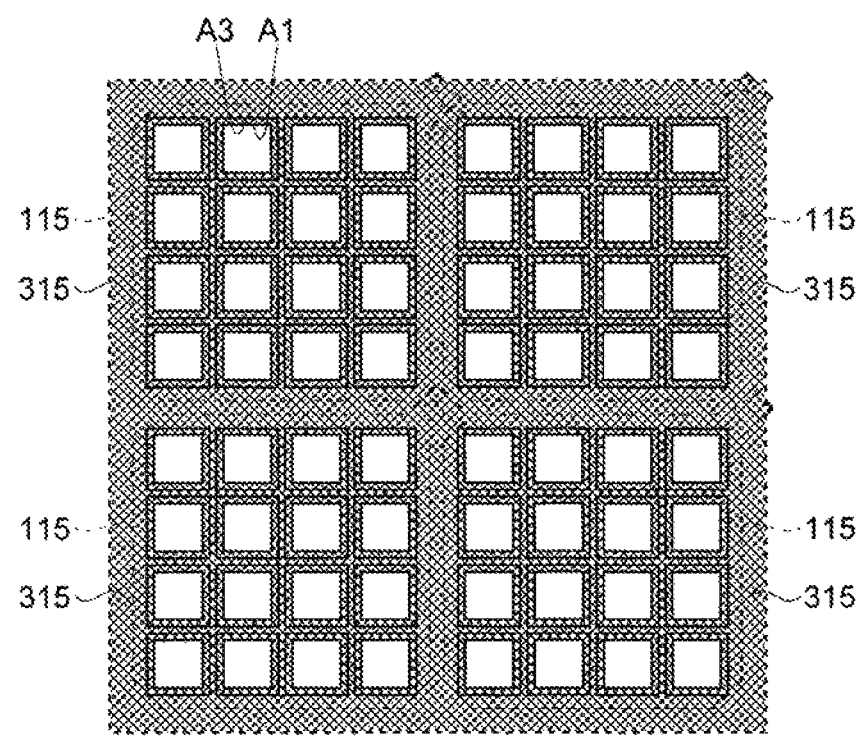
FIG. 23 is a plan view in a case where a shield electrode and a storage electrode according to the second embodiment are seen from a light incidence direction.

FIG. 22 is a plan view showing an example of a planar layout of a shield electrode according to the third embodiment. FIG. 23 is a plan view in a case where a shield electrode and a storage electrode according to the third embodiment are seen from a light incidence direction.

As shown in FIG. 22, the shield electrode 315 may be a lattice-shaped structure including a plurality of openings A3 arrayed in a matrix. In addition, as shown in FIG. 23, the number, sizes, shapes, and positions of the openings A3 of the shield electrode 315 may be set such that the openings A3 are superimposed on openings A1 of the storage electrode 115 in a case where the shield electrode 315 and the storage electrode 115 overlap each other. Therefore, as described in the first embodiment using FIGS. 13 to 17, in a case where the number, sizes, shapes, and positions of the openings A1 and/or A2 of the storage electrode 115 are changed, the openings A3 of the shield electrode 315 may also be changed accordingly.

In such a structure, in a case where electrons generated by photoelectric conversion are used as a signal, the voltage of a common electrode 112, the voltage of a read-out electrode 117 (a reset voltage of a floating diffusion region FD), the voltage of the storage electrode 115, and a voltage of the shield electrode 315 can be respectively set to, for example, −2 V, 3 V, 1 V, and 0 V during a storage period.

In addition, the voltage of the common electrode 112, the voltage of the read-out electrode 117 (a reset voltage of the floating diffusion region FD), and the voltage of the storage electrode 115 can be respectively set to −2 V, 3 V, and −1 V during a transfer period.

At this time, it is also possible to dynamically set the electrode of a shield to −1.5 V or the like to assist the transfer of the stored charge 120 stored in the semiconductor layer 114 on the side wall of the storage electrode 115 to the read-out electrode 117.

According to such a structure and voltage control, the concentration of the stored charge 120 of the semiconductor layer 114 on the photoelectric conversion film 113 side of the storage electrode 115 can be reduced as compared with, for example, the first embodiment. Thereby, the proportion of the stored charge 120 of the semiconductor layer 114 on the photoelectric conversion film 113 side of the storage electrode 115 having a relatively long distance to the read-out electrode 117 decreases, and thus it is possible to more improve transfer characteristics.

Meanwhile, in the present embodiment, the concentration of the stored charge 120 of the semiconductor layer 114 on the photoelectric conversion film 113 side of the storage electrode 115 is reduced, and thus it is possible to omit the semiconductor layer 114 between the storage electrode 115 and the read-out electrode 117. In this case, by setting voltages of the storage electrode 115 and the shield electrode 315 and increasing the height of the storage electrode 115, it is also possible to increase the amount of stored charge 120 stored in the semiconductor layer 114 on the side wall side of the storage electrode 115.

Figure 24:
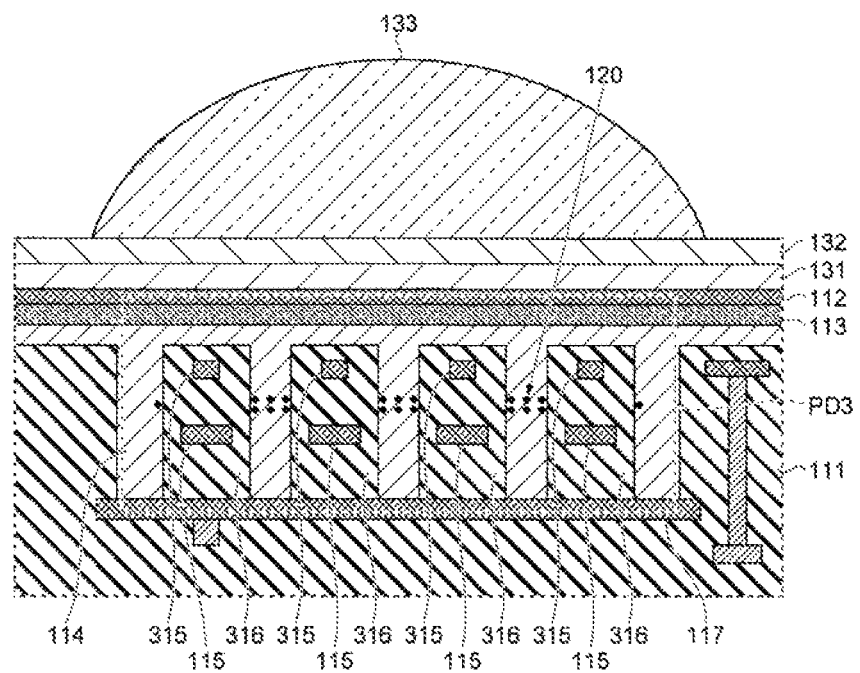
FIG. 24 is a cross-sectional view showing a schematic configuration example of an organic photoelectric conversion element and portions in the vicinity thereof according to a modification example of the third embodiment.

Further, in the present embodiment, a voltage to be applied to each of the electrodes (112, 115, 117, and 315) may be changed in accordance with the amount of light irradiation. For example, in a case where it is necessary to store an extremely large amount of charge, or the like, the voltage of the common electrode 112, the voltage of the read-out electrode 117 (a reset voltage of the floating diffusion region FD), the voltage of the storage electrode 115, and the voltage of the shield electrode 315 are respectively set to, for example, −2 V, 3 V, 0 V, and −0.5 V or the like during a storage period as shown in FIG. 24 to increase the potential of the semiconductor layer 114 on the side wall side of the storage electrode 115, and thus the stored charge 120 may be prevented from leaking to the read-out electrode 117 side beyond a potential barrier. In this manner, according to the present embodiment, it is also possible to perform an operation for storing a large amount of stored charge 120.

Meanwhile, in a case where the potential of the semiconductor layer 114 on the side wall side of the storage electrode 115 is increased to prevent the stored charge 120 from leaking to the read-out electrode 117, or the like, the insulating film 316 on the side wall side of the storage electrode 115 may be made thinner than the film thicknesses of the other surfaces. Thereby, modulation performance of the potential of the semiconductor layer 114 on the side wall side of the storage electrode 115 can be improved, and thus it is possible to further improve an effect of preventing the stored charge 120 from leaking to the read-out electrode 117.

The other configurations, operations, and effects may be the same as those in the above-described embodiment, and thus detailed description thereof will be omitted here.

4. Fourth Embodiment

Next, a fourth embodiment will be described in detail with reference to the accompanying drawings. Meanwhile, in the present embodiment, the same configurations and operations as those in the above-described embodiment will be quoted, and repeated description thereof will be omitted.

Figure 25:
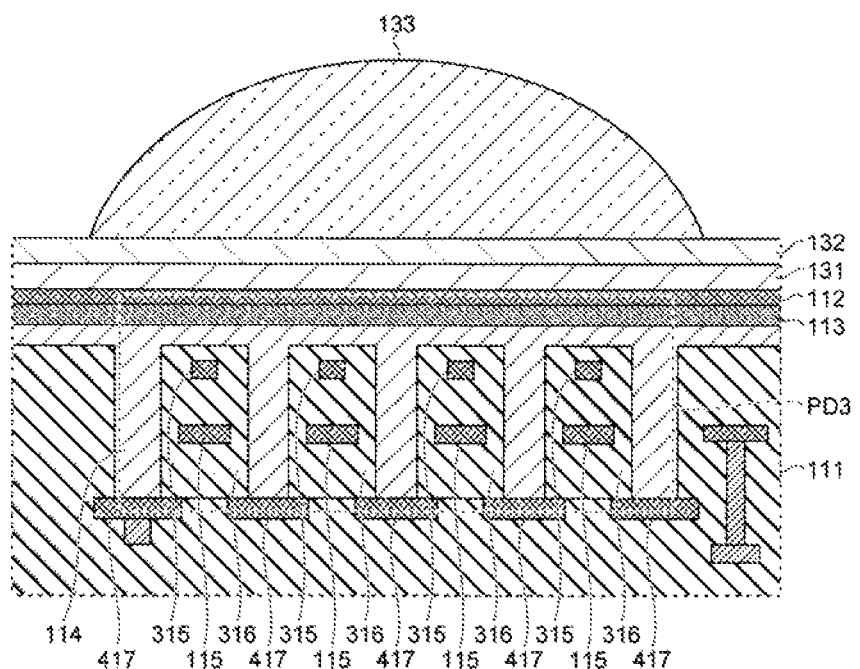
FIG. 25 is a cross-sectional view showing a schematic configuration example of an organic photoelectric conversion element and portions in the vicinity thereof according to a fourth embodiment.
Figure 26:
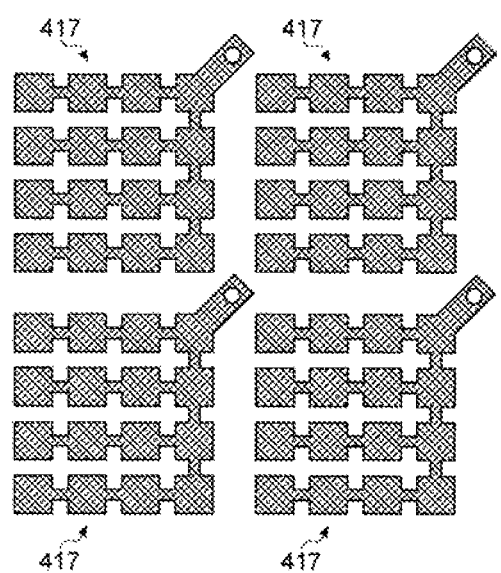
FIG. 26 is a plan view showing an example of a planar layout of a read-out electrode according to the fourth embodiment.

FIG. 25 is a cross-sectional view showing a schematic configuration example of an organic photoelectric conversion element and portions in the vicinity thereof according to the fourth embodiment. FIG. 26 is a plan view showing an example of a planar layout of a read-out electrode according to the fourth embodiment.

As shown in FIG. 25, an organic photoelectric conversion element PD3 according to the fourth embodiment has a configuration in which the read-out electrode 117 is replaced with a read-out electrode 417, for example, in the same configuration as that of the organic photoelectric conversion element PD3 described using FIG. 21 and the like in the third embodiment.

As shown in FIG. 26, the read-out electrode 417 has a planar shape of which the area is reduced while leaving a region required for charge collecting. In the example shown in FIG. 26, the read-out electrode 417 has a planar shape in which a region corresponding to an opening A3 of a shield electrode 315 and an opening A1 (and A2) of a storage electrode 115 in a substrate thickness direction is left, and the other regions except for a region required for connection of regions are removed.

With such a shape, capacitance of the read-out electrode 417 is decreased. Since the read-out electrode 417 is connected to a floating diffusion region FD, it is possible to increase conversion efficiency and widen a dynamic range of the unit pixel 3110 by reducing the capacity of the read-out electrode 417.

Meanwhile, the shape of the read-out electrode 417 is not limited to a lattice shape as shown in FIG. 26, and may be modified in various shapes such as a planar shape hollowed out into a circular shape.

The shape of the read-out electrode 417 may be appropriately changed in accordance with a distance from the read-out electrode 417 to the storage electrode 115, the diameter and pitch of the opening A1 of the storage electrode 115, the size of the unit pixel 3110, and the like.

The other configurations, operations, and effects may be the same as those in the above-described embodiment, and thus detailed description thereof will be omitted here.

5. Fifth Embodiment

Next, a fifth embodiment will be described in detail with reference to the accompanying drawings. Meanwhile, in the present embodiment, the same configurations and operations as those in the above-described embodiment will be quoted, and repeated description thereof will be omitted.

Figure 27:
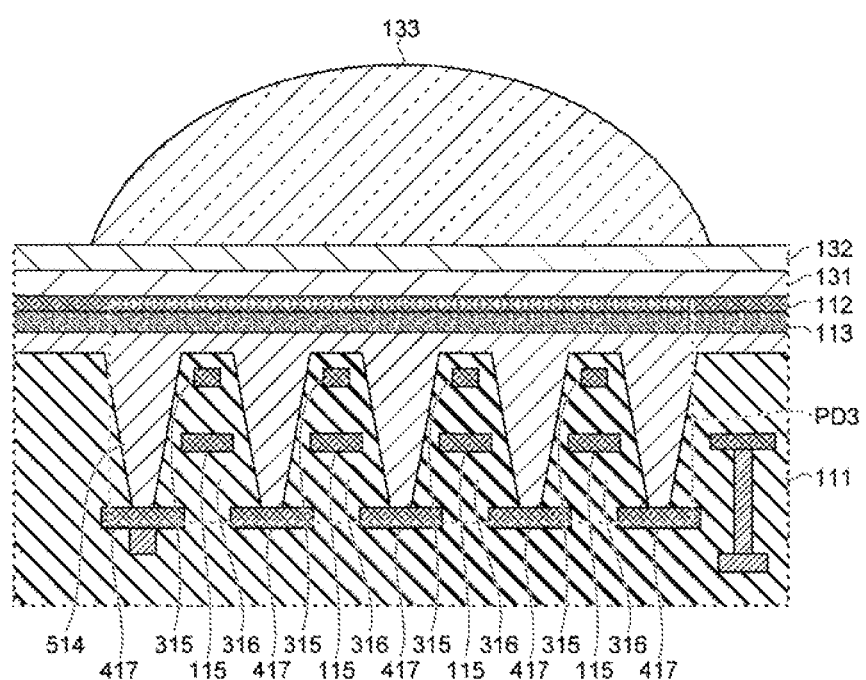
FIG. 27 is a cross-sectional view showing a schematic configuration example of an organic photoelectric conversion element and portions in the vicinity thereof according to a fifth embodiment.

FIG. 27 is a cross-sectional view showing a schematic configuration example of an organic photoelectric conversion element and portions in the vicinity thereof according to the fifth embodiment. As shown in FIG. 27, an organic photoelectric conversion element PD3 according to the fifth embodiment has a configuration in which the semiconductor layer 114 is replaced with a semiconductor layer 514, for example, in the same configuration as that of the organic photoelectric conversion element PD3 described using FIG. 25 and the like in the fourth embodiment.

The semiconductor layer 514 has, for example, a tapered shape so that the width thereof decreases from a photoelectric conversion film 113 to a read-out electrode 417. Specifically, in widths of a boundary between an insulating film 316 on the side wall side of a storage electrode 115 and the semiconductor layer 114 and a boundary between the insulating film 316 on the side wall side of an adjacent storage electrode 115 and the semiconductor layer 114, the width of a lower end on the read-out electrode 417 side is smaller than the width of a side above the photoelectric conversion film 113 side.

With such a structure, it is possible to reduce an area required for a read-out electrode while maintaining the ease of transfer of charge generated by photoelectric conversion to a region between the storage electrodes 115. Thereby, as mentioned in the fourth embodiment, the capacity of the read-out electrode 417 is reduced, and thus it is possible to increase conversion efficiency to widen a dynamic range of a unit pixel 3110.

The other configurations, operations, and effects may be the same as those in the above-described embodiment, and thus detailed description thereof will be omitted here.

5.1 First Modification Example

Figure 28:
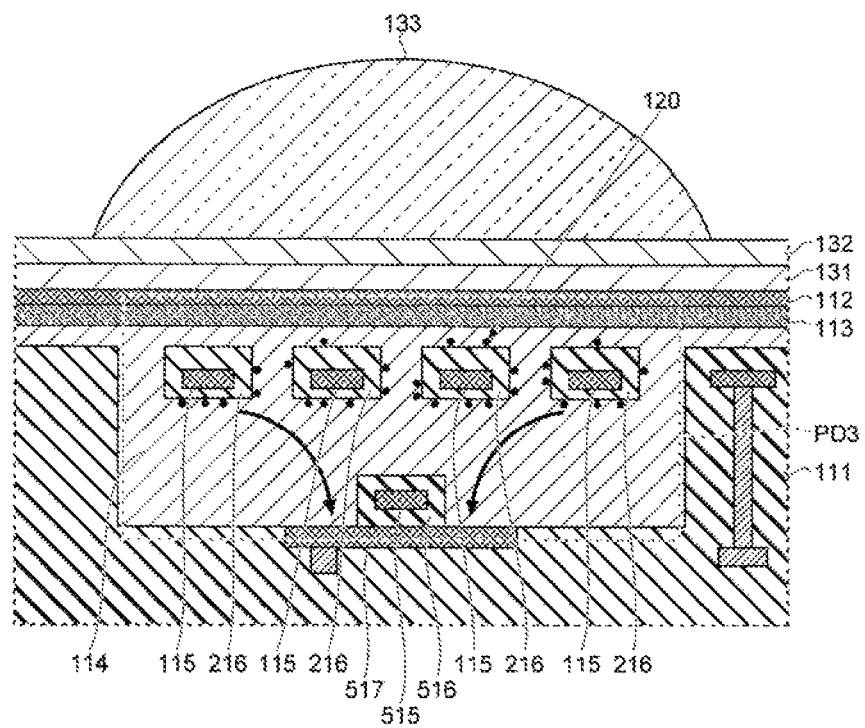
FIG. 28 is a cross-sectional view showing a schematic configuration example of an organic photoelectric conversion element and portions in the vicinity thereof according to a first modification example of the fifth embodiment.

A configuration in which an area required for a read-out electrode is reduced is not limited to the above-described structure described using FIG. 27. For example, as shown in FIG. 28, it is possible to adopt a configuration in which a collecting electrode 515 surrounded by an insulating film 516 is disposed above a read-out electrode 517 so as to be closer to the read-out electrode 517 than the storage electrode 115 (for example, directly above the read-out electrode 517).

In such a configuration, the stored charge 120 stored in the vicinity of the stored charge 120 can be effectively guided to a specific region of the read-out electrode 517 by applying a predetermined voltage to the collecting electrode 515 to modulate potential in the semiconductor layer 114 during charge reading-out, and thus it is possible to reduce an area required for the read-out electrode 117.

5.2 Second Modification Example

Figure 29:
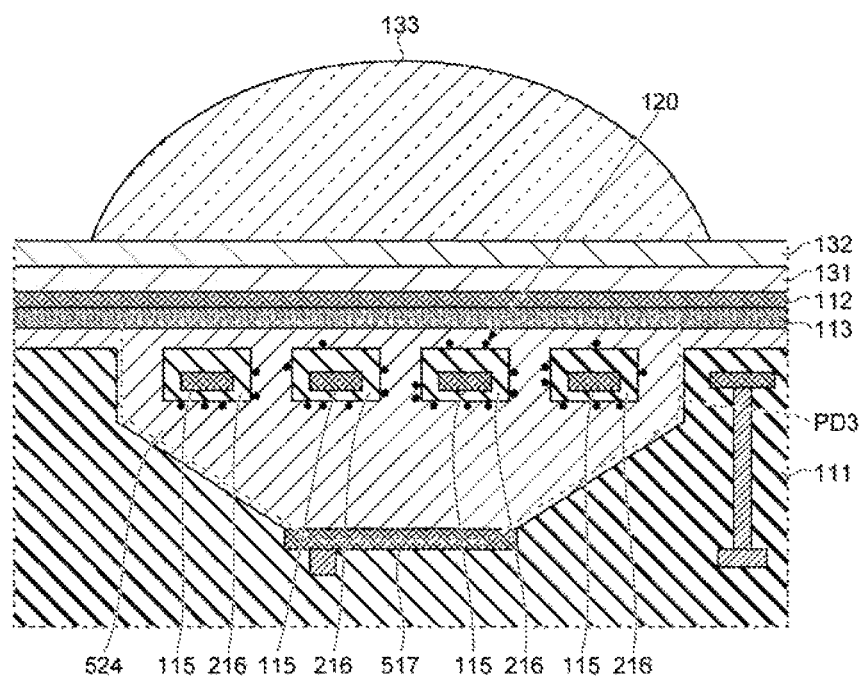
FIG. 29 is a cross-sectional view showing a schematic configuration example of an organic photoelectric conversion element and portions in the vicinity thereof according to a second modification example of the fifth embodiment.

In addition, as shown in FIG. 29, the semiconductor layer 514 ranging from the storage electrode 115 to the read-out electrode 117 may be replaced with a semiconductor layer 524 having a tapered shape that tapers toward the read-out electrode 517.

In such a configuration, the stored charge 120 stored in the vicinity of the stored charge 120 flows along a boundary between the semiconductor layer 524 and the insulating layer 111 during charge reading-out, and thus it is possible to reduce an area required for the read-out electrode 517. In addition, the collecting electrode 515 and the insulating film 516 in the vicinity of the collecting electrode can be omitted, and thus it is possible to achieve facilitation of design, simplification of a manufacturing process, and the like.

5.3 Third Modification Example

Figure 30:
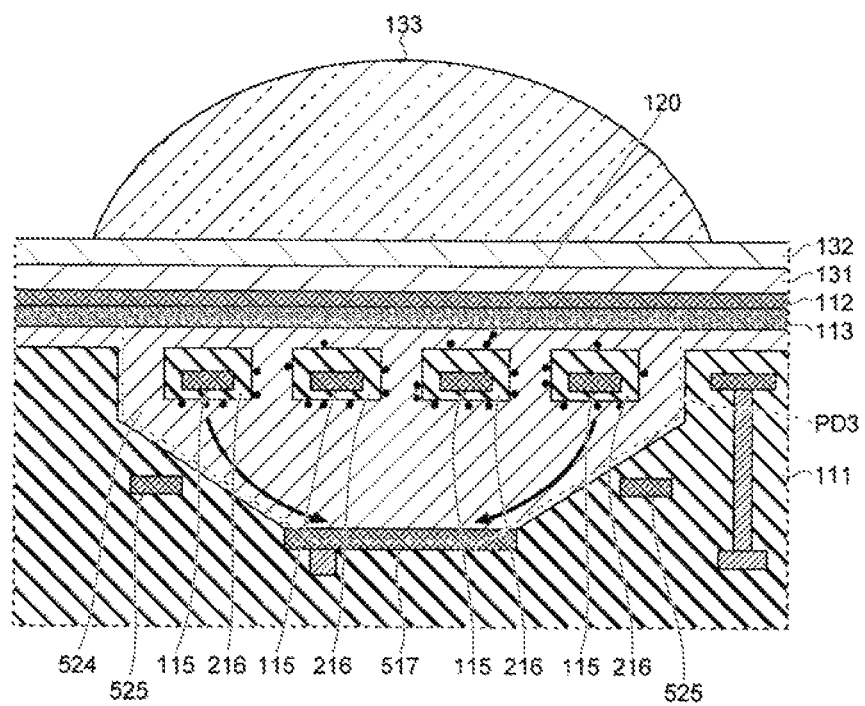
FIG. 30 is a cross-sectional view showing a schematic configuration example of an organic photoelectric conversion element and portions in the vicinity thereof according to a third modification example of the fifth embodiment.

Further, as shown in FIG. 30, for example, in addition to the configuration exemplified in the second modification example, a shape in which a modulation electrode 525 is disposed in the insulating layer 111 in the vicinity of an inclined surface of the semiconductor layer 524 can also be adopted.

In such a configuration, the stored charge 120 stored in the vicinity of the stored charge 120 can be effectively guided to a specific region of the read-out electrode 517 by applying a predetermined voltage to the modulation electrode 525 to modulate potential in the semiconductor layer 524 from the outside during charge reading-out, and thus it is possible to further reduce an area required for the read-out electrode 517.

6. Sixth Embodiment

Next, a sixth embodiment will be described in detail with reference to the accompanying drawings. Meanwhile, in the present embodiment, the same configurations and operations as those in the above-described embodiment will be quoted, and repeated description thereof will be omitted.

Figure 31:
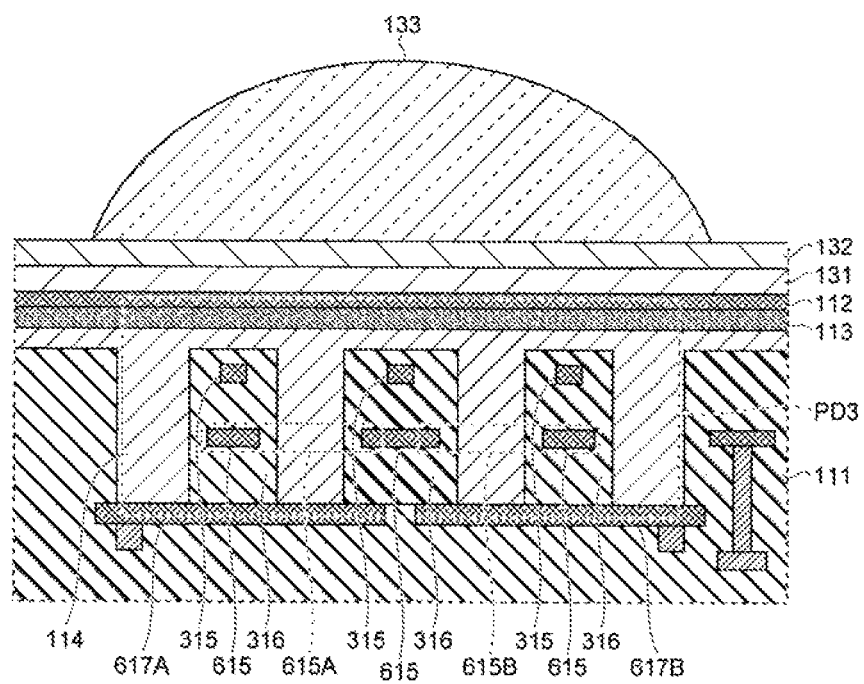
FIG. 31 is a cross-sectional view showing a schematic configuration example of an organic photoelectric conversion element and portions in the vicinity thereof according to a sixth embodiment.

FIG. 31 is a cross-sectional view showing a schematic configuration example of an organic photoelectric conversion element and portions in the vicinity thereof according to the sixth embodiment. As shown in FIG. 31, an organic photoelectric conversion element PD3 according to the sixth embodiment has a structure in which the storage electrode 115 is replaced with a storage electrode 615, and the read-out electrode 117 is replaced with read-out electrodes 617A and 617B, for example, in the same configuration as that of the organic photoelectric conversion element PD3 described using FIG. 21 and the like in the third embodiment.

Meanwhile, the storage electrode 615 may be constituted by two storage electrodes electrically separated from each other, but is not limited thereto. The storage electrode may include two regions 615A and 615B that are two different regions into which at least a storage region is divided.

Figure 32:
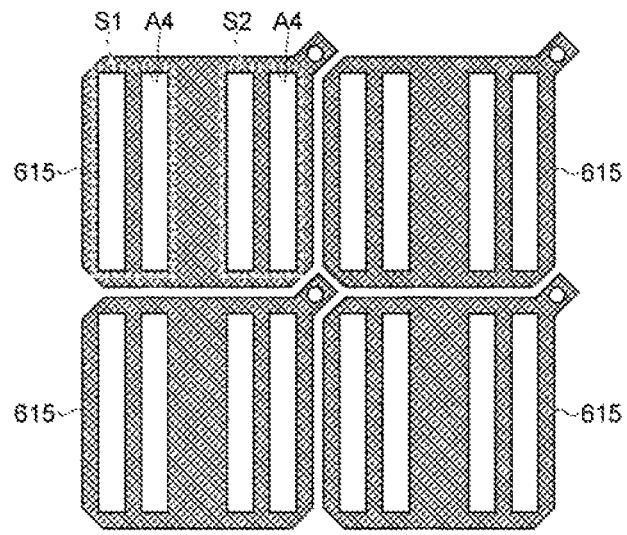
FIG. 32 is a cross-sectional view showing a schematic configuration example of an organic photoelectric conversion element and portions in the vicinity thereof according to a modification example of the sixth embodiment.
Figure 33:
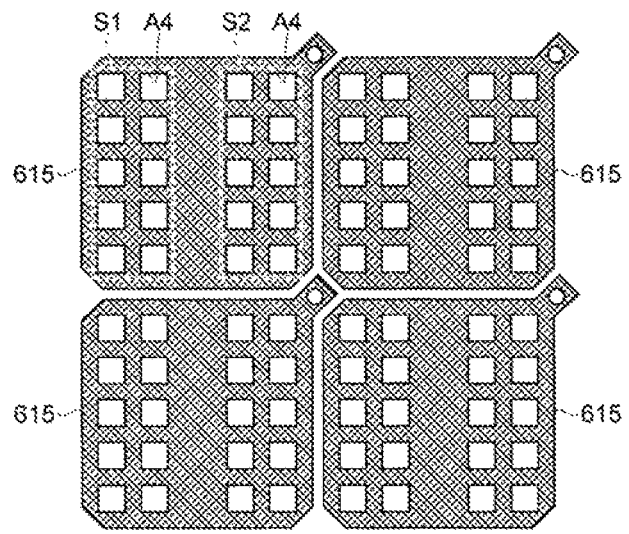
FIG. 33 is a cross-sectional view showing a schematic configuration example of an organic photoelectric conversion element and portions in the vicinity thereof according to another modification example of the sixth embodiment.

For example, in the structure including the shield electrode 315 as exemplified in the third embodiment, most of the stored charge 120 is stored in the semiconductor layer 14 on the side wall side of the storage electrode 615. For this reason, in order to divide at least a storage region into two different regions, an opening A4 of the storage electrode 615 may be configured to have a shape divided into two systems S1 and S2, for example, as shown in FIG. 32 or FIG. 33.

In this manner, a storage electrode and a read-out electrode in one unit pixel 3110 are divided into two storage electrodes 615 (regions 615A and 615B) and two read-out electrodes 617A and 617B, and thus imaging plane phase difference information can be acquired.

That is, according to the structure in the present embodiment, the stored charge 120 generated by performing photoelectric conversion of light following two different paths is stored in different storage regions in the semiconductor layer 114 by the regions 615A and 615B of the storage electrode 615. In addition, a read-out electrode is divided into two read-out electrodes 617A and 617B, and thus the stored charge 120 stored in different storage regions of the semiconductor layer 114 can be separately transferred to the read-out electrode 617A or 617B.

Consequently, for example, stored charge 120 generated by performing photoelectric conversion of light incident during a certain period is read out from the read-out electrode 617A, stored charge 120 generated by performing photoelectric conversion of light incident during a later period is read out from the read-out electrode 617B, and a distance to an object can be obtained by obtaining a ratio of each of the stored charge.

Further, it is also possible to construct a so-called light field camera capable of acquiring more detailed ray information by dividing the storage electrode 115 and the read-out electrode 117 into three or more electrodes.

The other configurations, operations, and effects may be the same as those in the above-described embodiment, and thus detailed description thereof will be omitted here.

7. Seventh Embodiment

Next, a seventh embodiment will be described in detail with reference to the accompanying drawings. Meanwhile, in the present embodiment, the same configurations and operations as those in the above-described embodiment will be quoted, and repeated description thereof will be omitted.

Figure 34:
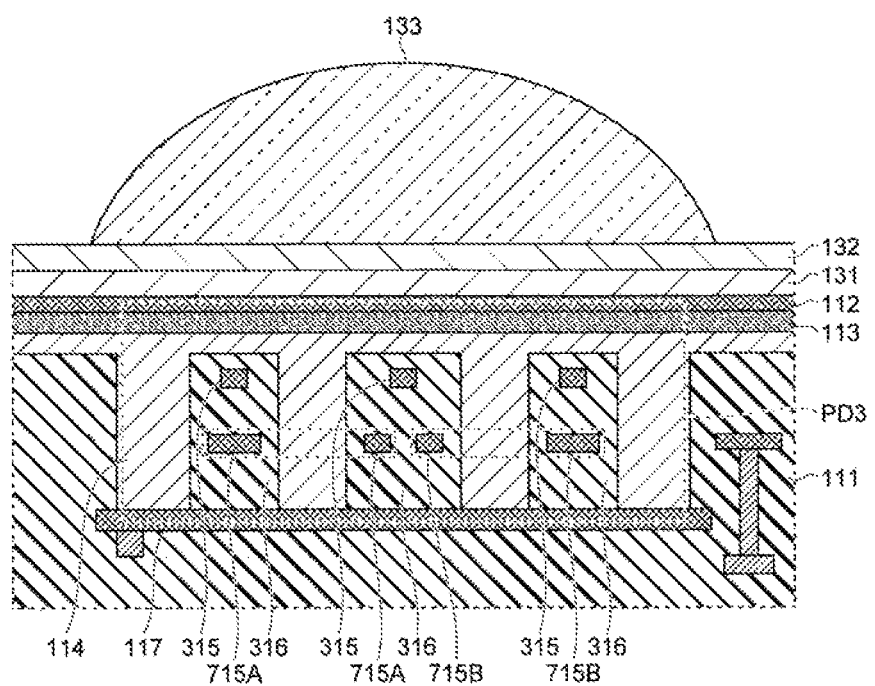
FIG. 34 is a cross-sectional view showing a schematic configuration example of an organic photoelectric conversion element and portions in the vicinity thereof according to a seventh embodiment.

FIG. 34 is a cross-sectional view showing a schematic configuration example of an organic photoelectric conversion element and portions in the vicinity thereof according to the seventh embodiment. As shown in FIG. 34, an organic photoelectric conversion element PD3 according to the seventh embodiment has a structure in which the storage electrode 115 is divided into two storage electrodes 715A and 715B instead of the read-out electrode 117, for example, in the same configuration as that of the organic photoelectric conversion element PD3 described using FIG. 31 and the like in the sixth embodiment.

Figure 35:
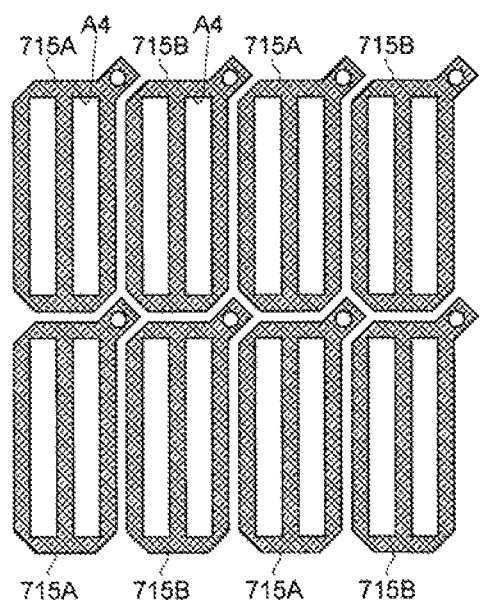
FIG. 35 is a plan view showing an example of a planar layout of a storage electrode according to the seventh embodiment.
Figure 36:
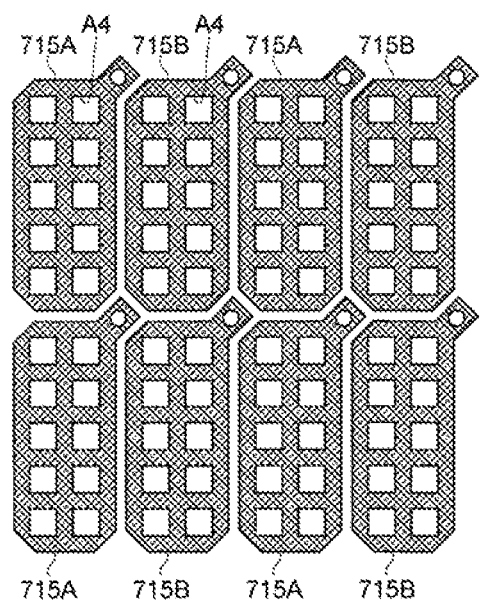
FIG. 36 is a plan view showing another example of a planar layout of the storage electrode according to the seventh embodiment.

FIGS. 35 and 36 are plan views showing an example of a planar layout of a storage electrode according to the seventh embodiment. As shown in FIG. 35 or 36, the storage electrodes 715A and 715B have a structure in which two storage electrodes 715A and 715B are electrically separated from each other, for example, in the same layout as the planar layout including the same opening A4 as that of the storage electrode 615 described using FIG. 32 or 33 in the sixth embodiment.

With such a structure, similarly to the sixth embodiment, stored charge 120 generated by performing photoelectric conversion of light following two different paths is stored in a different storage region of the semiconductor layer 114, and stored charge 120 stored in a different storage region of the semiconductor layer 114 can be separately transferred to the read-out electrode 117. Thus, imaging plane phase difference information can be acquired.

Further, in the present embodiment, components such as the read-out electrode 117, a through electrode 119, and a floating diffusion region FD3 can be shared by two systems that read out the stored charge 120, and thus it is also possible to improve layout efficiency of a unit pixel 3110.

The other configurations, operations, and effects may be the same as those in the above-described embodiment, and thus detailed description thereof will be omitted here.

8. Eighth Embodiment

Next, an eighth embodiment will be described in detail with reference to the accompanying drawings. Meanwhile, in the present embodiment, the same configurations and operations as those in the above-described embodiment will be quoted, and repeated description thereof will be omitted.

Figure 37:
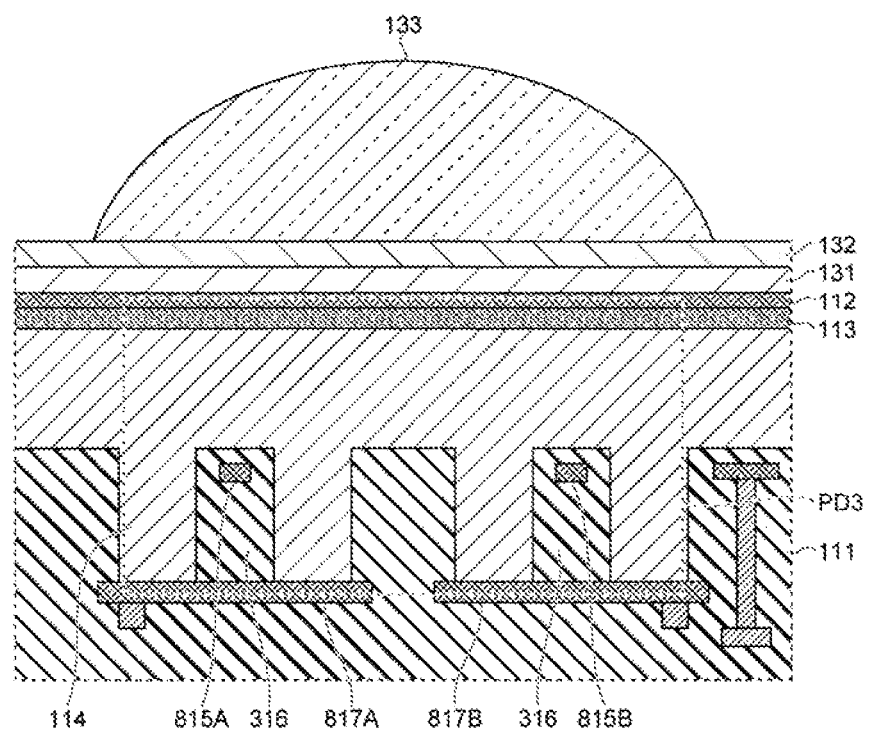
FIG. 37 is a cross-sectional view showing a schematic configuration example of an organic photoelectric conversion element and portions in the vicinity thereof according to an eighth embodiment.

FIG. 37 is a cross-sectional view showing a schematic configuration example of an organic photoelectric conversion element and portions in the vicinity thereof according to the eighth embodiment. As shown in FIG. 37, an organic photoelectric conversion element PD3 according to the eighth embodiment has a structure in which both the read-out electrode 117 and the storage electrode 115 are respectively divided into two storage electrodes 815A and 815B and two read-out electrodes 817A and 817B, for example, in the same configuration as that of the organic photoelectric conversion element PD3 described using FIG. 31, 34, or the like in the sixth or seventh embodiment. Further, in the present embodiment, the shield electrode 315 is omitted.

In the present embodiment, the storage electrodes 815A and 815B are not used to store charge, but are used as electrodes (potential control electrodes) for controlling the potential of the surrounding semiconductor layer 114.

In general, when a distance measuring device using an image sensor adopts a time of flight (ToF) operation as a distance measuring method, it is necessary to transfer charge by distributing the charge generated by photoelectric conversion from side to side at high speed within a single pixel.

Consequently, as in the eighth embodiment, a configuration is adopted in which a read-out electrode and a storage electrode are respectively divided into two storage electrodes 815A and 815B and two read-out electrodes 817A and 817B, and the storage electrodes 815A and 815B are used as potential control electrodes for controlling the potential of the surrounding semiconductor layer 114. Thereby, it is possible to distribute charge generated by photoelectric conversion to either of the two read-out electrode 817A and 818B at high speed by alternately changing voltages to be applied to the storage electrodes 815A and 815B.

The other configurations, operations, and effects may be the same as those in the above-described embodiment, and thus detailed description thereof will be omitted here.

9. Ninth Embodiment

Next, a ninth embodiment will be described in detail with reference to the accompanying drawings. Meanwhile, in the present embodiment, the same configurations and operations as those in the above-described embodiment will be quoted, and repeated description thereof will be omitted.

The organic photoelectric conversion element PD3 according to the present embodiment may be the same as, for example, the organic photoelectric conversion element PD3 described using FIG. 37 in the eighth embodiment. However, in the present embodiment, the driving of the organic photoelectric conversion element PD3 and roles of the read-out electrodes 817A and 817B are different from those in the eighth embodiment.

Figure 38:
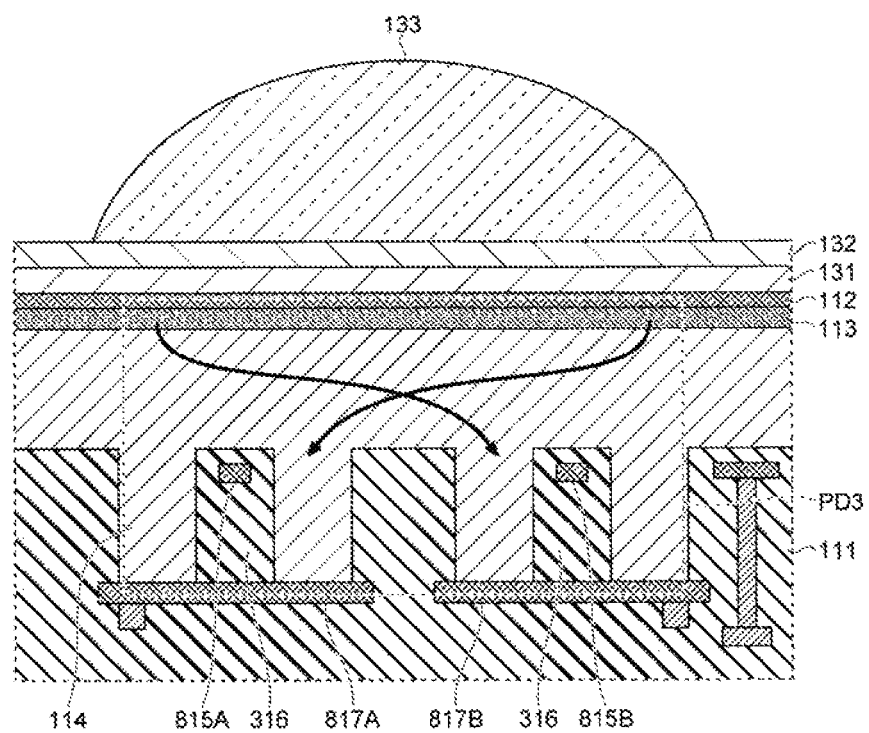
FIG. 38 is a cross-sectional view showing a schematic configuration example of an organic photoelectric conversion element and portions in the vicinity thereof according to a ninth embodiment.

As shown in FIG. 38, in the present embodiment, similarly to the eighth embodiment, both a read-out electrode and a storage electrode are respectively divided into two storage electrodes 815A and 815B and two read-out electrodes 817A and 817B.

In such a configuration, in the present embodiment, charge generated by photoelectric conversion is attracted to the storage electrode 815A side and is continuously read out from the read-out electrode 817A, for example, during an exposure period, while charge generated by photoelectric conversion is attracted to the storage electrode 815B side and is continuously read out from the read-out electrode 817B during a shutter period.

At this time, the read-out electrode 817A is connected to a floating diffusion region FD3. For this reason, charge generated by photoelectric conversion is stored in the floating diffusion region FD during an exposure period, and is read out as a pixel signal by a column processing circuit 3103. On the other hand, the read-out electrode 817B is connected to a power voltage VDD during a shutter period. For this reason, charge generated by photoelectric conversion during a shutter period is discharged to the power voltage VDD side.

With such an operation, it is possible to perform a so-called global shutter operation of starting shutter operations of all of the unit pixels 3110 at once.

The other configurations, operations, and effects may be the same as those in the above-described embodiment, and thus detailed description thereof will be omitted here.

10. Tenth Embodiment

Next, a tenth embodiment will be described in detail with reference to the accompanying drawings. Meanwhile, in the present embodiment, the same configurations and operations as those in the above-described embodiment will be quoted, and repeated description thereof will be omitted.

Figure 39:
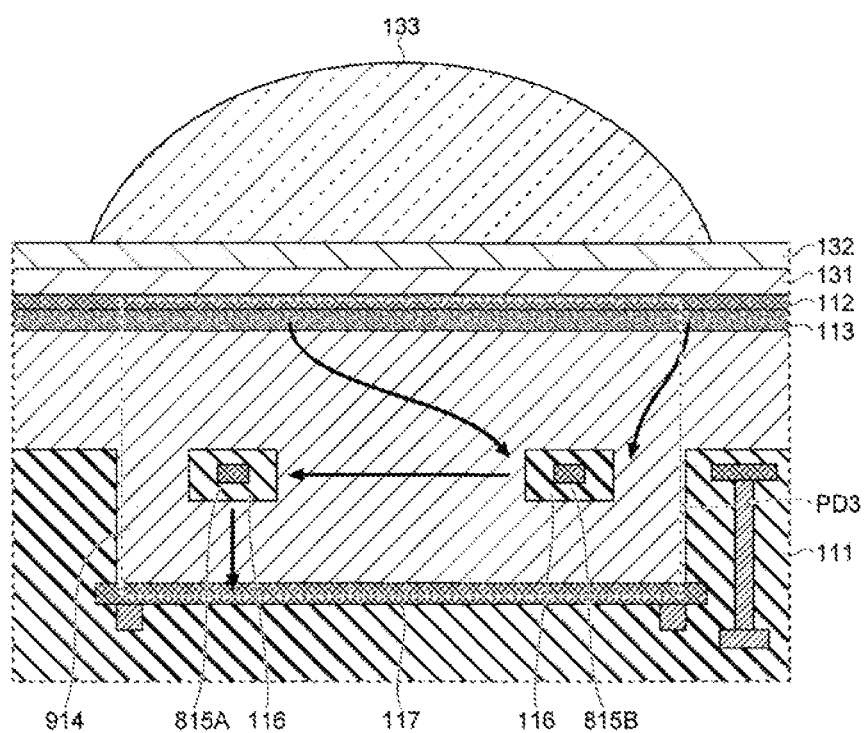
FIG. 39 is a cross-sectional view showing a schematic configuration example of an organic photoelectric conversion element and portions in the vicinity thereof according to a tenth embodiment.

FIG. 39 is a cross-sectional view showing a schematic configuration example of an organic photoelectric conversion element and portions in the vicinity thereof according to the tenth embodiment. As shown in FIG. 39, an organic photoelectric conversion element PD3 according to the tenth embodiment has a structure in which the read-out electrodes 817A and 817B are replaced with one read-out electrode 117, the insulating film 316 covering each of the storage electrodes 815A and 815B is replaced with an insulating film 116 that does not reach the read-out electrode 117, and the semiconductor layer 114 is replaced with a semiconductor layer 914 that does not have a trench for each of the storage electrodes 815A and 815B, for example, in the same configuration as that of the organic photoelectric conversion element PD3 described using FIG. 37 and the like in the eighth embodiment.

In such a structure, in the present embodiment, charge is stored in the vicinity of the storage electrode 815B during an exposure period, and stored charge 120 is transferred from the vicinity of the storage electrode 815B to the vicinity of the storage electrode 815A and is held by all of the unit pixels 3110 at once at a timing when a shutter operation is started. Thereafter, the stored charge 120 (not shown) is sequentially transferred from the vicinity of the storage electrode 815A to a read-out electrode 117 and is read out.

In this manner, it is possible to perform a global shutter operation of executing a shutter operation by all of the unit pixels 3110 at once by executing a shutter operation by all of the unit pixels 3110 at once, holding charge generated by the shutter operation in the storage electrode 815B, and then reading out the charge from the unit pixels 3110 in order.

That is, in the present embodiment, the storage electrode 115B functions as a memory that holds charge generated by a shutter operation.

Meanwhile, in the present embodiment, it is not necessary to shield a memory region from light by using a transparent material for all components of the organic photoelectric conversion element PD3 including the storage electrodes 815A and 815B, and thus it is possible to realize a highly sensitive global shutter structure in which an area within the unit pixel 3110 is utilized to the maximum.

The other configurations, operations, and effects may be the same as those in the above-described embodiment, and thus detailed description thereof will be omitted here.

11. Eleventh Embodiment

Next, an eleventh embodiment will be described in detail with reference to the accompanying drawings. Meanwhile, in the present embodiment, the same configurations and operations as those in the above-described embodiment will be quoted, and repeated description thereof will be omitted.

Figure 40:
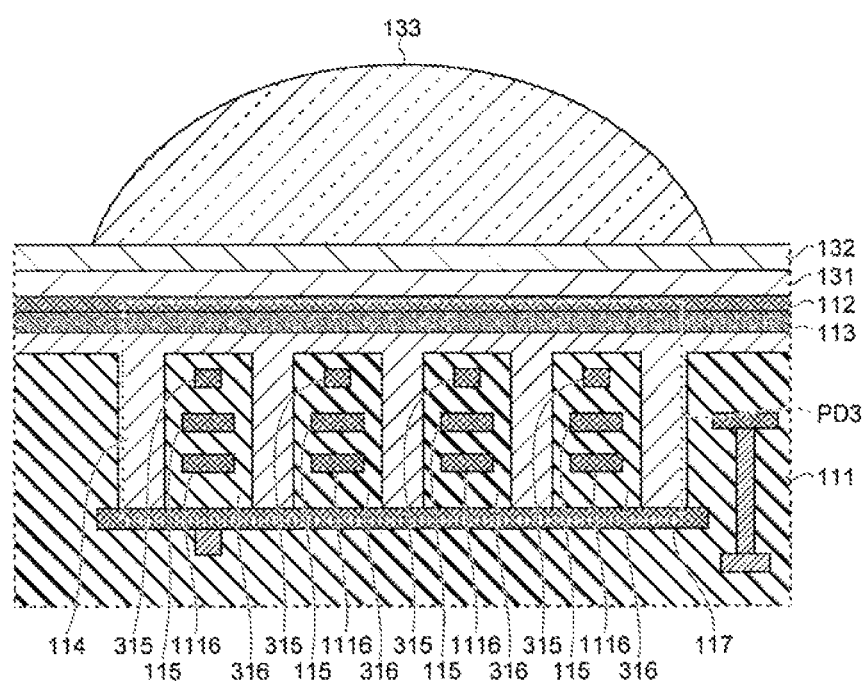
FIG. 40 is a cross-sectional view showing a schematic configuration example of an organic photoelectric conversion element and portions in the vicinity thereof according to an eleventh embodiment.

FIG. 40 is a cross-sectional view showing a schematic configuration example of an organic photoelectric conversion element and portions in the vicinity thereof according to the eleventh embodiment. As shown in FIG. 40, an organic photoelectric conversion element PD3 according to the eleventh embodiment has a configuration in which a memory electrode (fifth electrode) 1116 is further provided between the storage electrode 115 and the read-out electrode 117 in the insulating film 316, for example, in the same configuration as that of the organic photoelectric conversion element PD3 described using FIG. 21 and the like in the third embodiment.

In such a structure, in the present embodiment, charge is stored in the storage electrode 115 which is close to a photoelectric conversion film 113 during an exposure period, and stored charge 120 is transferred from the vicinity of the storage electrode 115 to the vicinity of the memory electrode 1116 by all unit pixels 3110 at once at a timing when a shutter operation is started, and is held. Thereafter, the stored charge 120 is sequentially transferred from the vicinity of the memory electrode 1116 to the read-out electrode 117 and is read out.

In this manner, it is possible to perform a global shutter operation of executing a shutter operation by all of the unit pixels 3110 at once by executing a shutter operation by all of the unit pixels 3110 at once, holding charge generated by the shutter operation in the memory electrode 1116, and then reading out the charge from the unit pixels 3110 in order.

Further, in the present embodiment, for example, as compared to the ninth or tenth embodiment, a memory region is not provided in a horizontal direction with respect to the storage electrode 115 (a direction perpendicular to a substrate thickness direction) but is provided in a vertical direction (substrate thickness direction), and thus it is possible to suppress a reduction in the size of a storage region due to the memory region. Thereby, it is possible to realize a global shutter structure with a maximized amount of stored charge.

Meanwhile, in the present embodiment, in a case where electrons generated by photoelectric conversion are used as a signal, for example, the voltage of the common electrode 112, the voltage of the read-out electrode 117, the voltage of the shield electrode 315, the voltage of the storage electrode 115, and the voltage of the memory electrode 1116 can be respectively set to −2 V, 3 V, 0 V, 1 V, and 0.5 V during a storage period.

In addition, the voltage of the shield electrode 315, the voltage of the storage electrode 115, and the voltage of the memory electrode 1116 can be respectively set to −2 V, −1 V, and 1 V during a transfer period.

The other configurations, operations, and effects may be the same as those in the above-described embodiment, and thus detailed description thereof will be omitted here.

12. Twelfth Embodiment

Next, a twelfth embodiment will be described in detail with reference to the accompanying drawings. Meanwhile, in the present embodiment, the same configurations and operations as those in the above-described embodiment will be quoted, and repeated description thereof will be omitted.

Figure 41:
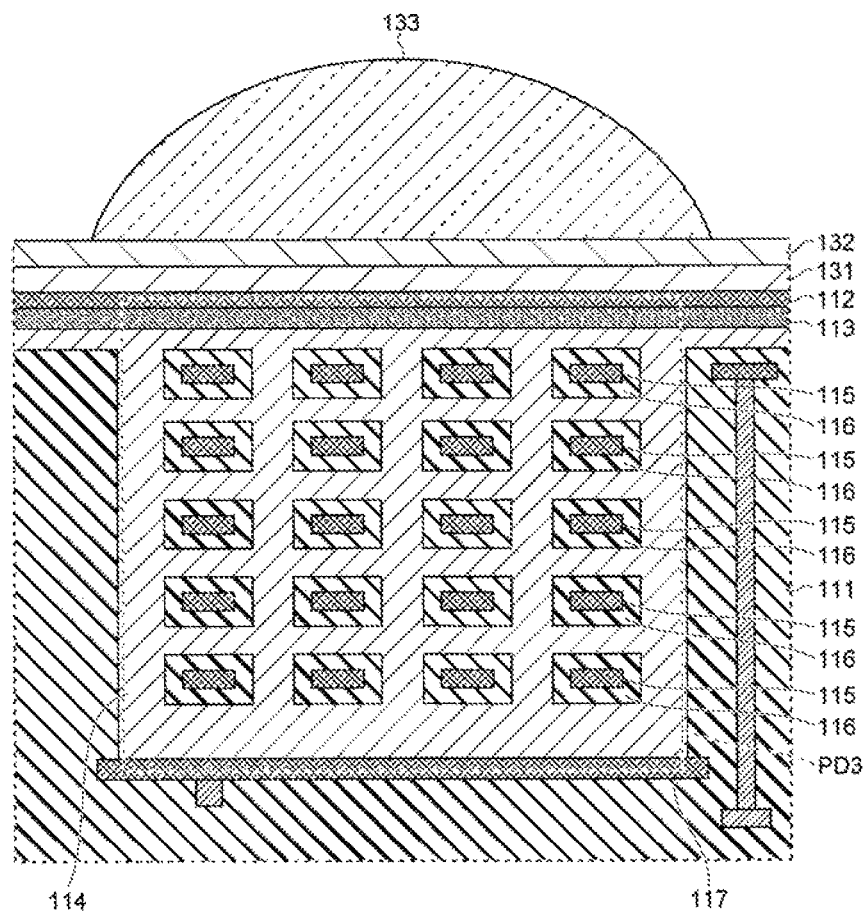
FIG. 41 is a cross-sectional view showing a schematic configuration example of an organic photoelectric conversion element and portions in the vicinity thereof according to a twelfth embodiment.

FIG. 41 is a cross-sectional view showing a schematic configuration example of an organic photoelectric conversion element and portions in the vicinity thereof according to the twelfth embodiment. As shown in FIG. 41, an organic photoelectric conversion element PD3 according to the twelfth embodiment has a structure in which the storage electrode 115 surrounded by the insulating film 116 is provided in multiple stages in a substrate thickness direction, for example, in the same configuration as that of the organic photoelectric conversion element PD3 described using FIG. 9 and the like in the first embodiment. Meanwhile, in order to realize such a multi-stage structure, the semiconductor layer 114 is thickened in the substrate thickness direction.

According to such a structure, it is possible to perform a calculation operation such as addition and subtraction of charge by independently controlling three-dimensionally arranged individual storage electrodes 115 until charge generated by photoelectric conversion is read out from the read-out electrode 117.

For example, the addition of charge can be performed by holding charge generated by a first shutter operation in the vicinity of a certain storage electrode 115, holding charge generated by a second shutter operation in the vicinity of another storage electrode 115, and then collecting these charge in the vicinity of one storage electrode 115.

In this manner, according to the present embodiment, calculation processing can be performed within the organic photoelectric conversion element PD3 before a pixel signal is read out from the unit pixel 3110, and thus it is possible to execute advanced calculation such as pixel addition and image recognition within an image sensor.

In addition, it is possible to complicate calculation processing that can be executed in each unit pixel 3110 by further increasing the number of storage electrodes 115 provided in one unit pixel 3110.

Meanwhile, the storage electrode 115 does not need to be provided in multiple stages in the substrate thickness direction within each organic photoelectric conversion element PD3, and calculation processing can also be executed within each unit pixel 3110 with a configuration in which a plurality of storage electrodes 115 are arrayed in a plane perpendicular to the substrate thickness direction.

The other configurations, operations, and effects may be the same as those in the above-described embodiment, and thus detailed description thereof will be omitted here.

13. Thirteenth Embodiment

Next, a thirteenth embodiment will be described in detail with reference to the accompanying drawings. Meanwhile, in the present embodiment, the same configurations and operations as those in the above-described embodiment will be quoted, and repeated description thereof will be omitted.

In the present embodiment, a method of manufacturing the image sensor 100 exemplified in the first embodiment will be described. FIGS. 42 to 48 are process cross-sectional views showing a manufacturing method according to the thirteenth embodiment. Meanwhile, the manufacturing method exemplified in the present embodiment may be a manufacturing method using a wearable chip size packaging (CSP) technique including bonding the light receiving chip 3121 and the circuit chip 3122 together in a wafer state before performing separation into individual pieces.

In the present manufacturing method, first, predetermined acceptors and donors are sequentially ion-implanted into a predetermined region in the P-type semiconductor substrate 101 to form the P-type semiconductor regions 102 and 104 and the N-type semiconductor regions 103 and 105 that form the photo diodes PD1 and PD2. Meanwhile, an element isolation region for performing element isolation of the photo diodes PD1 and PD2 between adjacent unit pixels 3110 and various transistors may be provided in a boundary portion between the adjacent unit pixels 3110. The element isolation region may be a structure in which an insulating film and/or a light-shielding film is formed in a trench formed in the semiconductor substrate 101, a channel stopper for preventing a channel straddling between the adjacent unit pixels 3110 from being formed, or the like.

Next, the transfer transistor TRG1 which is a vertical transistor is formed on the front face (a lower surface in the drawing) of the semiconductor substrate 101. Subsequently, the insulating film 106 and a gate electrode which serve as a gate insulating film of transistors constituting read circuits of the pixels 3110B, 3110R, and 3110G are formed. Then, after the gate electrode is processed, a side wall is formed on the side wall side of the gate electrode, and then ion implantation is performed using the gate electrode and the side wall as a mask, thereby forming sources and drains of the transistors constituting the read circuits.

Thereafter, the wiring layer 121 including the wiring 122 connected to the gate electrodes, sources, drains, and the like of the transistors is formed on the front face of the semiconductor substrate 101. Meanwhile, at this stage, the circuit chip 3122 prepared separately and the light receiving chip 3121 including the semiconductor substrate 101 may be bonded together.

Next, a trench penetrating the semiconductor substrate 101 is formed from the back face of the semiconductor substrate 101, and the antireflection film 110 covering the back face of the semiconductor substrate 101 and the inside of the trench, an insulating film (a portion of the insulating layer 111) filling in the trench, the through electrode 119 penetrating the semiconductor substrate 101 in the trench and connected to the wiring in the wiring layer 121, the wiring 118 connected to the through electrode, and the like are formed.

Figure 42:
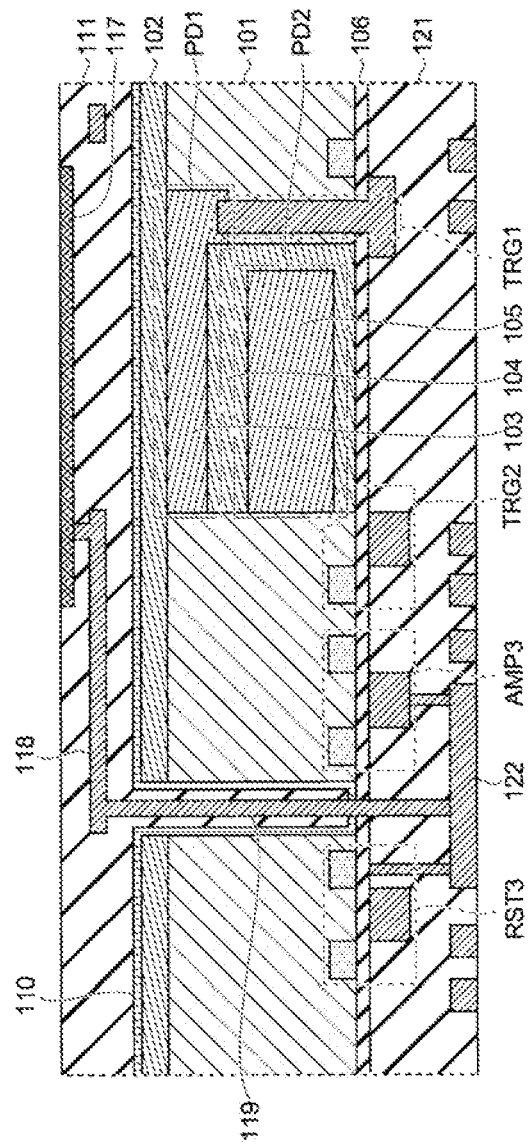
FIG. 42 is a process cross-sectional view showing a method of manufacturing a solid-state imaging device according to a thirteenth embodiment (Part 1).

Next, a transparent electrode material is accumulated on the insulating film, and the formed transparent electrode material film is processed by photolithography and dry etching. Subsequently, an insulating film (a portion of the insulating layer 111) is accumulated to bury the processed transparent electrode material film, and the upper surface thereof is flattened by chemical mechanical polishing (CMP) or the like, thereby forming the read-out electrode 117. Thereby, a cross-sectional structure shown in FIG. 42 is obtained.

Next, a semiconductor material is accumulated on the insulating film having the read-out electrode 117 formed therein, and the formed semiconductor film is processed by photolithography and dry etching. Subsequently, an insulating film (a portion of the insulating layer 111) is accumulated to bury the processed semiconductor film, and the upper surface thereof is flattened by CMP or the like, thereby forming a semiconductor layer 114A which is a lower portion of the semiconductor layer 114.

Figure 43:
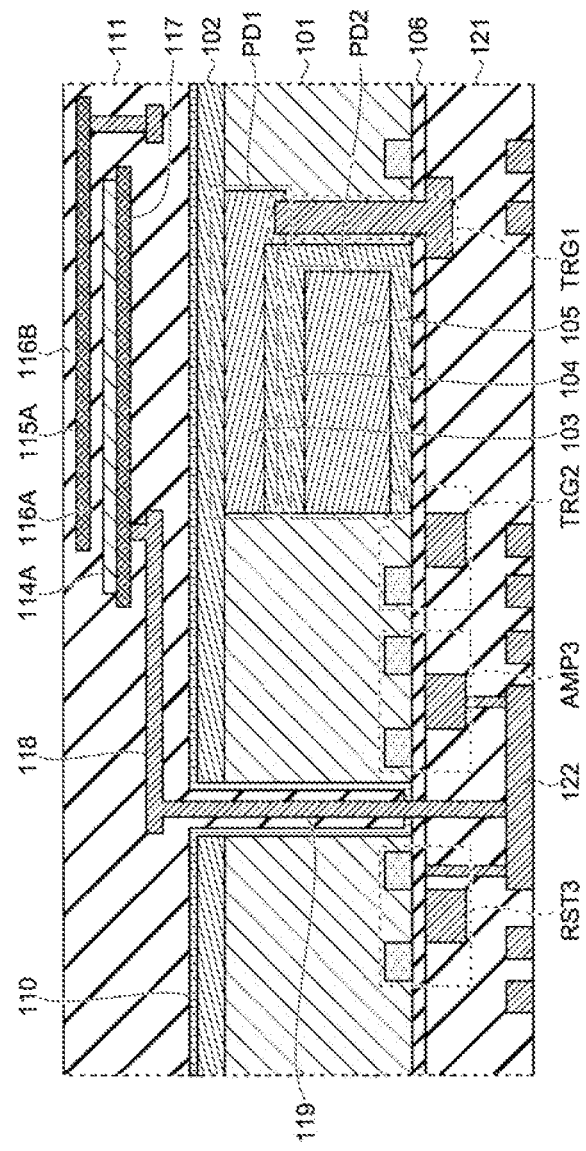
FIG. 43 is a process cross-sectional view showing the method of manufacturing a solid-state imaging device according to the thirteenth embodiment (Part 2).

Next, a laminated structure which is constituted by the storage electrode 115 and the insulating film 116 later is formed as shown in FIG. 43 through accumulation of an insulating film 116A which is a lower portion of the insulating film 116, accumulation of a transparent conductive material film 15A processed into the storage electrode 115, processing of a transparent electrode material film 115A by photolithography and dry etching, accumulation of an insulating film (a portion of the insulating layer 111), flattening of upper surfaces of the transparent electrode material film 115A and the insulating film by CMP or the like, and accumulation of an insulating film 116B which is a lower portion of the insulating film 116.

Figure 44:
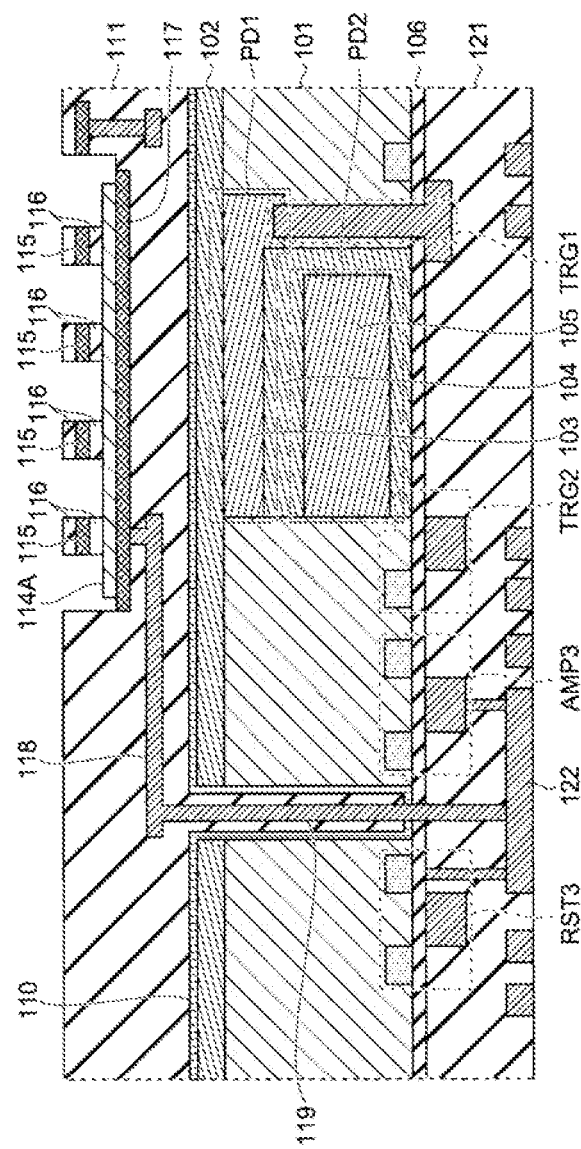
FIG. 44 is a process cross-sectional view showing the method of manufacturing a solid-state imaging device according to the thirteenth embodiment (Part 3).

Next, the insulating film 116B, the transparent electrode material film 115A, and the insulating film 116A are processed by photolithography and dry etching, thereby forming an opening region to process the transparent electrode material film 115A into the storage electrode 115 as shown in FIG. 44.

Figure 45:
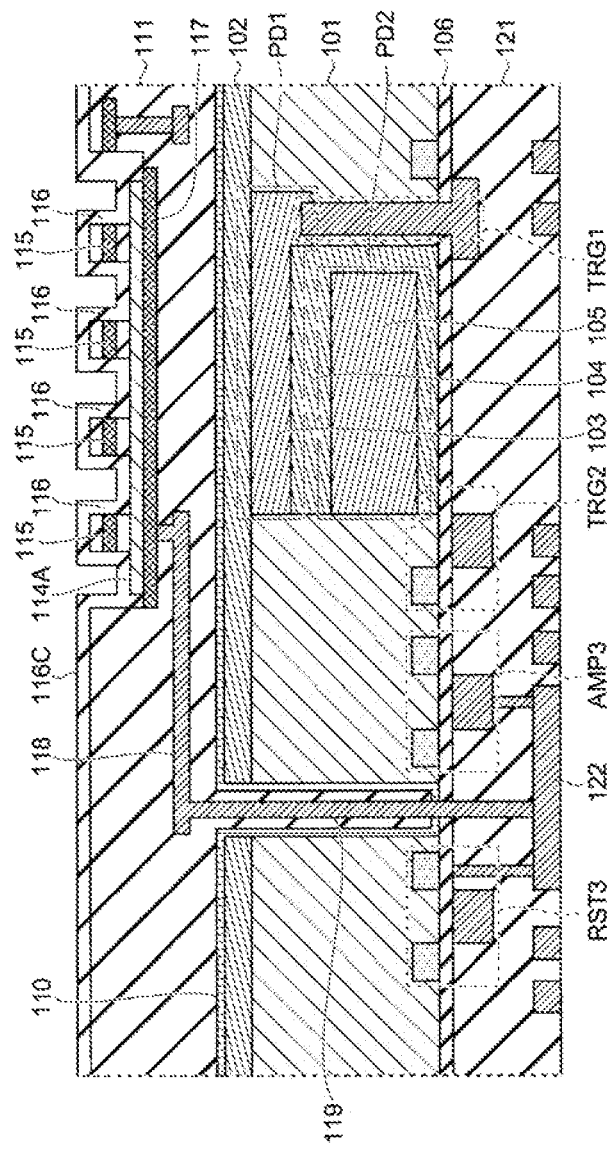
FIG. 45 is a process cross-sectional view showing the method of manufacturing a solid-state imaging device according to the thirteenth embodiment (Part 4).
Figure 46:
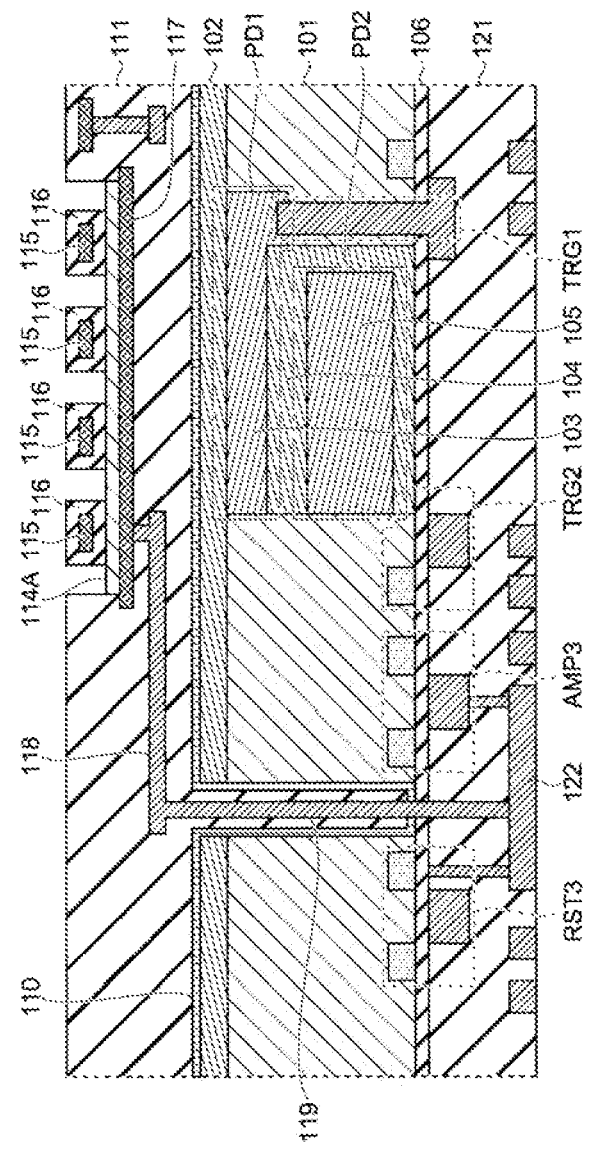
FIG. 46 is a process cross-sectional view showing the method of manufacturing a solid-state imaging device according to the thirteenth embodiment (Part 5).

Next, as shown in FIG. 45, an insulating film 116C covering the front face of the insulating layer 111 at the present point in time is formed. Subsequently, a portion of the insulating film 116C is removed by etching-back or the like to expose the semiconductor layer 114A in the opening region and form an insulating film on the side face of the storage electrode 115. Thereby, as shown in FIG. 46, the insulating film 116 covering the storage electrode 115 is formed.

Figure 47:
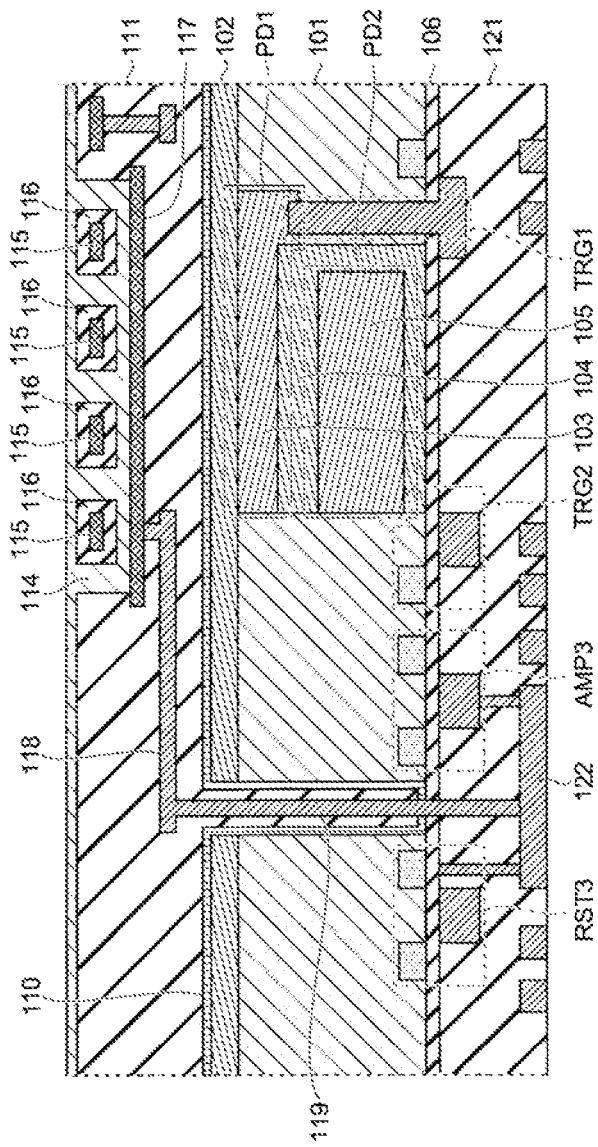
FIG. 47 is a process cross-sectional view showing the method of manufacturing a solid-state imaging device according to the thirteenth embodiment (Part 6).

Next, a semiconductor material is accumulated on a surface on which the storage electrode 115 and the insulating film 116 are formed, and the front face of the formed semiconductor layer is flattened by CMP or the like. Thereby, as shown in FIG. 47, the semiconductor layer 114 is formed in the vicinity of the insulating film 116 that covers the storage electrode 115.

Figure 48:
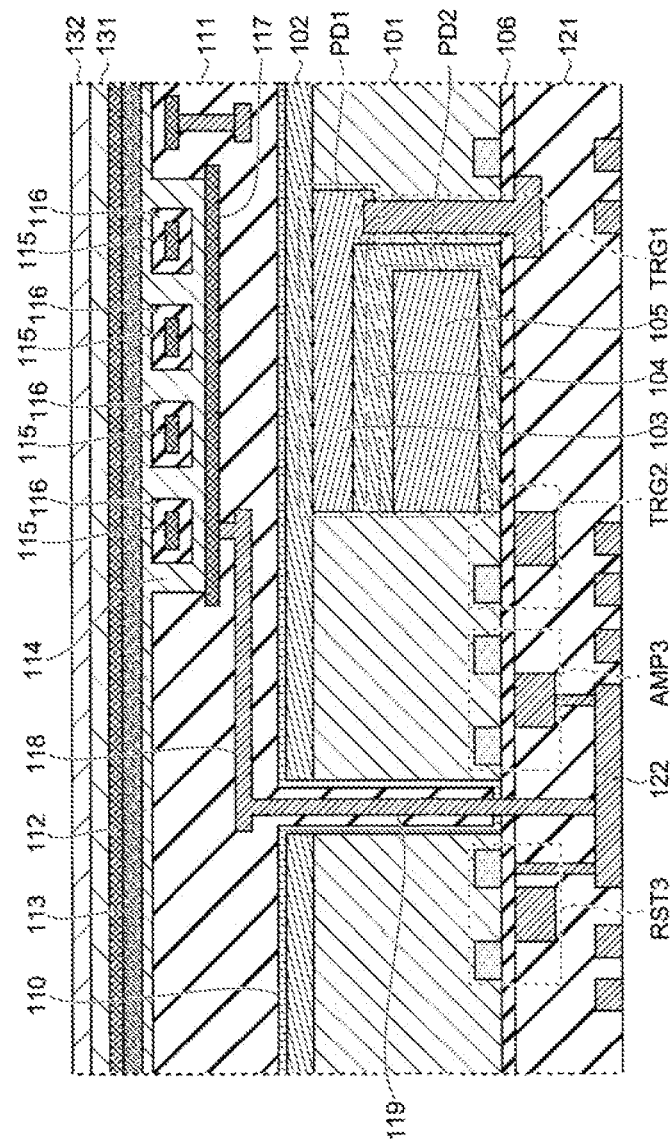
FIG. 48 is a process cross-sectional view showing the method of manufacturing a solid-state imaging device according to the thirteenth embodiment (Part 7).

Next, as shown in FIG. 48, the photoelectric conversion film 113, the common electrode 112, the protection film 131, and the flattening film 132 are sequentially accumulated on the semiconductor layer 114. Thereafter, a wiring structure for the common electrode 112, the on-chip lens 133 for each unit pixel 3110, and a bonding pad are formed, whereby the image sensor 100 including the cross-sectional structure shown in FIG. 9 is manufactured.

Meanwhile, in the above-described manufacturing method, physical vapor deposition (PVD), spin-coating, or the like can also be used to form the semiconductor layers 114A and 114. In addition, in order to improve element characteristics, a film in which materials of a plurality of types are mixed, a laminated film in which material films of a plurality of types are laminated, or the like can also be used for the photoelectric conversion film 113. At this time, some of the materials to be mixed or laminated may be materials that do not perform photoelectric conversion by themselves.

13.1 Details of Manufacturing Process for Each Component

Hereinafter, a manufacturing process for each component will be described in more detail.

As a film forming method for various electrodes, a dry method or a wet method can be used.

Examples of the dry method may include a PVD method and a chemical vaper deposition (CVD) method. Examples of a film forming method using the principal of the PVD method include a vacuum vapor deposition method using resistance heating or high frequency heating, an electron beam (EB) deposition method, various sputtering methods (a magnetron sputtering method, an RF-DC coupled bias sputtering method, an electron cyclotron resonance (ECR) sputtering method, an opposed target sputtering method, a high frequency sputtering method, and the like), an ion plating method, a laser ablation method, a molecular beam epitaxy method, and a laser transfer method. Further, examples of the CVD method include a plasma CVD method, a thermal CVD method, an organometallic (MO) CVD method, and an optical CVD method.

On the other hand, examples of the wet method include methods such as an electrolytic plating method, an electroless plating method, a spin coating method, an inkjet method, a spray coating method, a stamp method, a micro contact printing method, a flexographic printing method, an offset printing method, a gravure printing method, and a dip method. Examples of a patterning method include chemical etching such as a shadow mask, laser transfer, or photolithography, physical etching using ultraviolet rays, laser, or the like, and the like.

As a flattening technique for the read-out electrode 117 and the common electrode 112, a laser flattening method, a reflow method, a CMP method, and the like can be used.

Examples of a material constituting the insulating film 116 not only include inorganic insulating materials exemplified by metal oxide highly dielectric insulating materials such as silicon oxide-based materials, silicon nitride ($SiN_Y$), and aluminum oxide ($Al_2O_3$), but also include polymethylmethacrylate (PMMA), polyvinylphenol (PVP), polyvinyl alcohol (PVA), polyimide, polycarbonate (PC), polyethylene terephthalate (PET), polystyrene, silanol derivatives (a silane coupling agent) such as N-2 (aminoethyl) 3-aminopropyltrimethoxysilane (AEAPTMS), 3-Mercaptopropyltrimethoxysilane (MPTMS), and octadecyltrichlorosilane (OTS), a novolak type phenol resin, a fluororesin, organic insulating materials (organic polymers) exemplified by linear hydrocarbons having a functional group that can be coupled to a control electrode at one end thereof, such as octadecanethiol and dodecyl isocyanate. In addition, it is also possible to use combinations thereof.

Meanwhile, examples of the silicon oxide-based materials include silicon oxide ($SiO_X$), BPSG, PSG, BSG, AsSG, PbSG, silicon oxide nitride (SiON), SOG (spin-on glass), and low dielectric constant materials (for example, polyaryl ether, cycloperfluorocarbon polymer and benzocyclobutene, cyclic fluororesin, polytetrafluoroethylene, aryl ether fluoride, polyimide fluoride, amorphous carbon, organic SOG).

In addition, a material constituting the insulating film of the insulating layer 111 and the wiring layer 121 may also be appropriately selected from these materials.

Examples of the film forming method for various organic layers such as the photoelectric conversion film 113 include a dry film forming method and a wet film forming method.

Examples of the dry film forming method include a vacuum deposition method using resistance heating, high frequency heating, or electron beam heating, a flash vapor deposition method, a plasma vapor deposition method, an EB vapor deposition method, various sputtering methods (a bipolar sputtering method, a DC sputtering method, a DC magnetron sputtering method, a high frequency sputtering method, a magnetron sputtering method, an RF-DC coupled bias sputtering method, an ECR sputtering method, an opposed target sputtering method, a high frequency sputtering method, and an ion beam sputtering method), a direct current (DC) method, an RF method, a multi-cathode method, an activation reaction method, an electric field deposition method, various ion plating methods such as a high-frequency ion plating method and a reactive ion plating method, a laser ablation method, a molecular beam epitaxy method, a laser transfer method, and a molecular beam epitaxy method (MBE method).

In addition, examples of the CVD method include a plasma CVD method, a thermal CVD method, a MOCVD method, and an optical CVD method.

On the other hand, specific examples of the wet method include a spin coating method, a dipping method, a casting method, a micro contact printing method, a drop casting method, various printing methods such as a screen printing method, an inkjet printing method, an offset printing method, a gravure printing method, and a flexographic printing method, a stamp method, a spray method, various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calendar coater method, and the like.

Additionally, in a coating method, examples of a solvent include non-polar or low-polar organic solvents such as toluene, chloroform, hexane, and ethanol.

Examples of a patterning method for various organic layers include a shadow mask, laser transfer, chemical etching such as photolithography, physical etching using ultraviolet rays or laser, and the like.

As a flattening technique for various organic layers, a laser flattening method, a reflow method, and the like can be used.

14. Fourteenth Embodiment

Next, a fourteenth embodiment will be described in detail with reference to the accompanying drawings. Meanwhile, in the present embodiment, the same configurations and operations as those in the above-described embodiment will be quoted, and repeated description thereof will be omitted.

In the present embodiment, a manufacturing method for the image sensor 100 exemplified in the third embodiment will be described. FIGS. 49 to 53 are process cross-sectional views showing a manufacturing method according to the fourteenth embodiment. Meanwhile, in the present embodiment, the same manufacturing steps as those in the thirteenth embodiment will be quoted, and repeated description thereof will be omitted. Further, similarly to the thirteenth embodiment, the manufacturing method exemplified in the present embodiment may be a manufacturing method using a wearable CSP technique including bonding the light receiving chip 3121 and the circuit chip 3122 together in a wafer state before performing separation into individual pieces.

In the present manufacturing method, first, the read-out electrode 117 is formed on the front face of the insulating film (a portion of the insulating layer 111) formed on the back face of the semiconductor substrate 101 through the same steps as those described using FIG. 42 in the thirteenth embodiment.

Figure 49:
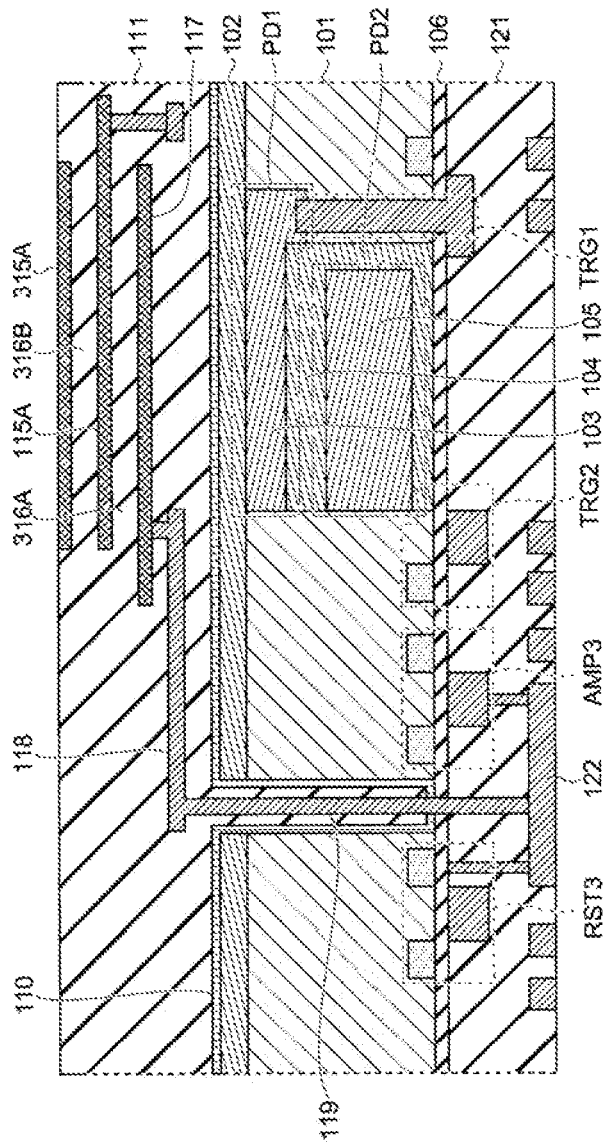
FIG. 49 is a process cross-sectional view showing a method of manufacturing a solid-state imaging device according to a fourteenth embodiment (Part 1).

Next, accumulation of the insulating film 316A (a portion of the insulating layer 111 and a portion of the insulating film 316), flattening of the front face of the insulating film 316A, accumulation of a transparent electrode material film, patterning from the transparent electrode material film to the transparent electrode material film 115A by photolithography and dry etching, accumulation of an insulating film (a portion of the insulating layer 111), flattening of the front face of the insulating film and the front face of the transparent electrode material film 115A, accumulation of the insulating film 316B (a portion of the insulating layer 111 and a portion of the insulating film 316), flattening of the front face of the insulating film 316B, accumulation of a transparent electrode material film, patterning from the transparent electrode material film to the transparent electrode material film 315A by photolithography and dry etching, accumulation of an insulating film (a portion of the insulating layer 111), and flattening of the front face of the insulating film and the front face of the transparent electrode material film 315A are executed in order on the insulating film having the read-out electrode 117 formed therein. Thereby, a cross-sectional structure as shown in FIG. 49 is obtained.

Figure 50:
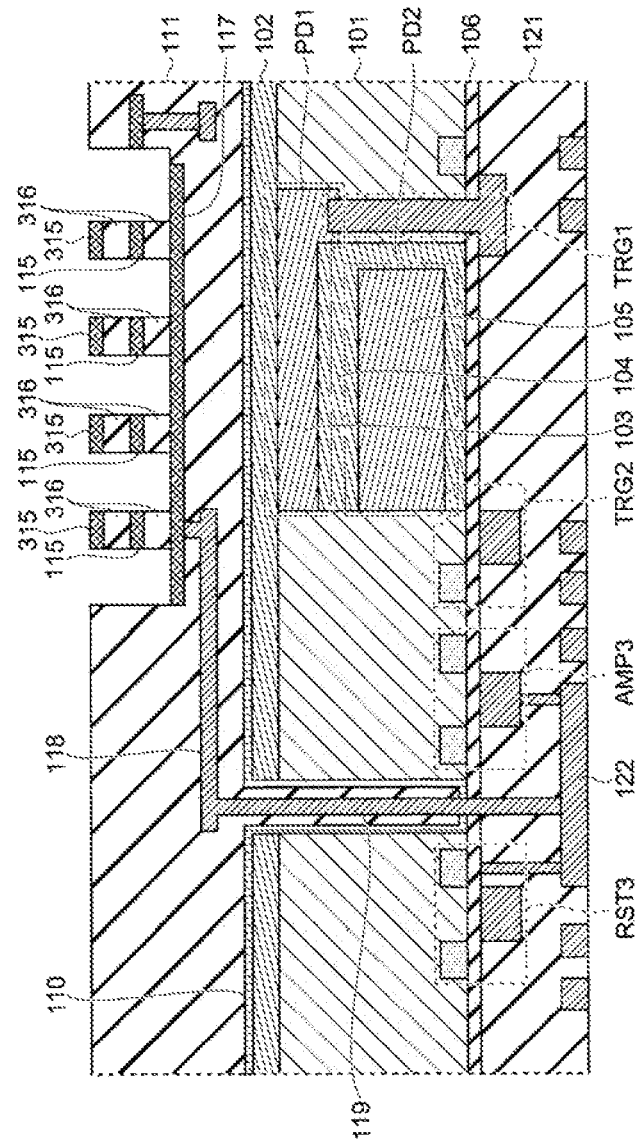
FIG. 50 is a process cross-sectional view showing the method of manufacturing a solid-state imaging device according to the fourteenth embodiment (Part 2).

Next, the transparent electrode material film 315A, the insulating film 316B, the transparent electrode material film 115A, and the insulating film 316A are processed by photolithography and dry etching, and thus an opening region is formed to process the transparent electrode material film 315A into the shield electrode 315 and process the transparent electrode material film 115A into the storage electrode 115 as shown in FIG. 50.

Figure 51:
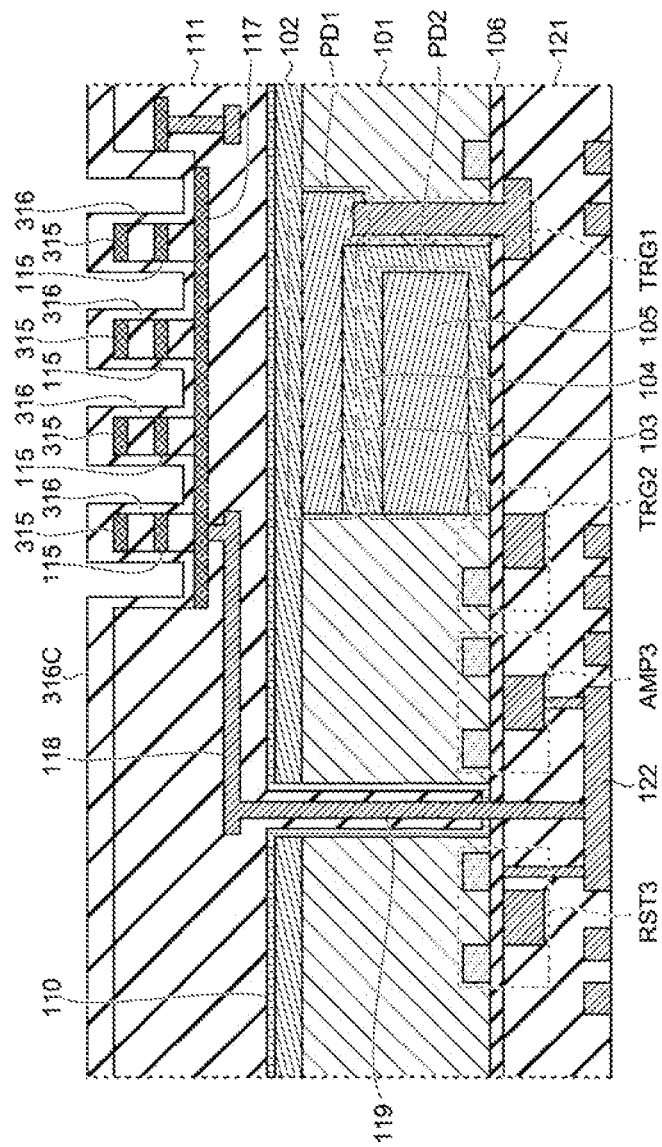
FIG. 51 is a process cross-sectional view showing the method of manufacturing a solid-state imaging device according to the fourteenth embodiment (Part 3).
Figure 52:
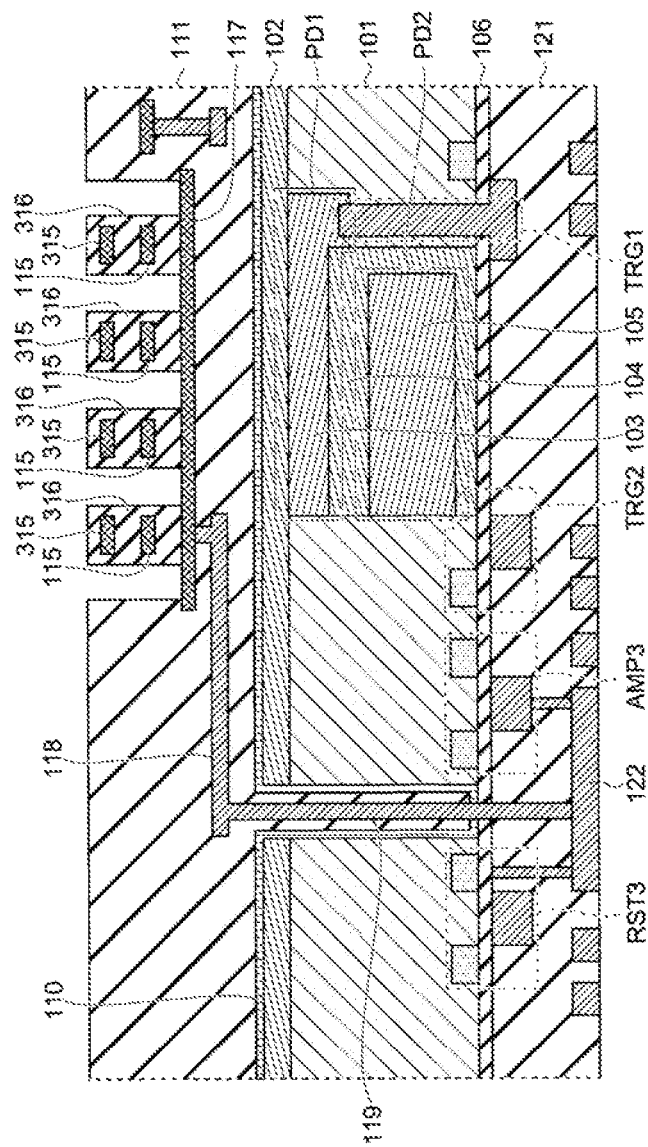
FIG. 52 is a process cross-sectional view showing the method of manufacturing a solid-state imaging device according to the fourteenth embodiment (Part 4).

Next, as shown in FIG. 51, an insulating film C16C covering the front face of the insulating layer 111 at the present point in time is formed. Subsequently, a portion of the insulating film 316C is removed by etching-back or the like to expose the read-out electrode 117 in the opening region and form an insulating film on the side faces of the storage electrode 115 and the shield electrode 315. Thereby, as shown in FIG. 52, the insulating film 316 covering the storage electrode 115 and the shield electrode 315 is formed.

Figure 53:
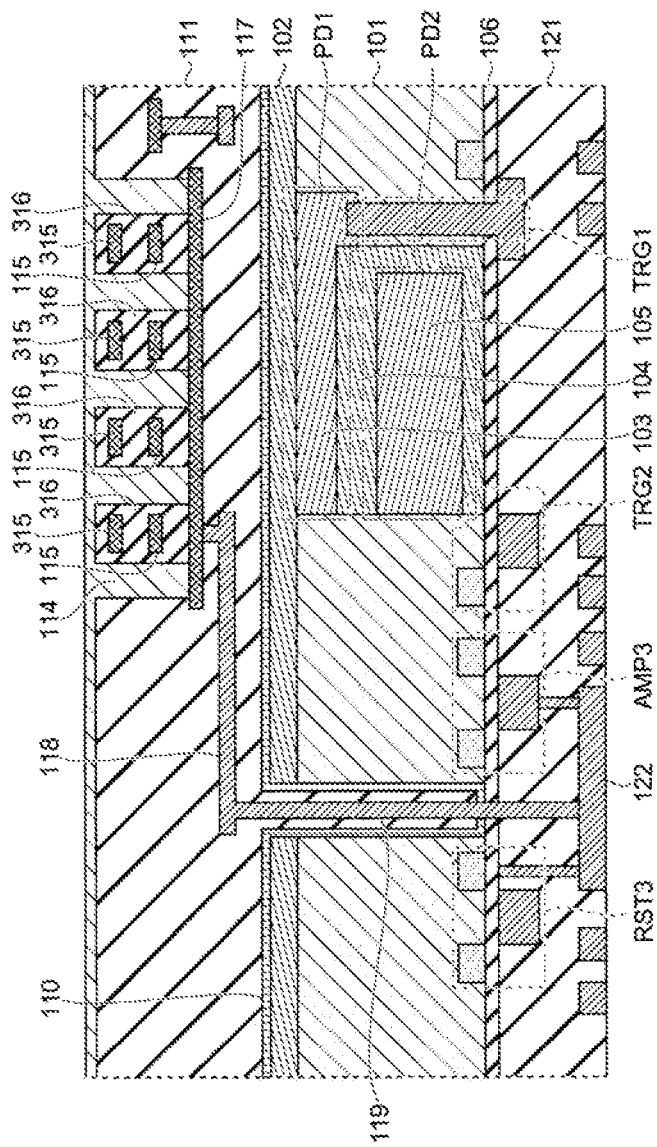
FIG. 53 is a process cross-sectional view showing the method of manufacturing a solid-state imaging device according to the fourteenth embodiment (Part 5).

Next, a semiconductor material is accumulated on a surface on which the storage electrode 115, the shield electrode 315, and the insulating film 316 are formed, and the front face of the formed semiconductor layer is flattened by CMP or the like. Thereby, as shown in FIG. 53, the semiconductor layer 114 is formed in the vicinity of the insulating film 316 that covers the storage electrode 115 and the shield electrode 315.

Thereafter, the same steps as the steps after the steps described using FIG. 48 in the thirteenth embodiment are executed, whereby the image sensor 100 including the cross-sectional structure exemplified in FIG. 21 is manufactured.

15. Fifteenth Embodiment

Next, a fifteenth embodiment will be described in detail with reference to the accompanying drawings. Meanwhile, in the present embodiment, the same configurations and operations as those in the above-described embodiment will be quoted, and repeated description thereof will be omitted.

Figure 54:
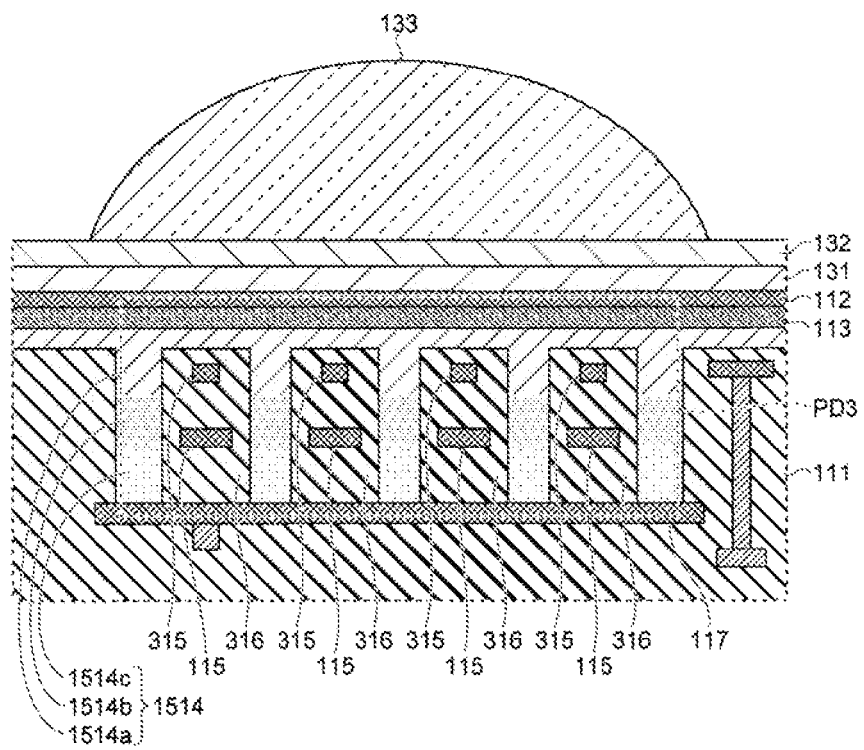
FIG. 54 is a cross-sectional view showing a schematic configuration example of an organic photoelectric conversion element and portions in the vicinity thereof according to a fifteenth embodiment.

FIG. 54 is a cross-sectional view showing a schematic configuration example of an organic photoelectric conversion element and portions in the vicinity thereof according to the fifteenth embodiment. As shown in FIG. 54, an organic photoelectric conversion element PD3 according to the fifteenth embodiment has a structure in which the semiconductor layer 114 is replaced with a semiconductor layer 1514, for example, in the same configuration as that of the organic photoelectric conversion element PD3 described using FIG. 21 and the like in the third embodiment.

For example, the potential of the semiconductor layer 114 in the image sensor 100 exemplified in the third and fourteenth embodiments can be controlled three-dimensionally by controlling a voltage to be applied to each of the common electrode 112, the storage electrode 115, the shield electrode 315, and the read-out electrode 117. In addition, the potentials of the semiconductor layers 114 in other embodiments can also be controlled three-dimensionally by controlling a voltage to be applied to each electrode.

Consequently, in the present embodiment, the material and composition of the semiconductor layer 1514 are changed to have a continuous or multi-layered structure so that charge generated by photoelectric conversion is smoothly transferred to the read-out electrode 117. For example, as shown in FIG. 54, the semiconductor layer 1514 includes a semiconductor layer 1514a which is an uppermost layer formed of a material or composition having the highest potential, a semiconductor layer 1514b which is an intermediate layer formed of a material or composition having the next highest potential, and a semiconductor layer 1514c which is a lowermost layer formed of a material or composition having the lowest potential.

Meanwhile, a continuous or gradual change in potential in the semiconductor layer 1514 can be realized, for example, by using a method of changing film forming conditions and a mixing ratio of materials during film formation of the semiconductor layer 1514, performing PVD using different targets in layers, and spin-coating different materials in layers.

The other configurations, operations, and effects may be the same as those in the above-described embodiment, and thus detailed description thereof will be omitted here.

16. Sixteenth Embodiment

Next, a sixteenth embodiment will be described in detail with reference to the accompanying drawings. Meanwhile, in the present embodiment, the same configurations and operations as those in the above-described embodiment will be quoted, and repeated description thereof will be omitted.

Figure 55:
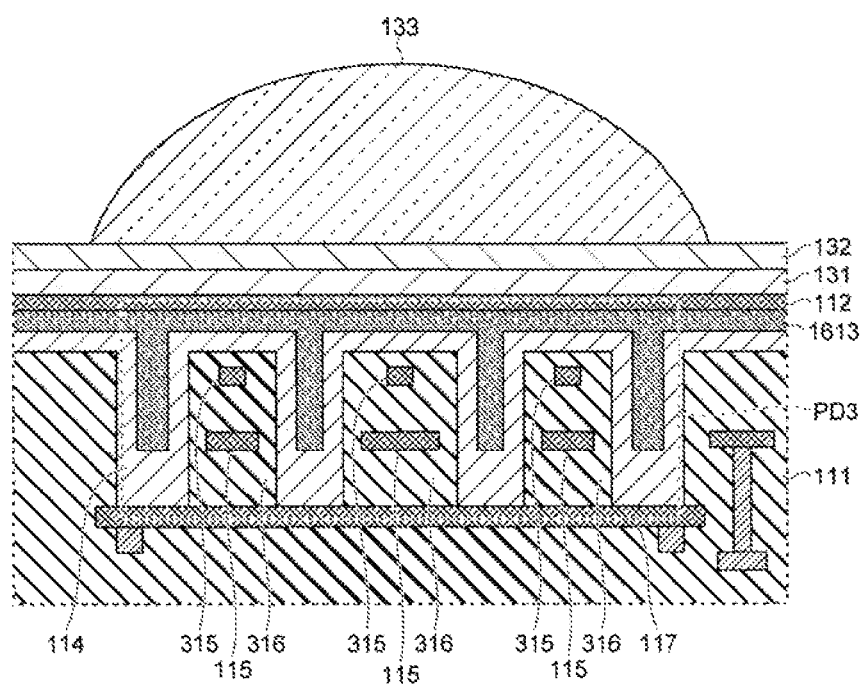
FIG. 55 is a cross-sectional view showing a schematic configuration example of an organic photoelectric conversion element and portions in the vicinity thereof according to a sixteenth embodiment.

FIG. 55 is a cross-sectional view showing a schematic configuration example of an organic photoelectric conversion element and portions in the vicinity thereof according to the sixteenth embodiment. As shown in FIG. 55, an organic photoelectric conversion element PD3 according to the sixteenth embodiment has a structure in which a photoelectric conversion film 113 is replaced with a photoelectric conversion film 1613, for example, in the same configuration as that of the organic photoelectric conversion element PD3 described using FIG. 21 and the like in the third embodiment.

For example, the photoelectric conversion film 1613 has a structure in which a portion thereof protrudes into a semiconductor layer 114 in an opening region of a storage electrode 115. In this manner, at least a portion of the photoelectric conversion film 1613 is made to protrude toward the storage electrode 115, and thus a distance from the protruding portion to a storage region around the storage electrode 115 can be reduced. Thereby, a moving distance to a storage region of charge generated by photoelectric conversion can be reduced, and thus it is possible to further increase the speed of a pixel signal read out from each unit pixel 3110.

In addition, as shown in FIG. 55, a moving distance of charge generated by photoelectric conversion can be minimized by making the photoelectric conversion film 1613 protrude to the side wall side of the storage electrode 115, and thus it is possible to further increase the speed of a pixel signal read out from each of the unit pixels 3110.

Figure 56:
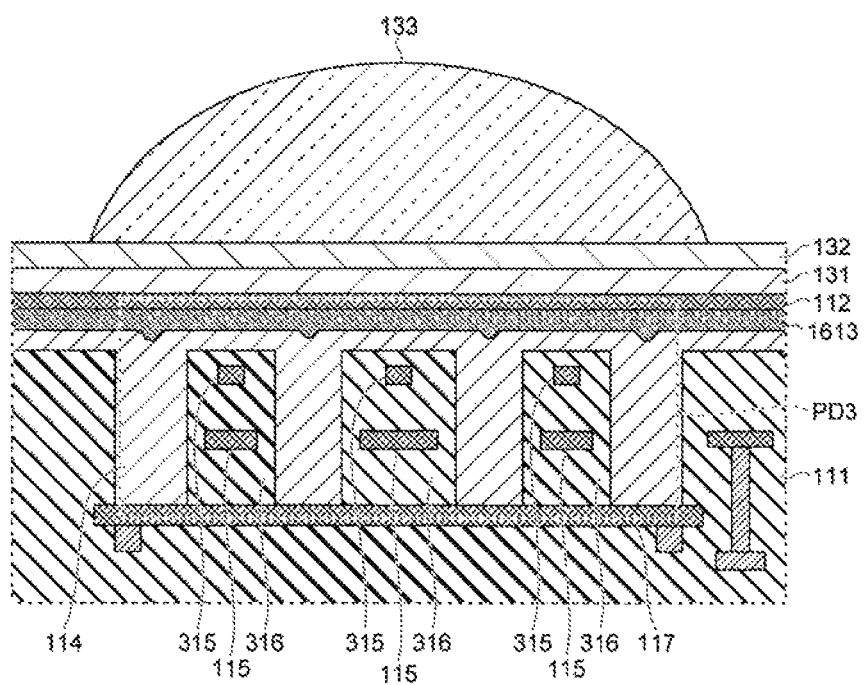
FIG. 56 is a cross-sectional view showing another schematic configuration example of an organic photoelectric conversion element and portions in the vicinity thereof according to the sixteenth embodiment.

However, the photoelectric conversion film 1613 does not need to protrude into the opening region of the storage electrode 115, and for example, as shown in FIG. 56, at least a portion of the photoelectric conversion film is only required to protrude to the storage electrode 115 side.

The other configurations, operations, and effects may be the same as those in the above-described embodiment, and thus detailed description thereof will be omitted here.

16.1 Modification Example

Figure 57:
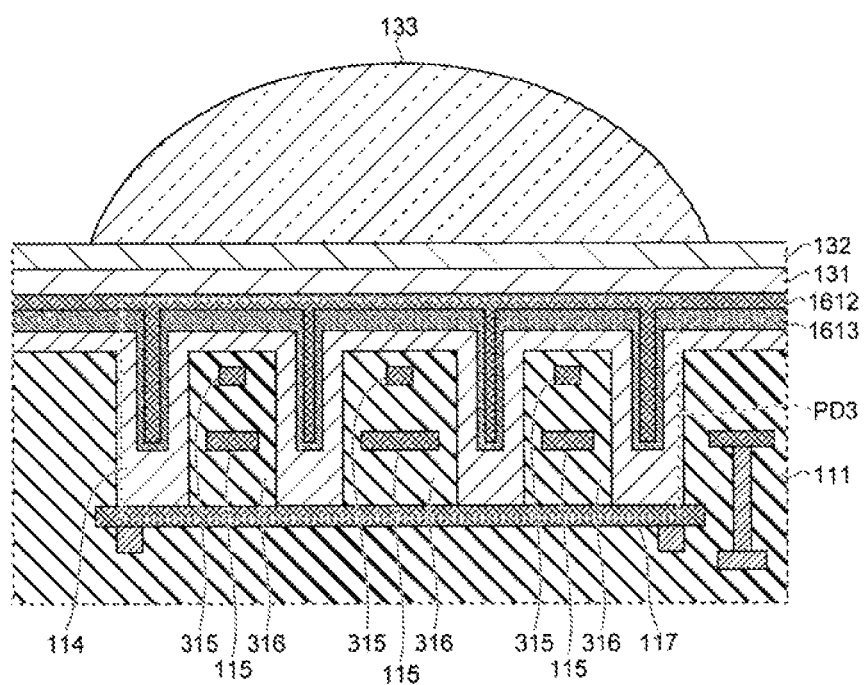
FIG. 57 is a cross-sectional view showing a schematic configuration example of an organic photoelectric conversion element and portions in the vicinity thereof according to a modification example of the sixteenth embodiment.

In addition, as shown in FIG. 57, in addition to the photoelectric conversion film 1613, a portion of a common electrode 1612 may also protrude toward the storage electrode 115. Thereby, it is possible to increase the probability of photoelectric conversion occurring in a protruding portion of the photoelectric conversion film 1613, and thus an average moving distance of charge generated by photoelectric conversion is further reduced. As a result, it is possible to further increase the speed of a pixel signal read out from each of the unit pixels 3110.

17. Seventeenth Embodiment

Next, a seventeenth embodiment will be described in detail with reference to the accompanying drawings. Meanwhile, in the present embodiment, the same configurations and operations as those in the above-described embodiment will be quoted, and repeated description thereof will be omitted.

Figure 58:
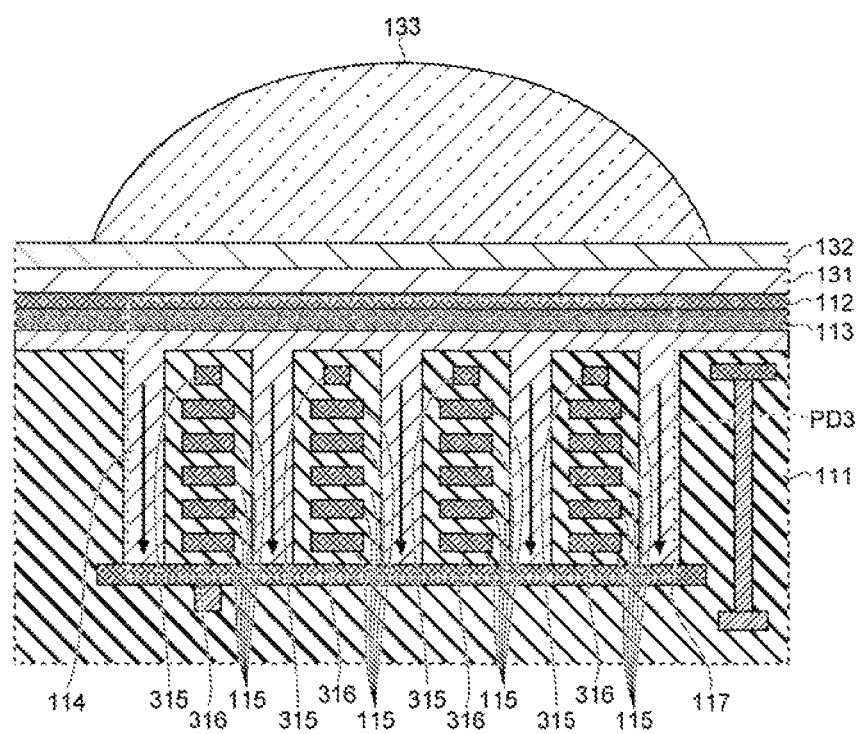
FIG. 58 is a cross-sectional view showing a schematic configuration example of an organic photoelectric conversion element and portions in the vicinity thereof according to a seventeenth embodiment.

FIG. 58 is a cross-sectional view showing a schematic configuration example of an organic photoelectric conversion element and portions in the vicinity thereof according to the seventeenth embodiment. As shown in FIG. 58, an organic photoelectric conversion element PD3 according to the seventeenth embodiment has a structure in which a plurality of storage electrodes (fifth electrodes) 115 are disposed in multiple stages in a substrate thickness direction, for example, in the same configuration as that of the organic photoelectric conversion element PD3 described using FIG. 21 and the like in the third embodiment.

According to such a structure, the potential of the semiconductor layer 114 in an opening region of the storage electrode 115 can be efficiently modulated along a charge transfer path, and thus storage charge 120 can be smoothly transferred in a substrate thickness direction, for example, as in a case where a transfer direction of a charge coupling device (CCD) is set to be the substrate thickness direction. Thereby, for example, even when a transfer distance of charge generated by photoelectric conversion is increased, it is possible to increase the read-out speed by smooth transfer of the stored charge 120.

The other configurations, operations, and effects may be the same as those in the above-described embodiment, and thus detailed description thereof will be omitted here.

18. Eighteenth Embodiment

Next, an eighteenth embodiment will be described in detail with reference to the accompanying drawings. Meanwhile, in the present embodiment, the same configurations and operations as those in the above-described embodiment will be quoted, and repeated description thereof will be omitted.

Figure 59:
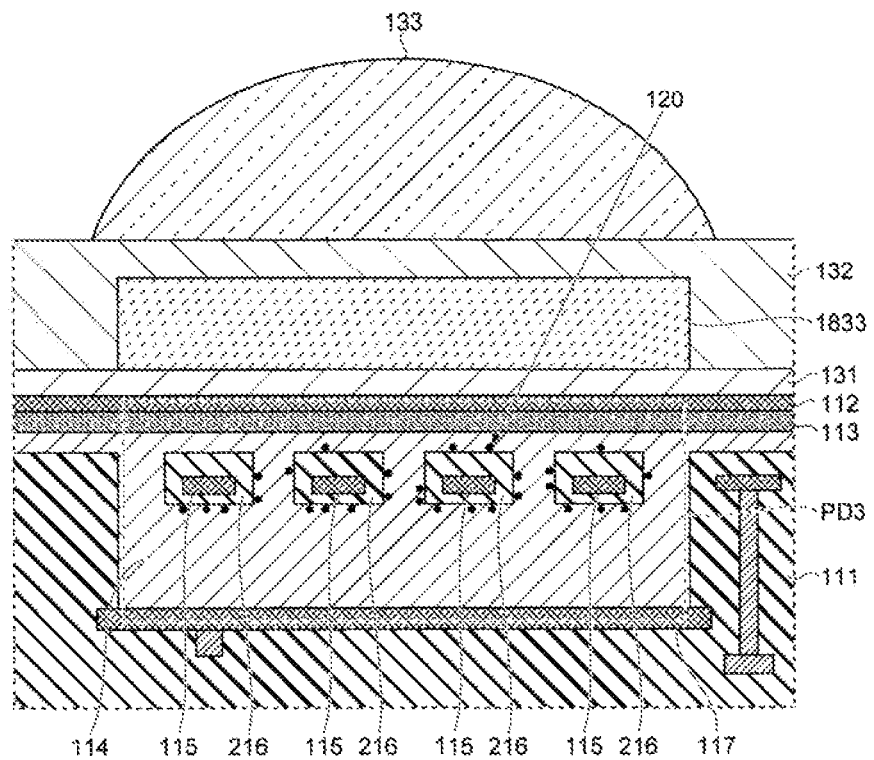
FIG. 59 is a cross-sectional view showing a schematic configuration example of an organic photoelectric conversion element and portions in the vicinity thereof according to an eighteenth embodiment.

FIG. 59 is a cross-sectional view showing a schematic configuration example of an organic photoelectric conversion element and portions in the vicinity thereof according to the eighteenth embodiment. As shown in FIG. 59, an image sensor 100 according to the eighteenth embodiment has a structure in which a color filter 1833 is disposed in a flattening film 132 between an on-chip lens 133 and an organic photoelectric conversion element PD3, for example, in the same configuration as that of the image sensor 100 described using FIG. 18 and the like in the second embodiment.

In this manner, the present disclosure is not limited to the second embodiment, and in the above-described embodiment, the color filter 1833 is combined with the vertically laminated organic photoelectric conversion element PD3 and photo diodes PD1 and PD2 to further improve spectral characteristics of a unit pixel 3110, whereby it is possible to improve image quality.

Figure 60:
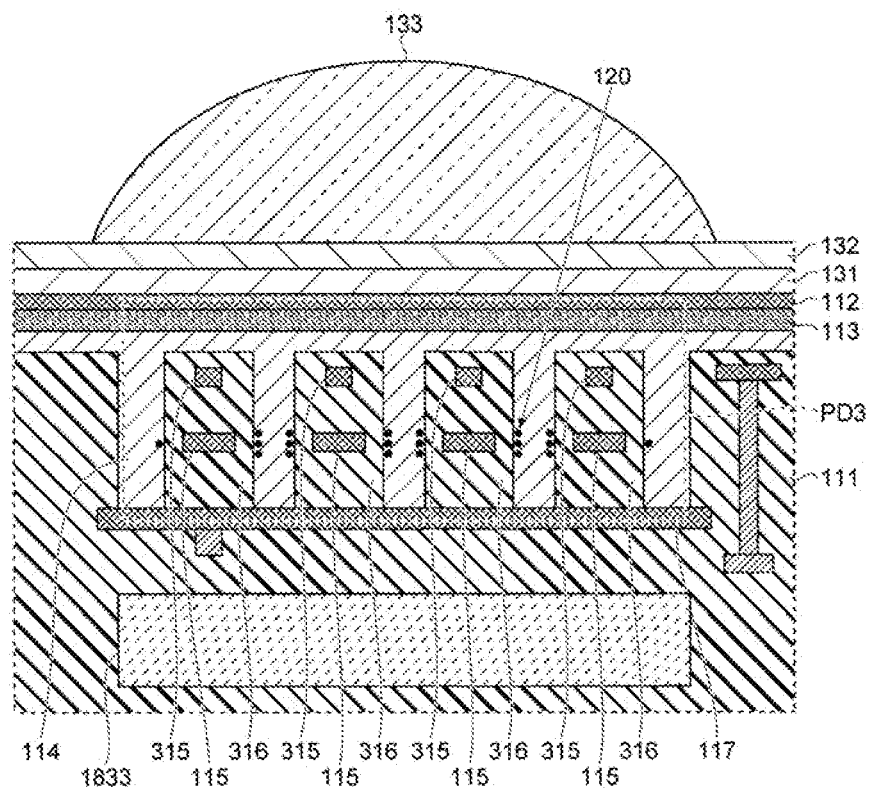
FIG. 60 is a cross-sectional view showing a schematic configuration example of an organic photoelectric conversion element and portions in the vicinity thereof according to a modification example of the eighteenth embodiment.

Meanwhile, the color filter 1833 may be disposed on a light incident side (hereinafter referred to as an upstream side) with respect to a structure in which the organic photoelectric conversion element PD3 and the photo diodes PD1 and PD2 are vertically laminated as shown in FIG. 59, and the color filter 1833 may be disposed, for example, in an insulating layer 111 on a downstream side with respect to the a structure in which the organic photoelectric conversion element PD3 and the photo diodes PD1 and PD2 are vertically laminated as shown in FIG. 60.

In addition, the color filter in the present description may be, for example, a filter including a transmission spectrum that transmits light of a specific wavelength band. Further, as the color filter 1833, various color filters such as a color filter using an organic material, a color filter using plasmon resonance with a patterned metal thin film, and a color filter using Fabry-Perot interference with a dielectric laminated film can be used.

The other configurations, operations, and effects may be the same as those in the above-described embodiment, and thus detailed description thereof will be omitted here.

19. Nineteenth Embodiment

Next, a nineteenth embodiment will be described in detail with reference to the accompanying drawings. Meanwhile, in the present embodiment, the same configurations and operations as those in the above-described embodiment will be quoted, and repeated description thereof will be omitted.

Figure 61:
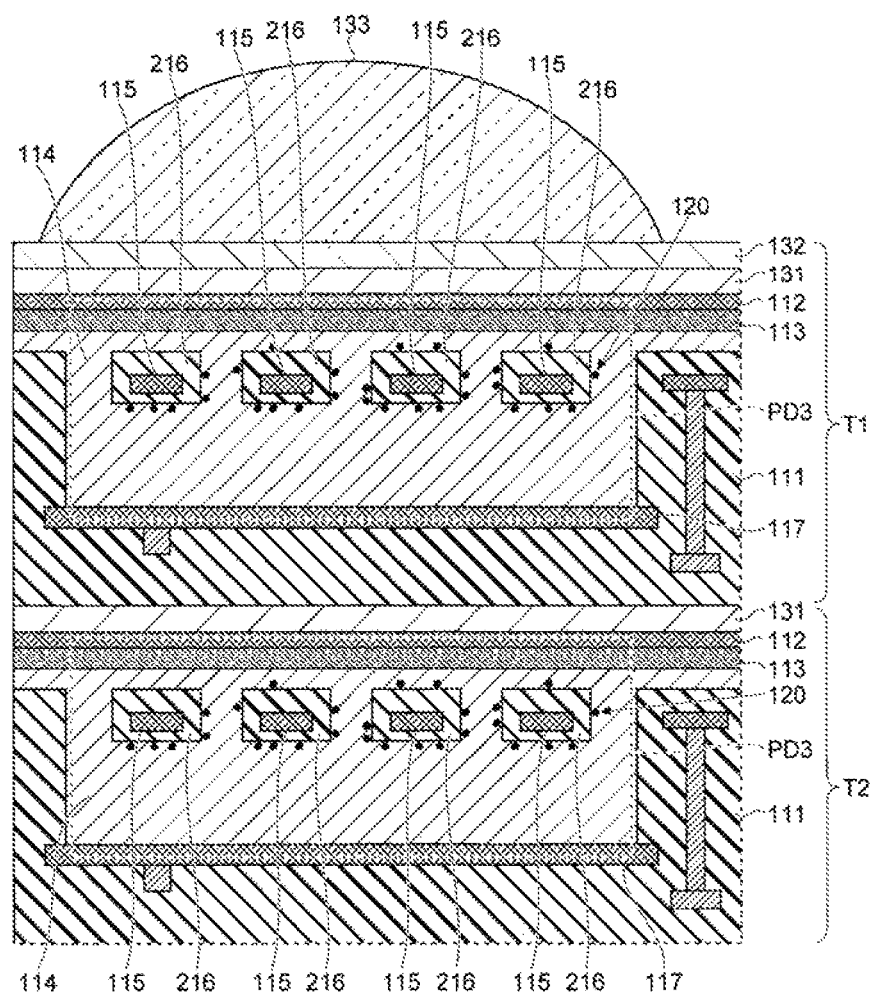
FIG. 61 is a cross-sectional view showing a schematic configuration example of an organic photoelectric conversion element and portions in the vicinity thereof according to a nineteenth embodiment.

FIG. 61 is a cross-sectional view showing a schematic configuration example of an organic photoelectric conversion element and portions in the vicinity thereof according to the nineteenth embodiment. As shown in FIG. 61, an image sensor 100 according to the nineteenth embodiment has a structure in which layered structures T1 and T2 each including an insulating layer 111, including an organic photoelectric conversion element PD3, to a flattening film 132 are vertically laminated in two or more layers, for example, in the same configuration as that of the image sensor 100 described using FIG. 18 and the like in the second embodiment.

Meanwhile, two or more organic photoelectric conversion elements PD3 fabricated in this manner may be connected to, for example, the same read circuit (see FIG. 6) in parallel.

In this manner, it is possible to improve spectral characteristics of a unit pixel 3110 by vertically laminating the organic photoelectric conversion elements PD3 along an incidence axis of light.

The other configurations, operations, and effects may be the same as those in the above-described embodiment, and thus detailed description thereof will be omitted here.

20. Twentieth Embodiment

Next, a twentieth embodiment will be described in detail with reference to the accompanying drawings. Meanwhile, in the present embodiment, the same configurations and operations as those in the above-described embodiment will be quoted, and repeated description thereof will be omitted.

For example, as in the third embodiment mentioned above, in a structure in which a read-out electrode 117 side in a semiconductor layer 114 is divided into a plurality of convex portions by an insulating film 316, each of the convex portions can also be made to function as one organic photoelectric conversion element. Consequently, in the twentieth embodiment, an example of a case where each of the convex portions in the semiconductor layer 114 is configured as an individual organic photoelectric conversion element will be described.

Figure 62:
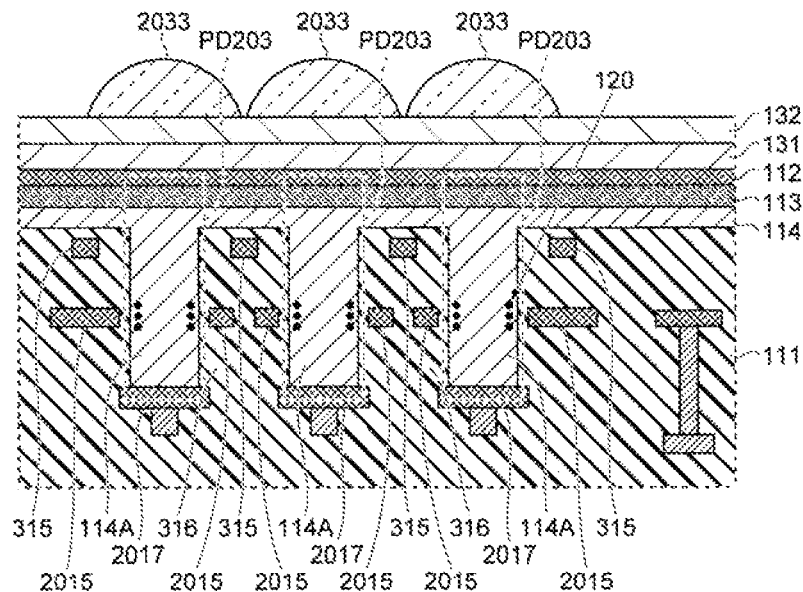
FIG. 62 is a cross-sectional view showing a schematic configuration example of an organic photoelectric conversion element and portions in the vicinity thereof according to a twentieth embodiment.
Figure 63:
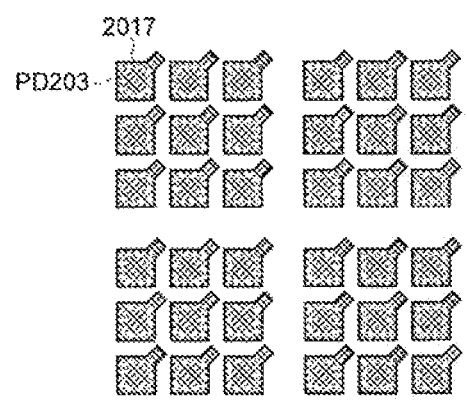
FIG. 63 is a plan view showing an example of a planar layout of a read-out electrode according to the twentieth embodiment.

FIG. 62 is a cross-sectional view showing a schematic configuration example of an organic photoelectric conversion element and portions in the vicinity thereof according to the twentieth embodiment. FIG. 63 is a plan view showing an example of a planar layout of a read-out electrode according to the twentieth embodiment.

As shown in FIG. 62, in the twentieth embodiment, an organic photoelectric conversion element PD203 is formed in each of convex portions 114A divided by the insulating film 316 in the semiconductor layer 114. That is, in the present embodiment, as shown in FIGS. 62 and 63, for example, the organic photoelectric conversion element PD3 according to the third embodiment is divided into nine organic photoelectric conversion elements PD203 that are arrayed in a 3×3 matrix. Meanwhile, the number of separate organic photoelectric conversion elements PD3 is not limited to nine exemplified, and may be two or more.

Consequently, in the present embodiment, the storage electrode 115 and the read-out electrode 117 in the third embodiment are replaced with a storage electrode 2015 and a read-out electrode 2017 of each of the organic photoelectric conversion elements PD203, for example, in the same structure as the structure described using FIG. 21 and the like in the third embodiment. Further, in the present embodiment, the on-chip lens 133 in the third embodiment is replaced with an on-chip lens 2033 of each of the organic photoelectric conversion elements PD203.

As shown in FIG. 63, the read-out electrode 2017 is individually provided for each of the organic photoelectric conversion elements PD203. In the present embodiment, the read circuit shown in FIG. 6 is connected to, for example, the read-out electrodes 2017. In this case, a charge read-out operation for the organic photoelectric conversion elements PD203 is individually executed through the read-out electrodes 2017.

In this manner, in the present embodiment, an individual organic photoelectric conversion element PD203 is formed for each of the convex portions 114A of the semiconductor layer 114. Thereby, for example, it is possible to miniaturize pixels at a level that cannot be reached by the accuracy of a process in a case where silicon in the related art is used as a material. As a result, it is possible to significantly increase the number of unit pixels 3110 per unit area, that is, pixel density (also referred to as resolution).

Meanwhile, in the present embodiment, the case based on the third embodiment mentioned above has been exemplified. However, the present disclosure is not limited thereto, and the present embodiment can be similarly applied to cases based on other embodiments.

Further, in the above-described configuration, a case where one organic photoelectric conversion element PD203 is constituted by one convex portion 114A has been exemplified. However, the present disclosure is not limited thereto, and one organic photoelectric conversion element PD203 can also be constituted by two or more convex portions 114A. For example, one of nine separate organic photoelectric conversion elements PD203 may constitute a unit pixel 3110 for a high dynamic range (HDR), and the other eight organic photoelectric conversion elements PD203 may constitute a unit pixel 3110 for a low dynamic range (LDR). In such a case, the storage electrode 2015 and the read-out electrode 2017 for two or more convex portions 114A constituting the same organic photoelectric conversion element PD203 may not be divided.

Further, the on-chip lens 2033 does not need to be provided for each organic photoelectric conversion element PD203 on a one-to-one basis, and one on-chip lens 2033 may be provided for a plurality of organic photoelectric conversion elements PD203.

The other configurations, operations, and effects may be the same as those in the above-described embodiment, and thus detailed description thereof will be omitted here.

20.1 Modification Example 1

In the twentieth embodiment mentioned above, a case where the storage electrode 2015 is individually provided for each organic photoelectric conversion element PD203 has been exemplified. However, the present disclosure is not limited thereto, and for example, as shown in FIG. 63, a common storage electrode 2015 may be provided for each of the plurality or all of the organic photoelectric conversion elements PD203.

20.2 Modification Example 2

Figure 64:
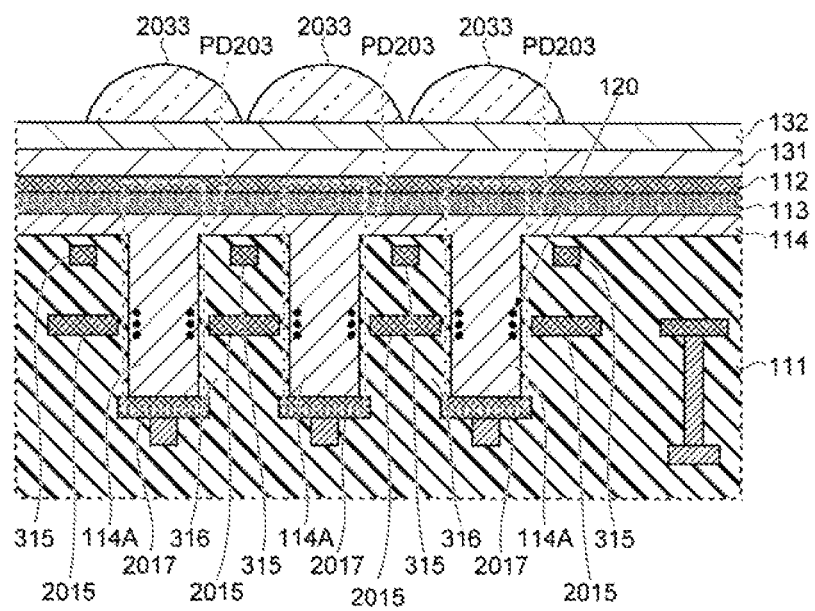
FIG. 64 is a cross-sectional view showing a schematic configuration example of an organic photoelectric conversion element and portions in the vicinity thereof according to modification example 1 of the twentieth embodiment.
Figure 65:
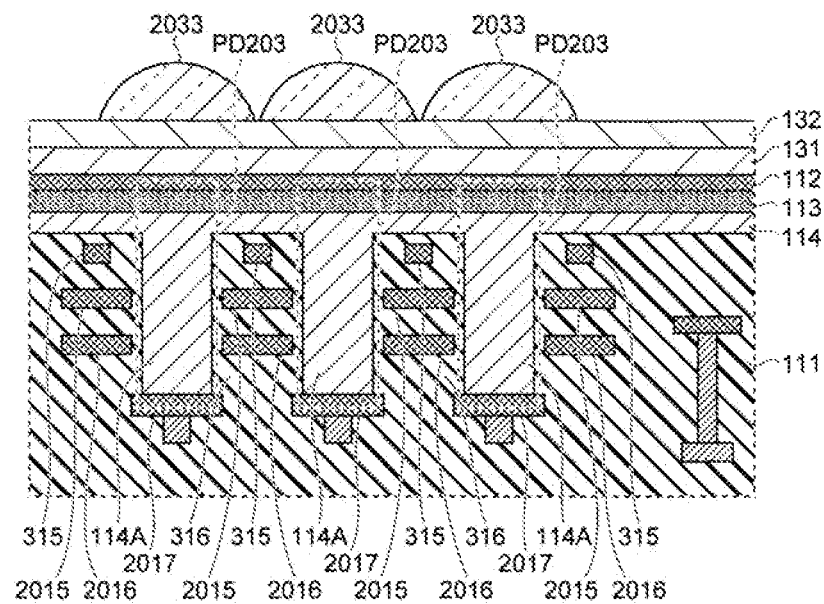
FIG. 65 is a cross-sectional view showing a schematic configuration example of an organic photoelectric conversion element and portions in the vicinity thereof according to modification example 2 of the twentieth embodiment.

In addition, for example, as shown in FIG. 64, it is also possible to adopt a configuration in which a memory electrode 2016 is provided at a stage after the storage electrode 2015 (the read-out electrode 2014 side), and stored charge 120 stored in the vicinity of the storage electrode 2015 is temporarily held around the memory electrode 2016.

21. Application Example 1

The technique according to the present disclosure can be applied to various products. For example, the technique according to the present disclosure may be applied to an endoscopic surgery system.

Figure 66:
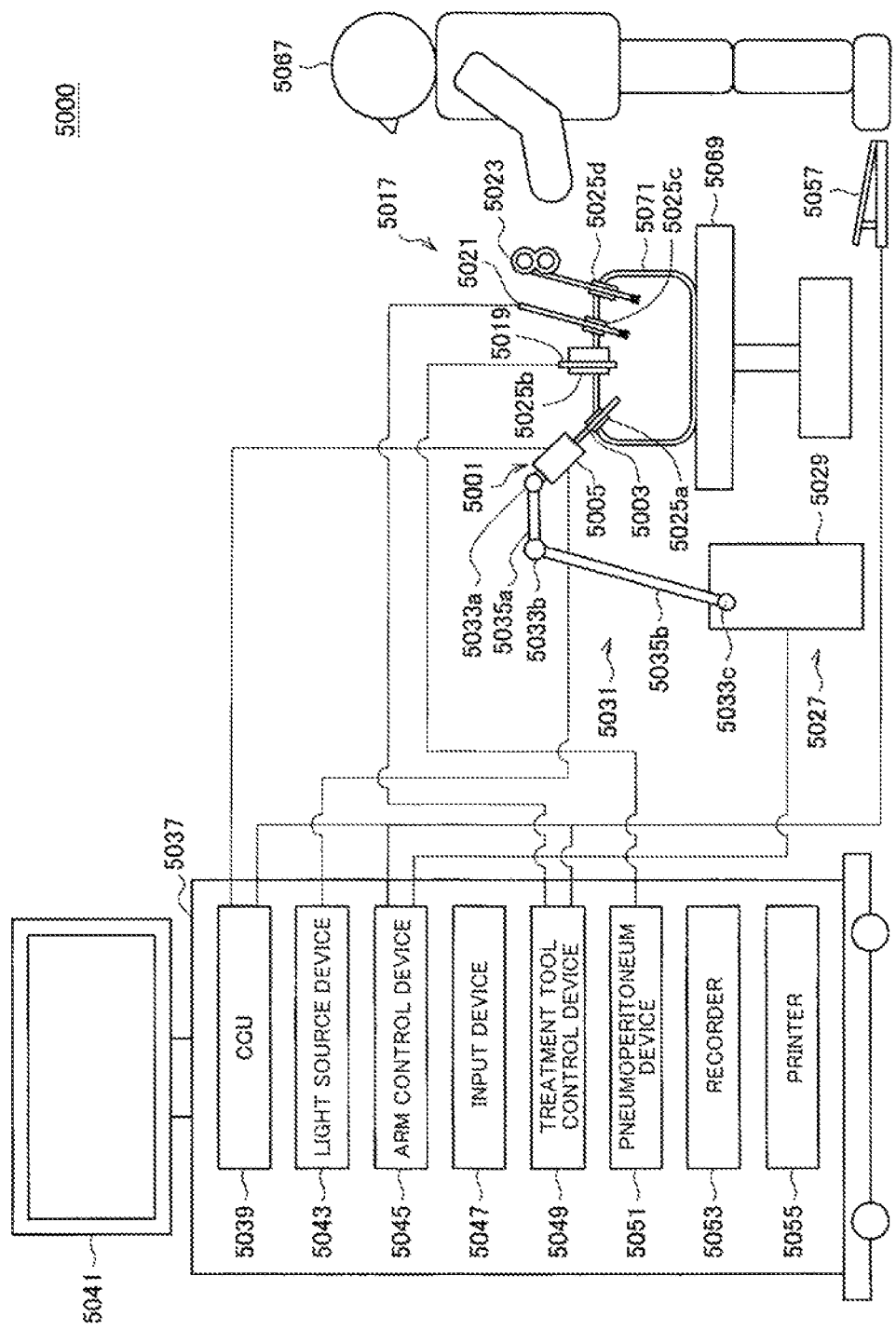
FIG. 66 is a block diagram showing an example of a schematic configuration of a vehicle control system.

FIG. 66 is a diagram showing an example of a schematic configuration of an endoscopic surgery system 5000 to which the technique according to the present disclosure is applicable. FIG. 66 shows a state where a surgeon (doctor) 5067 is performing a surgical operation on a patient 5071 on a patient bed 5069 by using the endoscopic surgery system 5000. As shown in the drawing, the endoscopic surgery system 5000 includes an endoscope 5001, other surgical instruments 5017, a supporting arm device 5027 that supports the endoscope 5001, and a cart 5037 on which various devices for an endoscopic surgical operation are mounted.

In an endoscopic surgery, a plurality of tubular laparotomy devices called trocars 5025a to 5025d are punctured into the abdominal wall, instead of cutting and opening the abdominal wall. Then, a lens-barrel 5003 of the endoscope 5001 and the other surgical instruments 5017 are inserted into the body cavity of the patient 5071 from the trocars 5025a to 5025d. In the example shown in the drawing, a pneumoperitoneum tube 5019, an energy treatment tool 5021, and a forceps 5023 are inserted into the body cavity of the patient 5071 as the other surgical instruments 5017. In addition, the energy treatment tool 5021 is a treatment tool for performing cutting and peeling of tissue, sealing of blood vessels, or the like by using a high-frequency current or ultrasonic vibration. However, the surgical instrument 5017 shown in the drawing is merely an example, and various surgical instruments that are generally used in endoscopic surgical operations, such as tweezers and a retractor, may be used as the surgical instruments 5017.

An image of a surgical part within the body cavity of the patient 5071 imaged by the endoscope 5001 is displayed on a display device 5041. The surgeon 5067 performs treatment such as cutting-out of an affected part, using the energy treatment tool 5021 or the forceps 5023 while viewing the image of the surgical part displayed on the display device 5041 in real time. Meanwhile, although not shown in the drawing, the pneumoperitoneum tube 5019, the energy treatment tool 5021, and the forceps 5023 are supported by the surgeon 5067, an assistant, or the like during a surgical operation.

(Supporting Arm Device)

The supporting arm device 5027 includes an arm portion 5031 extending from a base portion 5029. In the example shown in the drawing, the arm portion 5031 includes joint portions 5033a, 5033b, and 5033c and links 5035a and 5035b, and is driven under the control of an arm control device 5045. The endoscope 5001 is supported by the arm portion 5031, and the position and posture thereof are controlled. Thereby, fixation of the stable position of the endoscope 5001 can be realized.

(Endoscope)

The endoscope 5001 includes the lens-barrel 5003 configured such that a region having a predetermined length from a tip end thereof is inserted into the body cavity of the patient 5071, and a camera head 5005 connected to a base end of the lens-barrel 5003. In the example shown in the drawing, the endoscope 5001 configured as a so-called hard mirror including a hard lens-barrel 5003 is shown, but the endoscope 5001 may be configured as a so-called soft mirror including a soft lens-barrel 5003.

The tip end of the lens-barrel 5003 is provided with an opening portion into which an object lens is fitted. A light source device 5043 is connected to the endoscope 5001, and light generated by the light source device 5043 is guided to the tip end of the lens-barrel by a light guide extending into the lens-barrel 5003 and is emitted toward an object to be observed within the body cavity of the patient 5071 through the object lens. Meanwhile, the endoscope 5001 may be a direct-view mirror, a perspective-view mirror, or a side-view mirror.

An optical system and an imaging element are provided inside the camera head 5005, and light (observation light) reflected from an object to be observed is collected in the imaging element by the optical system. The observation light is subjected to photoelectric conversion by the imaging element, and an electrical signal corresponding to the observation light, that is, an image signal corresponding to an observation image is generated. The image signal is transmitted to a camera control unit (CCU) 5039 as RAW data. Meanwhile, the camera head 5005 is equipped with a function of adjusting magnification and a focal length by appropriately driving the optical system.

Meanwhile, for example, in order to cope with stereoscopic vision (3D display) and the like, the camera head 5005 may be provided with a plurality of imaging elements. In this case, a plurality of relay optical systems are provided inside the lens-barrel 5003 in order to guide observation light to each of the plurality of imaging elements.

(Various Devices Mounted on Cart)

The CCU 5039 is constituted by a central processing unit (CPU), a graphics processing unit (GPU), or the like and controls the overall operation of the endoscope 5001 and the display device 5041. Specifically, the CCU 5039 performs various image processing for displaying an image based on an image signal received from the camera head 5005, such as development processing (demosaic processing), on the image signal. The CCU 5039 provides the image signal having been subjected to the image processing to the display device 5041. In addition, the CCU 5039 transmits a control signal to the camera head 5005 and controls the driving thereof. The control signal may include information on imaging conditions such as magnification and a focal distance.

The display device 5041 displays an image based on an image signal having been subjected to image processing by the CCU 5039 under the control of the CCU 5039. In a case where the endoscope 5001 is an endoscope dealing with high-resolution imaging such as 4K (the number of horizontal pixels 3840×the number of vertical pixels 2160) or 8K (the number of horizontal pixels 7680×the number of vertical pixels 4320) and/or is an endoscope dealing with 3D display, a display device capable of performing high-resolution display and/or 3D display may be used for the respective endoscopes as the display device 5041. In a case where the endoscope 5001 is an endoscope dealing with high-resolution imaging such as 4K or 8K, a further immersive feeling can be obtained by using a display device having a size of 55 inches or more as the display device 5041. In addition, a plurality of display devices 5041 having different resolutions and sizes may be provided depending on the application thereof.

The light source device 5043 is constituted by a light source such as a light emitting diode (LED) and supplies irradiation light used to image a surgical part to the endoscope 5001.

The arm control device 5045 is constituted by a processor such as a CPU and operates in accordance with a predetermined program to control the driving of the arm portion 5031 of the supporting arm device 5027 in accordance with a predetermined control method.

The input device 5047 is an input interface for the endoscopic surgery system 5000. A user can input various information and can input an instruction to the endoscopic surgery system 5000 through the input device 5047. For example, the user inputs various information on a surgical operation, such as body information of a patient and information on surgical procedures, through the input device 5047. In addition, for example, the user inputs an instruction for driving the arm portion 5031, an instruction for changing imaging conditions (the type of irradiation light, magnification, a focal distance, and the like) of the endoscope 5001, an instruction for driving the energy treatment tool 5021, or the like through the input device 5047.

The type of input device 5047 is not limited, and the input device 5047 may be various known input devices. As the input device 5047, for example, a mouse, a keyboard, a touch panel, a switch, a foot switch 5057, a lever, and/or the like can be applied. In a case where a touch panel is used as the input device 5047, the touch panel may be provided on a display surface of the display device 5041.

Alternatively, the input device 5047 is a device worn on a user, such as a spectacle type wearable device or a head mounted display (HMD), and various inputs are performed on the input device in accordance with the user's gesture or gaze detected by these devices. In addition, the input device 5047 includes a camera capable of detecting the movement of the user, and various inputs are performed on the input device in accordance with a user's gesture or gaze detected from a video captured by the camera. Further, the input device 5047 includes a microphone capable of collecting a user's sound, and various inputs are performed on the input device by sound through the microphone. In this manner, the input device 5047 is configured to receive inputs of various information in a non-contact manner, and thus a user who particularly belongs to a clean area (for example, the surgeon 5067) can operate a device belonging to an unclean area in a non-contact manner. In addition, since the user can operate the device without taking his or her hand off a surgical instrument that he or she has, the user's convenience is improved.

The treatment tool control device 5049 controls the driving of the energy treatment tool 5021 for performing cauterization and incision of tissue, sealing of blood vessels, or the like. A pneumoperitoneum device 5051 sends a gas into the body cavity of the patient 5071 through a pneumoperitoneum tube 5019 in order to inflate the body cavity for the purpose of securing the field of view due to the endoscope 5001 and securing a work space for a surgeon. A recorder 5053 is a device capable of recording various information on a surgical operation. A printer 5055 is a device capable of printing various information on a surgical operation in various formats such as text, an image, or a graph.

Hereinafter, particularly characteristic configurations in the endoscopic surgery system 5000 will be described in more detail.

(Supporting Arm Device)

The supporting arm device 5027 includes the base portion 5029 which is a base, and the arm portion 5031 extending from the base portion 5029. In the example shown in the drawing, the arm portion 5031 includes the plurality of joint portions 5033*a*, 5033*b*, and 5033*c* and the plurality of links 5035*a* and 5035*b* connected to each other by the joint portion 5033*b*, but the configuration of the arm portion 5031 is simply shown in FIG. 66 for the purpose of simplification. Actually, the shapes, number, and arrangement of the joint portions 5033*a* to 5033*c* and the links 5035*a* and 5035*b*, the directions of rotation axes of the joint portions 5033*a* to 5033*c*, and the like can be appropriately set so that the arm portion 5031 has a desired degree of freedom. For example, the arm portion 5031 can be configured to preferably have a degree of freedom of 6 or more degrees of freedom. Thereby, the endoscope 5001 can be freely moved within a movable range of the arm portion 5031, and thus it is possible to insert the lens-barrel 5003 of the endoscope 5001 into the body cavity of the patient 5071 from a desired direction.

The joint portions 5033*a* to 5033*c* are provided with an actuator, and the joint portions 5033*a* to 5033*c* are configured to be rotatable around a predetermined rotation axis by the driving of the actuator. The driving of the actuator is controlled by the arm control device 5045, whereby a rotation angle of each of the joint portions 5033*a* to 5033*c* is controlled, and the driving of the arm portion 5031 is controlled. Thereby, the control of the position and posture of the endoscope 5001 can be realized. At this time, the arm control device 5045 can control the driving of the arm portion 5031 by various known control methods such as force control or position control.

For example, the surgeon 5067 appropriately performs an operation input through the input device 5047 (including the foot switch 5057), whereby the driving of the arm portion 5031 may be appropriately controlled by the arm control device 5045 in response to the operation input, and the position and posture of the endoscope 5001 may be controlled. By the control, the endoscope 5001 which is a tip end of the arm portion 5031 can be moved from any position to any position and then fixedly supported at a position after the movement. Meanwhile, the arm portion 5031 may be operated by a so-called master slave method. In this case, the arm portion 5031 can be remotely operated by a user through the input device 5047 installed at a location separated from a surgical operation room.

Further, in a case where force control is applied, the arm control device 5045 may perform so-called power assist control for receiving an external force from a user and driving the actuators of the joint portions 5033a to 5033c so that the arm portion 5031 moves smoothly according to the external force. Thereby, when the user moves the arm portion 5031 while directly touching the arm portion 5031, the user can move the arm portion 5031 with a relatively small force. Thus, it is possible to more intuitively move the endoscope 5001 with a simpler operation and improve the convenience of the user.

Here, in general, in an endoscopic surgical operation, the endoscope 5001 is supported by a doctor called a scopist. On the other hand, the position of the endoscope 5001 can be fixed more reliably without depending on manpower by using the supporting arm device 5027, and thus it is possible to stably obtain an image of a surgical part and smoothly perform a surgical operation.

Meanwhile, the arm control device 5045 may not be necessarily provided in the cart 5037. In addition, the arm control device 5045 may not necessarily be one device. For example, the arm control device 5045 may be provided in each of the joint portions 5033a to 5033c of the arm portion 5031 of the supporting arm device 5027, and the driving control of the arm portion 5031 may be realized by a plurality of arm control devices 5045 cooperating with each other.

(Light Source Device)

The light source device 5043 supplies irradiation light at the time of imaging a surgical part to the endoscope 5001. The light source device 5043 is constituted by, for example, an LED, a laser light source, or a white light source constituted by a combination thereof. At this time, in a case where a white light source is constituted by a combination of RGB laser light sources, the intensity and timing of output of each color (each wavelength) can be controlled with high accuracy, and thus it is possible to adjust white balance of a captured image in the light source device 5043. Further, in this case, an object to be observed is irradiated with a laser beam emitted from each of the RGB laser light sources in a time-division manner, and the driving of an imaging element of the camera head 5005 is controlled in synchronization with an irradiation timing thereof, whereby it is also possible to capture images corresponding to RGB in a time-division manner. According to the method, it is possible to obtain a color image without providing a color filter in the imaging element.

In addition, the driving of the light source device 5043 may be controlled so as to change the intensity of output light at predetermined time intervals. The driving of the imaging element of the camera head 5005 is controlled in synchronization of a timing of the change of the light intensity to acquire images in a time-division manner, and the images are composed, whereby it is possible to generate an image having a high dynamic range without so-called blackout and overexposure.

In addition, the light source device 5043 may be configured to be able to supply light of a predetermined wavelength band corresponding to special light observation. In the special light observation, for example, so-called narrow band imaging for imaging predetermined tissue such as blood vessels in the surface of the mucosa with high contrast by emitting light of a narrow band as compared with irradiation light at the time of normal observation (that is, white light) by using wavelength dependency of light absorption in body tissue is performed. Alternatively, in the special light observation, fluorescence observation for obtaining an image using fluorescence generated by emitting excitation light may be performed. In the fluorescence observation, body tissue may be irradiated with excitation light to observe fluorescence from the body tissue (auto-fluorescence observation), or a reagent such as indocyanine green (ICG) may be locally injected into the body tissue, and the body tissue may be irradiated with excitation light corresponding to a fluorescence wavelength of the reagent to obtain a fluorescence image. The light source device 5043 can be configured to be able to supply narrow band light and/or excitation light corresponding to such special light observation.

(Camera Head and CCU)

Figure 67:
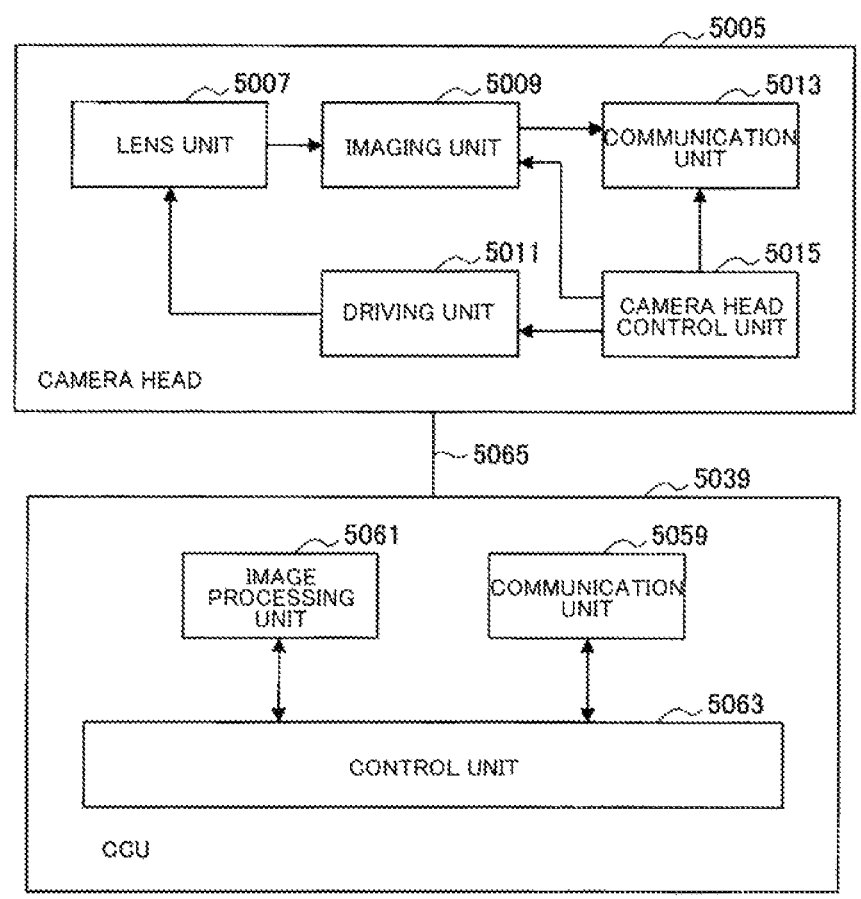
FIG. 67 is a diagram illustrating an example of installation positions of an outer-vehicle information detection unit and an imaging unit.

Functions of the camera head 5005 of the endoscope 5001 and the CCU 5039 will be described in more detail with reference to FIG. 67. FIG. 67 is a block diagram showing an example of functional configurations of the camera head 5005 and the CCU 5039 shown in FIG. 66.

Referring to FIG. 67, the camera head 5005 includes a lens unit 5007, an imaging unit 5009, a driving unit 5011, a communication unit 5013, and a camera head control unit 5015 as the functions thereof. In addition, the CCU 5039 includes a communication unit 5059, an image processing unit 5061, and a control unit 5063 as the functions thereof. The camera head 5005 and the CCU 5039 are connected to each other by a transmission cable 5065 so as to be able to bidirectionally communicate with each other.

First, a functional configuration of the camera head 5005 will be described. The lens unit 5007 is an optical system provided in a portion which is connected to the lens-barrel 5003. Observation light taken in from the tip end of the lens-barrel 5003 is guided to the camera head 5005 and is incident on the lens unit 5007. The lens unit 5007 is constituted by a combination of a plurality of lenses including a zoom lens and a focus lens. Optical characteristics of the lens unit 5007 are adjusted so as to condense observation light on a light receiving surface of an imaging element of the imaging unit 5009. In addition, the zoom lens and the focus lens are configured such that positions on the optical axes thereof are movable in order to adjust the magnification and focus of a captured image.

The imaging unit 5009 is constituted by an imaging element and is disposed at a stage after the lens unit 5007. Observation light having passed through the lens unit 5007 is condensed on the light receiving surface of the imaging element, and an image signal corresponding to an observation image is generated by photoelectric conversion. An image signal generated by the imaging unit 5009 is provided to the communication unit 5013.

As the imaging element constituting the imaging unit 5009, for example, an imaging element, which is a complementary metal oxide semiconductor (CMOS) type image sensor, having a Bayer array and capable of performing color imaging is used. Meanwhile, as the imaging element, for example, an imaging element capable of dealing with high-resolution imaging of 4K or more may be used. An image of a surgical part is obtained with high resolution, and thus the surgeon 5067 can ascertain the state of the surgical part in more detail and can proceed with a surgical operation smoothly.

In addition, the imaging element constituting the imaging unit 5009 is configured to include a pair of imaging elements for acquiring an image signal for a right eye and an image signal for a left eye corresponding to 3D display. By the execution of the 3D display, the surgeon 5067 can more accurately ascertain the depth of biological tissue in the surgical part. Meanwhile, in a case where the imaging unit 5009 is configured as a multi-plate type, a plurality of systems of the lens units 5007 are also provided corresponding to the imaging elements.

In addition, the imaging unit 5009 may not be necessarily provided in the camera head 5005. For example, the imaging unit 5009 may be provided right after the object lens inside the lens-barrel 5003.

The driving unit 5011, which is constituted by an actuator, moves the zoom lens and the focus lens of the lens unit 5007 along an optical axis by a predetermined distance under the control of the camera head control unit 5015. Thereby, the magnification and focus of a captured image obtained by the imaging unit 5009 can be appropriately adjusted.

The communication unit 5013 is constituted by a communication device for transmitting and receiving various information to and from the CCU 5039. The communication unit 5013 transmits an image signal obtained from the imaging unit 5009 to the CCU 5039 through the transmission cable 5065 as RAW data. At this time, it is preferable that the image signal be transmitted by optical communication in order to display a captured image of a surgical part with low latency. This is because the surgeon 5067 performs a surgical operation while observing the state of an affected part by the captured image during the surgical operation, and thus it is required that a moving image of a surgical part is displayed in real time as much as possible for a safer and more reliable surgical operation. In a case where optical communication is performed, the communication unit 5013 is provided with a photoelectric conversion module that converts an electrical signal into an optical signal. An image signal is converted into an optical signal by the photoelectric conversion module and is then transmitted to the CCU 5039 through the transmission cable 5065.

In addition, the communication unit 5013 receives a control signal for controlling the driving of the camera head 5005 from the CCU 5039. The control signal includes information on imaging conditions such as information indicating designation of a frame rate of a captured image, information indicating designation of an exposure value during imaging, and/or information indicating designation of magnification and focus of a captured image. The communication unit 5013 provides the received control signal to the camera head control unit 5015. Meanwhile, the control signal received from the CCU 5039 may also be transmitted by optical communication. In this case, the communication unit 5013 is provided with a photoelectric conversion module that converts an optical signal into an electrical signal, and the control signal is converted into an electrical signal by the photoelectric conversion module and is then provided to the camera head control unit 5015.

Meanwhile, the above-described imaging conditions such as a frame rate, an exposure value, magnification, and focus are automatically set by the control unit 5063 of the CCU 5039 on the basis of an acquired image signal. That is, the endoscope 5001 is equipped with a so-called auto exposure (AE) function, auto focus (AF) function, and auto white balance (AWB) function.

The camera head control unit 5015 controls the driving of the camera head 5005 on the basis of a control signal received from the CCU 5039 through the communication unit 5013. For example, the camera head control unit 5015 controls the driving of the imaging element of the imaging unit 5009 on the basis of information indicating designation of a frame rate of a captured image and/or information indicating designation of exposure during imaging. In addition, for example, the camera head control unit 5015 appropriately moves the zoom lens and the focus lens of the lens unit 5007 through the driving unit 5011 on the basis of information indicating designation of magnification and focus of a captured image. The camera head control unit 5015 may further have a function of storing information for identifying the lens-barrel 5003 and the camera head 5005.

Meanwhile, components such as the lens unit 5007 and the imaging unit 5009 are disposed within a sealed structure with high airtightness and waterproofness, and thus the camera head 5005 can be made resistant to autoclave sterilization.

Next, a functional configuration of the CCU 5039 will be described. The communication unit 5059 is constituted by a communication device for transmitting and receiving various information to and from the camera head 5005. The communication unit 5059 receives an image signal transmitted from the camera head 5005 through the transmission cable 5065. At this time, as described above, the image signal can be preferably transmitted by optical communication. In this case, the communication unit 5059 is provided with a photoelectric conversion module converting an optical signal into an electrical signal in response to optical communication. The communication unit 5059 provides an image signal converted into an electrical signal to the image processing unit 5061.

In addition, the communication unit 5059 transmits a control signal for controlling the driving of the camera head 5005 to the camera head 5005. The control signal may also be transmitted by optical communication.

The image processing unit 5061 performs various image processing on an image signal which is RAW data transmitted from the camera head 5005. Examples of the image processing include various known signal processing such as development processing, high image quality processing (band enhancement processing, super-resolution processing, noise reduction (NR) processing, and/or camera shake correction processing), and/or enlargement processing (electronic zoom processing). In addition, the image processing unit 5061 performs detection processing on an image signal for performing AE, AF, and AWB.

The image processing unit 5061 is constituted by a processor such as a CPU or a GPU, and the above-described image processing and detection processing can be performed by the processor operating in accordance with a predetermined program. Meanwhile, in a case where the image processing unit 5061 is constituted by a plurality of GPUs, the image processing unit 5061 appropriately divides information related to an image signal and performs image processing in parallel by the plurality of GPUs.

The control unit 5063 performs various control related to imaging of a surgical part and display of a captured image thereof which are performed by the endoscope 5001. For example, the control unit 5063 generates a control signal for controlling the driving of the camera head 5005. At this time, in a case where imaging conditions are input by a user, the control unit 5063 generates a control signal on the basis of the user's input. Alternatively, in a case where the endoscope 5001 is equipped with an AE function, an AF function, and an AWB function, the control unit 5063 appropriately calculates an optimum exposure value, focal distance, and white balance in accordance with results of the detection processing performed by the image processing unit 5061 to generate a control signal.

In addition, the control unit 5063 displays an image of a surgical part on the display device 5041 on the basis of an image signal having been subjected to image processing by the image processing unit 5061. At this time, the control unit 5063 recognizes various objects in a surgical part image using various image recognition techniques. For example, the control unit 5063 can recognize surgical instruments such as forceps, specific biological parts, bleeding, mist at the time of using the energy treatment tool 5021, and the like by detecting the shape, color, and the like of an edge of an object included in a surgical part image. The control unit 5063 displays various surgical operation supporting information so as to be superimposed on an image of a surgical part by using recognition results thereof at the time of displaying the image of the surgical part on the display device 5041. The surgical operation supporting information is displayed to be superimposed and is presented to the surgeon 5067, and thus it is possible to proceed with a surgical operation more safely and reliably.

The transmission cable 5065 connecting the camera head 5005 and the CCU 5039 to each other is an electric signal cable that supports electric signal communication, an optical fiber that supports optical communication, or a composite cable thereof.

Here, in the example shown in the drawing, communication is performed in a wired manner using the transmission cable 5065, but communication between the camera head 5005 and the CCU 5039 may be performed in a wireless manner. In a case where communication therebetween is performed in a wireless manner, the transmission cable 5065 does not need to be built in a surgical operation room, and thus a situation where the movement of a medical staff in the surgical operation room is hindered by the transmission cable 5065 can be solved.

An example of the endoscopic surgery system 5000 to which the technique according to the present disclosure is applicable has been described above. Meanwhile, here, the endoscopic surgery system 5000 has been described as an example, but a system to which the technique according to the present disclosure is applicable is not limited to such an example. For example, the technique according to the present disclosure may be applied to a flexible endoscopy system for examination and a microsurgery system.

The technique according to the present disclosure can be preferably applied to the imaging unit 5009 among the above-described components. The read-out speed of image data can be increased by applying the technique according to the present disclosure to the imaging unit 5009, and thus it is possible to perform a surgical operation more safely and more reliably.

22. Application Example 2

In addition, the technique according to the present disclosure (the present technique) can be applied to various products. For example, the technique according to the present disclosure may be realized as a device that is mounted on any one type of moving body such as automobiles, electric vehicles, hybrid electric vehicles, motorcycles, bicycles, personal mobility, airplanes, drones, ships, and robots.

Figure 68:
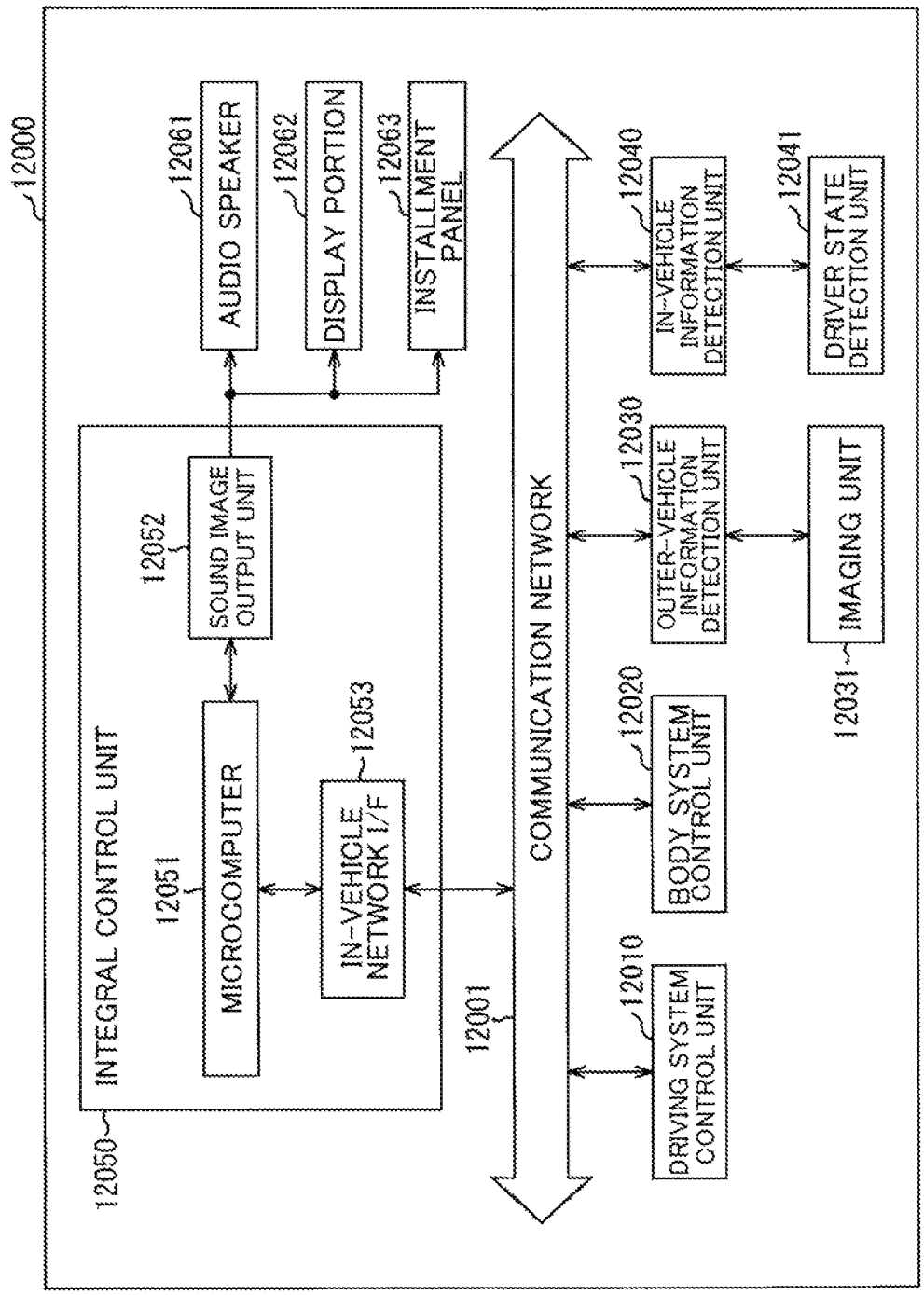
FIG. 68 is a block diagram showing an example of a schematic configuration of the vehicle control system.

FIG. 68 is a block diagram showing an example of a schematic configuration of a vehicle control system which is an example of a moving body control system to which the technique according to the present disclosure is applicable.

A vehicle control system 12000 includes a plurality of electronic control units connected to each other through a communication network 12001. In the example shown in FIG. 68, the vehicle control system 12000 includes a driving system control unit 12010, a body system control unit 12020, an outer-vehicle information detection unit 12030, an in-vehicle information detection unit 12040, and an integral control unit 12050. In addition, a microcomputer 12051, a sound image output unit 12052, and an in-vehicle network interface (I/F) 12053 are shown in the drawing as a functional configuration of the integral control unit 12050.

The driving system control unit 12010 controls the operation of a device related to a driving system of a vehicle in accordance with various programs. For example, the driving system control unit 12010 functions as a driving force generator for generating a driving force of a vehicle such as an internal combustion engine or a driving motor, a driving force transmission mechanism for transmitting a driving force to wheels, a steering angle for adjusting a rudder angle of a vehicle, and a control device such as a braking device that generates a braking force of a vehicle.

The body system control unit 12020 controls operations of various devices mounted on a vehicle body in accordance with various programs. For example, the body system control unit 12020 functions as various types of control devices such as a keyless entry system, a smart key system, a power window device, or various lamps such as a headlamp, a back lamp, a brake lamp, a turn signal, or a fog lamp. In this case, radio waves transmitted from a portable device that substitutes for a key or signals of various switches can be input to the body system control unit 12020. The body system control unit 12020 receives inputs of these radio waves or signals and controls a vehicle door lock device, a power window device, a lamp, and the like.

The outer-vehicle information detection unit 12030 detects information on the outside of the vehicle on which the vehicle control system 12000 is mounted. For example, an imaging unit 12031 is connected to the outer-vehicle information detection unit 12030. The outer-vehicle information detection unit 12030 causes the imaging unit 12031 to capture an image of the outside of a vehicle and receives the captured image. The outer-vehicle information detection unit 12030 may perform object detection processing or distance detection processing for persons, vehicles, obstacles, signs, or characters on a road surface on the basis of the received image.

The imaging unit 12031 is an optical sensor receives light and outputs an electrical signal corresponding to the amount of light received. The imaging unit 12031 can also output the electrical signal as an image and output information of distance measurement. In addition, light received by the imaging unit 12031 may be visible light or may be invisible light such as infrared rays.

The in-vehicle information detection unit 12040 detects information on the inside of a vehicle. For example, a driver state detection unit 12041 that detects the state of a driver is connected to the in-vehicle information detection unit 12040. The driver state detection unit 12041 includes, for example, a camera that images a driver, and the in-vehicle information detection unit 12040 may calculate the degree of fatigue or the degree of concentration of a driver and may determine whether a driver is dozing or not, on the basis of detection information which is input from the driver state detection unit 12041.

The microcomputer 12051 can calculate a control target value of the driving force generator, the steering mechanism, or the braking device on the basis of information on the inside and outside of the vehicle acquired by the outer-vehicle information detection unit 12030 or the in-vehicle information detection unit 12040, and can output a control command to the driving system control unit 12010. For example, the microcomputer 12051 can perform cooperative control aimed at realizing a function of an advanced driver assistance system (ADAS) including collision avoidance or impact mitigation of a vehicle, follow-up driving based on an inter-vehicle distance, vehicle speed maintenance driving, a vehicle collision warning, a vehicle lane deviation warning, and the like.

In addition, the microcomputer 12051 can perform cooperative control aimed at automatic driving for performing driving autonomously without depending on a driver's operation by controlling the driving force generator, the steering mechanism, the braking device, or the like on the basis of information on the surroundings of a vehicle acquired by the outer-vehicle information detection unit 12030 or the in-vehicle information detection unit 12040.

In addition, the microcomputer 12051 can output a control command to the body system control unit 12020 on the basis of outer-vehicle information acquired by the outer-vehicle information detection unit 12030. For example, the microcomputer 12051 can perform cooperative control aimed at achieving anti-glare such as control of a headlamp according to the position of a preceding vehicle or an oncoming vehicle detected by the outer-vehicle information detection unit 12030 and switching of a high beam to a low beam.

The sound image output unit 12052 transmits an output signal of at least one of sound and an image to an output device capable of visually or audibly notifying a passenger of a vehicle or the outside of the vehicle of information. In the example of FIG. 68, an audio speaker 12061, a display portion 12062, and an installment panel 12063 are shown as output devices. The display portion 12062 may include, for example, at least one of an on-board display and a head-up display.

Figure 69:
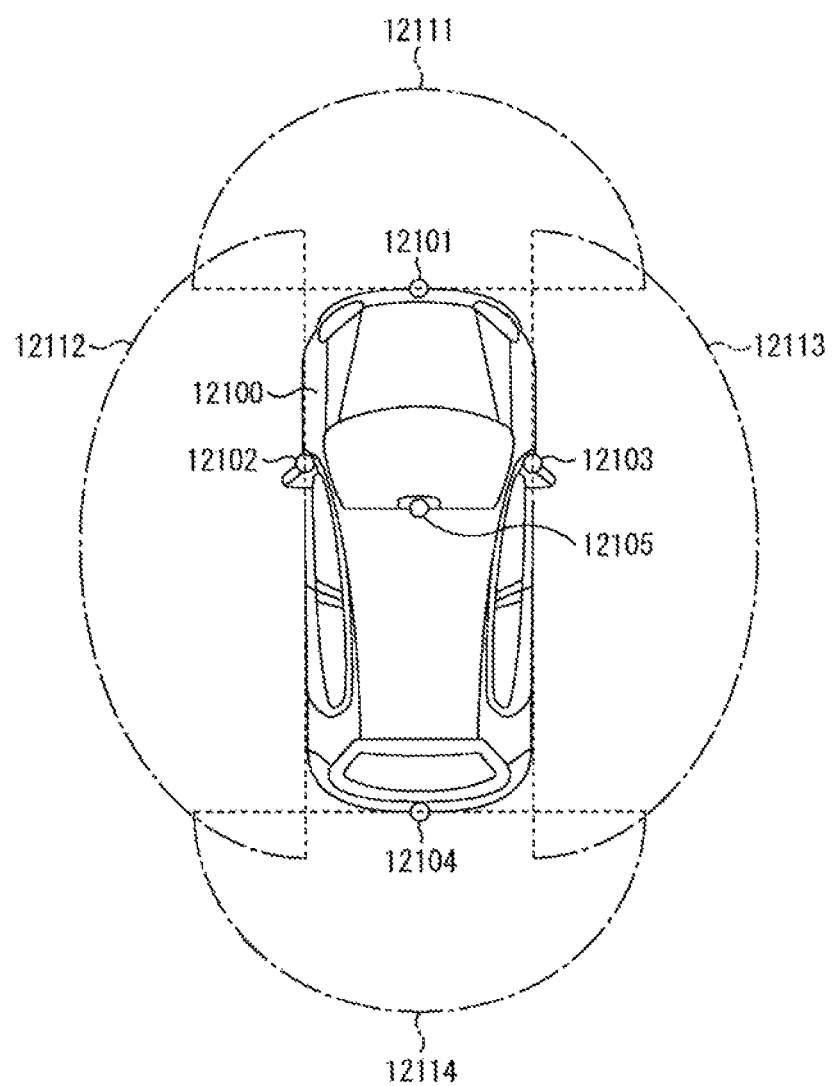
FIG. 69 is a diagram illustrating an example of installation positions of the outer-vehicle information detection unit and the imaging unit.

FIG. 69 is a diagram showing an example of an installation position of the imaging unit 12031.

In FIG. 69, imaging units 12101, 12102, 12103, 12104, and 12105 are provided as the imaging unit 12031.

The imaging units 12101, 12102, 12103, 12104, and 12105 are provided at positions such as a front nose, side-view mirrors, a rear bumper, and back doors of the vehicle interior 12100, and an upper portion of a windshield inside the vehicle. The imaging unit 12101 provided at the front nose and the imaging unit 12105 provided at an upper portion of the windshield inside the vehicle mainly acquire an image of a portion in front of the vehicle 12100. The imaging units 12102 and 12103 provided at the side-view mirrors mainly acquire an image of a portion on the side of the vehicle 12100. The imaging unit 12104 provided at the rear bumper or the back door mainly acquires an image of a portion behind the vehicle 12100. The imaging unit 12105 provided at the upper portion of the windshield inside the vehicle is used to mainly detect preceding vehicles, pedestrians, obstacles, traffic lights, traffic signs, or lanes.

Meanwhile, FIG. 69 shows an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and the imaging range 12114 indicates the imaging range of the imaging unit 12104 provided at the rear bumper or the back door. For example, a bird's-eye view image of the vehicle 12100 as viewed from above can be obtained by superimposition of image data captured by the imaging units 12101 to 12104.

At least one of the imaging units 12101 to 12104 may have a function of acquiring distance information. For example, at least one of the imaging units 12101 to 12104 may be a stereo camera constituted by a plurality of imaging elements or may be an imaging element having pixels for phase difference detection.

For example, the microcomputer 12051 can obtain a distance to each three-dimensional object within the imaging ranges 12111 to 12114 and the changes of the distance with time (a relative speed with respect to the vehicle 12100) on the basis of distance information obtained from the imaging units 12101 to 12104, and thus particularly a three-dimensional object which is the closest three-dimensional object on a traveling path of the vehicle 12100 and travels in substantially the same direction as the vehicle 12100 at a predetermined speed (for example, 0 km/h or more) can be extracted as a preceding vehicle. Further, the microcomputer 12051 can set an inter-vehicle distance to be secured in front of a preceding vehicle in advance, and can perform automatic braking control (also including follow-up stop control), automatic acceleration control (also including follow-up start control), and the like. In this manner, it is possible to perform cooperative control aimed at automatic driving or the like in which a vehicle travels autonomously without depending on a driver's operation.

For example, the microcomputer 12051 can classify three-dimensional object data related to a three-dimensional object into a two-wheeled vehicle, an ordinary vehicle, a large vehicle, a pedestrian, an electric pole, and other three-dimensional objects on the basis of distance information obtained from the imaging units 12101 to 12104, and can use the extracted three-dimensional object data for automatic avoidance of obstacles. For example, the microcomputer 12051 distinguishes obstacles in the vicinity of the vehicle 12100 into obstacles that can be visually recognized by the driver of the vehicle 12100 and obstacles that are difficult to visually recognize. Then, the microcomputer 12051 can determine the risk of collision indicating the degree of risk of collision with each obstacle, and can perform driving support for collision avoidance by outputting a warning to a driver through the audio speaker 12061 or the display portion 12062 and performing forced deceleration or avoidance steering through the driving system control unit 12010 when the risk of collision has a value equal to or greater than a set value and there is a possibility of collision.

At least one of the imaging units 12101 to 12104 may be an infrared camera that detects infrared rays. For example, the microcomputer 12051 can recognize a pedestrian by determining whether or not a pedestrian is present in captured images of the imaging units 12101 to 12104. Such recognition of a pedestrian is performed by, for example, a procedure of extracting a feature point in captured images of the imaging units 12101 to 12104 serving as infrared cameras, and a procedure of performing pattern matching processing on a series of feature points indicating the contour of an object to determine whether or not the object is a pedestrian. When the microcomputer 12051 determines that a pedestrian is present in the captured images of the imaging units 12101 to 12104 and recognizes the pedestrian, the sound image output unit 12052 controls the display portion 12062 so that a square contour line for emphasis is superimposed on the recognized pedestrian and is displayed. In addition, the sound image output unit 12052 may control the display portion 12062 so that an icon or the like indicating a pedestrian is displayed at a desired position.

An example of a vehicle control system to which the technique according to the present disclosure is applicable has been described above. The technique according to the present disclosure can be applied to the imaging unit 12031, the outer-vehicle information detection unit 12030, the in-vehicle information detection unit 12040, the driver state detection unit 12041, and the like among the above-described components. The read-out speed of image data can be increased by applying the technique according to the present disclosure to these components, and thus it is possible to obtain an effect such as more preferably supporting a driver's operation.

Although the embodiments of the present disclosure have been described above, the technical scope of the present disclosure is not limited to the above-described embodiments as they are, and various changes can be made without departing from the gist of the present disclosure. In addition, components in different embodiments and modification examples may be appropriately combined.

In addition, the effects in the embodiments described in the present specification are merely examples and are not limited, and there may be other effects.

Meanwhile, the present technique can adopt the following configurations.

(1)

A solid-state imaging device including:

a plurality of photoelectric conversion elements that are arrayed in a matrix, wherein each of the photoelectric conversion elements includes a first electrode and a second electrode that are disposed such that principal planes thereof face each other, a photoelectric conversion film that is disposed between the first electrode and the second electrode, a semiconductor layer that is disposed between the photoelectric conversion film and the second electrode and is configured such that a first surface is in contact with the photoelectric conversion film and at least a portion of a second surface on a side opposite to the first surface is in contact with the second electrode, an insulating film that is disposed within the semiconductor layer, and a third electrode that is disposed within the insulating film.

(2)

The solid-state imaging device according to (1), wherein the third electrode is provided with a plurality of opening portions, and a portion of the semiconductor layer extends inside each of the opening portions.

(3)

The solid-state imaging device according to (1) or (2), wherein a film thickness of the insulating film between the third electrode and the second electrode is smaller than a film thickness of the insulating film between the third electrode and the first electrode.

(4)

The solid-state imaging device according to any one of (1) to (3), wherein a film thickness in a direction parallel to the principal plane of the insulating film positioned on a side wall side of the third electrode is smaller than the film thickness of the insulating film between the third electrode and the first electrode.

(5)

The solid-state imaging device according to any one of (1) to (4), wherein the film thickness in the direction parallel to the principal plane of the insulating film positioned on the side wall side of the third electrode decreases from an upper portion side to a lower portion side of the third electrode.

(6)

The solid-state imaging device according to any one of (1) to (5), wherein each of the photoelectric conversion elements further includes a fourth electrode which is disposed within the insulating film and between the third electrode and the first electrode.

(7)

The solid-state imaging device according to (6), wherein the film thickness in the direction parallel to the principal plane of the insulating film positioned on the side wall side of the third electrode is smaller than a film thickness of the insulating film positioned on a side wall side of the fourth electrode.

(8)

The solid-state imaging device according to any one of (1) to (7), wherein the second electrode is divided into a plurality of electrodes facing the first electrode in different regions.

(9)

The solid-state imaging device according to any one of (1) to (8), wherein a width in a direction parallel to the principal plane of the second electrode is smaller than a width in a direction parallel to the principal plane of the third electrode.

(10)

The solid-state imaging device according to any one of (1) to (9), wherein a width in a direction parallel to the principal plane of the semiconductor layer decreases from the first electrode side to the second electrode side.

(11)

The solid-state imaging device according to any one of (1) to (10), wherein the third electrode includes a plurality of fifth electrodes arrayed in a direction perpendicular to the principal plane.

(12)

The solid-state imaging device according to any one of (1) to (11), wherein the third electrode is divided into a plurality of regions in a direction perpendicular to the principal plane.

(13)

The solid-state imaging device according to any one of (1) to (12), wherein a portion of a surface facing the second electrode in the photoelectric conversion film protrudes toward the second electrode.

(14)

The solid-state imaging device according to (13), wherein a portion of a surface facing the second electrode in the first electrode protrudes toward the second electrode.

(15)

The solid-state imaging device according to any one of (1) to (14), wherein a composition in direction perpendicular to the principal plane of the semiconductor layer varies depending on a distance from the second electrode.

(16)

The solid-state imaging device according to any one of (1) to (15), further including:
an on-chip lens disposed on a side opposite to the second electrode with the first electrode interposed therebetween; and
a color filter disposed in a direction perpendicular to the principal plane with respect to the on-chip lens and transmitting light of a predetermined wavelength.

(17)
The solid-state imaging device according to any one of (1) to (16),
wherein the photoelectric conversion film and at least a portion of the semiconductor layer contain the same material.

(18)
The solid-state imaging device according to any one of (1) to (17), further including:
a plurality of the photoelectric conversion elements disposed in a direction perpendicular to the principal plane.

(19)
The solid-state imaging device according to any one of (1) to (18),
wherein the photoelectric conversion film is an organic film.

(20)
An electronic equipment including:
a solid-state imaging device;
an optical system that forms an image of incident light on a light receiving surface of the solid-state imaging device; and
a processor that controls the solid-state imaging device,
wherein the solid-state imaging device includes a plurality of photoelectric conversion elements arrayed in a matrix,
each of the photoelectric conversion elements includes
a first electrode and a second electrode that are disposed such that principal planes thereof face each other,
a photoelectric conversion film that is disposed between the first electrode and the second electrode,
a semiconductor layer that is disposed between the photoelectric conversion film and the second electrode and is configured such that a first surface is in contact with the photoelectric conversion film and at least a portion of a second surface on a side opposite to the first surface is in contact with the second electrode,
an insulating film that is disposed within the semiconductor layer, and
a third electrode that is disposed within the insulating film.

(21)
A method of manufacturing a solid-state imaging device, the method including:
forming a first insulating film on a first surface of a semiconductor substrate;
forming a read-out electrode in a first region on the first insulating film;
forming a second insulating film on the first electrode;
forming a first transparent electrode material film on the second insulating film;
forming a third insulating film on the first transparent electrode material film;
forming a second transparent electrode material film on the third insulating film;
forming a fourth insulating film on the second transparent electrode material film;
forming an opening that exposes a portion of the read-out electrode in the second to fourth insulating films and the first and second transparent electrode material films;
forming a semiconductor layer on the fourth insulating film and in the opening;
forming a photoelectric conversion film on the semiconductor layer; and
forming a common electrode on the photoelectric conversion film.

(22)
A solid-state imaging device including:
a plurality of photoelectric conversion elements arrayed in a matrix,
wherein each of the photoelectric conversion elements includes
a first electrode and a second electrode that are disposed such that principal planes thereof face each other,
a photoelectric conversion film that is disposed between the first electrode and the second electrode,
a semiconductor layer that is disposed between the photoelectric conversion film and the second electrode and is configured such that a first surface is in contact with the photoelectric conversion film and a second surface on a side opposite to the first surface is in contact with the second electrode,
a first insulating film that is disposed in the semiconductor layer, and
a third electrode that is disposed in the first insulating film.

(23)
The solid-state imaging device according to (22),
wherein the third electrode is provided with a plurality of opening portions, and
a portion of the semiconductor layer extends inside each of the opening portions.

(24)
The solid-state imaging device according to (22) or (23),
wherein a film thickness of the first insulating film between the third electrode and the second electrode is smaller than a film thickness of the first insulating film between the third electrode and the first electrode.

(25)
The solid-state imaging device according to any one of (22) to (24),
wherein a film thickness in a direction parallel to the principal plane of the first insulating film positioned on a side wall side of the third electrode is smaller than a film thickness of the first insulating film between the third electrode and the first electrode.

(26)
The solid-state imaging device according to any one of (22) to (25),
wherein the film thickness in the direction parallel to the principal plane of the first insulating film positioned on the side wall side of the third electrode decreases from an upper portion side to a lower portion side of the third electrode.

(27)
The solid-state imaging device according to any one of (22) to (26),
wherein the second electrode is divided into a plurality of electrodes facing the first electrode in different regions.

(28)
The solid-state imaging device according to any one of (22) to (27), wherein a width in a direction parallel to the principal plane of the second electrode is smaller than a width in a direction parallel to the principal plane of the third electrode.

(29)

The solid-state imaging device according to any one of (22) to (28),
wherein a width in a direction parallel to the principal plane of the semiconductor layer decreases from the first electrode side to the second electrode side.

(30)

The solid-state imaging device according to any one of (22) to (29), further including:
a second insulating film that is disposed between the third electrode and the second electrode in a region in contact with the second electrode; and
a fourth electrode that is disposed within the second insulating film.

(31)

The solid-state imaging device according to (29),
wherein at least a portion of a surface on the second electrode side of the semiconductor layer is an inclined region which is inclined to the principal plane, and
the solid-state imaging device further includes a fifth electrode that is disposed in proximity to the inclined region outside the semiconductor layer.

(32)

The solid-state imaging device according to any one of (22) to (31),
wherein the third electrode includes a plurality of fifth electrodes arrayed in a direction perpendicular to the principal plane.

(33)

The solid-state imaging device according to any one of (22) to (32),
wherein the third electrode is divided into a plurality of regions in a direction perpendicular to the principal plane.

(34)

The solid-state imaging device according to any one of (22) to (33),
wherein a portion of a surface facing the second electrode in the photoelectric conversion film protrudes toward the second electrode.

(35)

The solid-state imaging device according to (34),
wherein a portion of a surface facing the second electrode in the first electrode protrudes toward the second electrode.

(36)

The solid-state imaging device according to any one of (22) to (35),
wherein a composition in direction perpendicular to the principal plane of the semiconductor layer varies depending on a distance from the second electrode.

(37)

The solid-state imaging device according to any one of (22) to (36), further including:
an on-chip lens disposed on a side opposite to the second electrode with the first electrode interposed therebetween; and
a color filter disposed in a direction perpendicular to the principal plane with respect to the on-chip lens and transmitting light of a predetermined wavelength.

(38)

The solid-state imaging device according to any one of (22) to (37),
wherein at least portions of the photoelectric conversion film and the semiconductor layer contain the same material.

(39)

The solid-state imaging device according to any one of (22) to (38), further including:
a plurality of the photoelectric conversion elements disposed in a direction perpendicular to the principal plane.

(40)

The solid-state imaging device according to any one of (22) to (39),
wherein the photoelectric conversion film is an organic film.

(41)

An electronic equipment including:
a solid-state imaging device;
an optical system that forms an image of incident light on a light receiving surface of the solid-state imaging device; and
a processor that controls the solid-state imaging device,
wherein the solid-state imaging device includes a plurality of photoelectric conversion elements arrayed in a matrix,
each of the photoelectric conversion elements includes
a first electrode and a second electrode that are disposed such that principal planes thereof face each other,
a photoelectric conversion film that is disposed between the first electrode and the second electrode,
a semiconductor layer that is disposed between the photoelectric conversion film and the second electrode and is configured such that a first surface is in contact with the photoelectric conversion film and a second surface on a side opposite to the first surface is in contact with the second electrode,
a first insulating film that is disposed in the semiconductor layer, and
a third electrode that is disposed in the first insulating film.

(42)

A method of manufacturing a solid-state imaging device, the method including:
forming a first insulating film on a first surface of a semiconductor substrate;
forming a read-out electrode in a first region on the first insulating film;
forming a first semiconductor layer on the read-out electrode;
forming a second insulating film on the first semiconductor layer;
forming a transparent electrode material film on the second insulating film;
forming a third insulating film on the transparent electrode material film;
forming an opening that exposes a portion of the read-out electrode in the second and third insulating films and the transparent electrode material film;
forming a fourth insulating film that covers an upper portion of the third insulating film and the inside of the opening;
forming a second semiconductor layer on the fourth insulating film on the third insulating film and on the fourth insulating film in the opening;
forming a photoelectric conversion film on the second semiconductor layer; and forming a common electrode on the photoelectric conversion film.

REFERENCE SIGNS LIST

100 Solid-state imaging device (image sensor)
101 Semiconductor substrate
102, 104 P-type semiconductor region
103, 105 N-type semiconductor region
106 Insulating film
111 Insulating layer
112, 1612 Common electrode
113, 1613 Photoelectric conversion film
114, 114A, 514, 524, 914, 1514, 1514a, 1514b, 1514c Semiconductor layer
114A Convex portion
115, 215, 615, 715A, 715B, 815A, 815B, 2015 Storage electrode
115A, 315A Transparent electrode material film
116, 116A, 116B, 116C, 216, 316, 316A, 316B, 316C, 516 Insulating film
117, 417, 517, 617A, 617B, 817A, 817B, 2014 Read-out electrode
118, 122 Wiring
119 Through electrode
120 Stored charge
121 Wiring layer
131 Protection film
132 Flattening film
133 On-chip lens
315 Shield electrode
515 Collecting electrode
525 Modulation electrode
615A, 615B Region
1116, 2016 Memory electrode
1833 Color filter
3000 Electronic equipment
3020 Imaging lens
3030 Storage unit
3040 Processor
3101 Pixel array portion
3102 Vertical driving circuit
3102A Voltage application circuit
3103, 3103A, 3103B Column processing circuit
3104 Horizontal driving circuit
3105 System control unit
3108 Signal processing unit
3109 Data storage unit
3110 Unit pixel
3110B, 3110G, 3110R Pixel
3121 Light receiving chip
3122 Circuit chip
A1, A2, A3, A4 Opening
AMP1, AMP2, AMP3 Amplification transistor
FD1, FD2, FD3 Floating diffusion region
LD Pixel driving line
PD1, PD2 Photo diode
PD3, PD203 Organic photoelectric conversion element
RST1, RST2, RST3 Reset transistor
S1, S2 System
SEL1, SEL2, SEL3 Selection transistor
TRG1, TRG2 Transfer transistor
VSL Vertical signal line

The invention claimed is:

1. A solid-state imaging device, comprising:
a semiconductor substrate having a front face and a back face; and
a plurality of photoelectric conversion elements that are arrayed in a matrix,
wherein each of the plurality of photoelectric conversion elements includes:
a first electrode and a second electrode,
a photoelectric conversion film that is disposed between the first electrode and the second electrode,
a semiconductor layer that is disposed between the photoelectric conversion film and the second electrode,
at least one insulating film that is disposed within and surrounded on four sides by the semiconductor layer, and
at least one third electrode that is disposed within the at least one insulating film.

2. The solid-state imaging device according to claim 1, wherein the at least one third electrode is provided with a plurality of opening portions, and
a portion of the semiconductor layer extends inside each of the plurality of opening portions.

3. The solid-state imaging device according to claim 1, wherein a first film thickness of the at least one insulating film between the at least one third electrode and the second electrode is smaller than a second film thickness of the at least one insulating film between the at least one third electrode and the first electrode.

4. The solid-state imaging device according to claim 1, wherein a first film thickness of the at least one insulating film positioned on a side wall side of the at least one third electrode in a direction parallel to the front face or the back face is smaller than a second film thickness of the at least one insulating film between the at least one third electrode and the first electrode.

5. The solid-state imaging device according to claim 1, wherein a first film thickness of the at least one insulating film positioned on a side wall side of the at least one third electrode in a direction parallel to the front face or the back face decreases from an upper portion side to a lower portion side of the at least one third electrode.

6. The solid-state imaging device according to claim 1, wherein each of the photoelectric conversion elements further includes another third electrode which is disposed within another insulating film and between the at least one third electrode and the first electrode.

7. The solid-state imaging device according to 1, wherein a width of an upper portion of the semiconductor layer in a direction perpendicular to a sidewall of the second electrode is smaller than a width of a lower portion of the semiconductor layer in a direction parallel to the front face or the back face.

8. The solid-state imaging device according to 1, wherein a width of the semiconductor layer in a direction parallel to the front face or the back face decreases from the insulating film to the second electrode.

9. The solid-state imaging device according to claim 1, wherein the at least one third electrode is divided into a plurality of regions in a direction perpendicular to the front face or the back face.

10. The solid-state imaging device according to claim 1, further comprising:
an on-chip lens disposed on a side opposite to the second electrode with the first electrode interposed therebetween; and
a color filter disposed in a direction perpendicular to the front face or the back face, with respect to the on-chip lens and transmitting a light of a predetermined wavelength.

11. The solid-state imaging device according to claim 1, wherein the photoelectric conversion film and at least a portion of the semiconductor layer contain a same material.

12. The solid-state imaging device according to claim 1, wherein the plurality of the photoelectric conversion elements disposed in a direction perpendicular to the front face or the back face.

13. The solid-state imaging device according to claim 1, wherein the photoelectric conversion film is an organic film.

14. The solid-state imaging device according to 1, wherein a width of the second electrode in a direction parallel to the front face or the back face is smaller than a width of the at least one third electrode in the direction parallel to the front face or the back face.

15. An electronic equipment, comprising:
a solid-state imaging device;
an optical system that forms an image of incident light on a light receiving surface of the solid-state imaging device; and
a processor that controls the solid-state imaging device,
wherein
the solid-state imaging device includes:
  a semiconductor substrate having a front face and a back face, and
  a plurality of photoelectric conversion elements arrayed in a matrix, and
each of the plurality of photoelectric conversion elements includes:
  a first electrode and a second electrode,
  a photoelectric conversion film that is disposed between the first electrode and the second electrode,
  a semiconductor layer that is disposed between the photoelectric conversion film and the second electrode,
  at least one insulating film that is disposed within and surrounded on four sides by the semiconductor layer, and
  at least one third electrode that is disposed within the at least one insulating film.

\* \* \* \* \*